(12) United States Patent
Maeda

(10) Patent No.: US 9,934,740 B2
(45) Date of Patent: Apr. 3, 2018

(54) DISPLAY SYSTEM AND ELECTRONIC DEVICE

(71) Applicant: Semiconductor Energy Laboratory Co., Ltd., Kanagawa-ken (JP)

(72) Inventor: Shuhei Maeda, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 15/146,085

(22) Filed: May 4, 2016

(65) Prior Publication Data

US 2016/0329024 A1   Nov. 10, 2016

(30) Foreign Application Priority Data

May 7, 2015   (JP) ................................. 2015-094607
Jun. 29, 2015   (JP) ................................. 2015-129542
(Continued)

(51) Int. Cl.
*G09G 3/36* (2006.01)
*G09G 3/3225* (2016.01)

(52) U.S. Cl.
CPC ......... *G09G 3/3648* (2013.01); *G09G 3/3225* (2013.01); *G09G 2320/103* (2013.01);
(Continued)

(58) Field of Classification Search
CPC ....... G09G 2320/103; G09G 2330/021; G09G 2340/16
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1 737 044 A1   12/2006
EP   2 226 847 A2   9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Lixi C Simpson
(74) *Attorney, Agent, or Firm* — Husch Blackwell LLP

(57) ABSTRACT

Provided is a display system whose power consumption can be reduced. The display system includes an imaging device and a display device. The imaging device includes first pixels, a first circuit, and a second circuit. The first pixels are arranged in a matrix. The first circuit is configured to detect a difference between imaging data of a reference frame and imaging data of a difference detection frame. The second circuit is configured to detect a row of the first pixels where the difference is detected. The display device includes second pixels and a third circuit. The third circuit selects a row of the second pixels that corresponds to the row of the first pixels detected by the second circuit. Image data retained in the second pixels is rewritten only in the selected row.

15 Claims, 78 Drawing Sheets

(30) Foreign Application Priority Data

| | | | |
|---|---|---|---|
| Jul. 9, 2015 | (JP) | ................................ | 2015-137437 |
| Sep. 16, 2015 | (JP) | ................................ | 2015-182729 |
| Oct. 2, 2015 | (JP) | ................................ | 2015-196417 |
| Dec. 9, 2015 | (JP) | ................................ | 2015-239872 |

(52) U.S. Cl.
CPC ... *G09G 2330/021* (2013.01); *G09G 2340/16* (2013.01); *H01L 2224/48091* (2013.01); *H01L 2224/73265* (2013.01)

(56) References Cited

U.S. PATENT DOCUMENTS

| | | | |
|---|---|---|---|
| 6,294,274 B1 | 9/2001 | Kawazoe et al. | |
| 6,452,579 B1* | 9/2002 | Itoh | G09G 3/3648 345/100 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,836,626 B2 | 9/2014 | Ikeda | |
| 8,854,286 B2 | 10/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0160289 A1* | 7/2007 | Lipton | G06K 9/00771 382/173 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0188506 A1* | 8/2007 | Hollevoet | G06T 1/60 345/530 |
| 2007/0194379 A1 | 8/2007 | Hosono et al. | |
| 2007/0247529 A1* | 10/2007 | Toma | G06T 3/4053 348/222.1 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0090204 A1 | 4/2011 | Yamazaki et al. | |
| 2011/0102696 A1 | 5/2011 | Yamazaki et al. | |
| 2011/0115839 A1 | 5/2011 | Takahashi et al. | |
| 2013/0222584 A1 | 8/2013 | Aoki et al. | |
| 2014/0361296 A1 | 12/2014 | Ikeda | |
| 2014/0368417 A1 | 12/2014 | Yamazaki et al. | |
| 2015/0332568 A1 | 11/2015 | Kurokawa | |
| 2016/0021314 A1 | 1/2016 | Kurokawa et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID

(56) References Cited

OTHER PUBLICATIONS

International Symposium Digest of Technical Papers, May 31, 2009, pp. 395-398.
Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Clark, S.J. et al., "First Principles Methods Using CASTEP," Zeitschrift fur Kristallographie, 2005, vol. 220, pp. 567-570.
Coates, D. et al., "Optical Studies of the Amorphous Liquid-Cholesteric Liquid Crystal Transition: The 'Blue Phase'," Physics Letters, Sep. 10, 1973, vol. 45A, No. 2, pp. 115-116.
Costello, M.J. et al., "Electron Microscopy of a Cholesteric Liquid Crystal and Its Blue Phase," Physical Review. A, May 1, 1984, vol. 29, No. 5, pp. 2957-2959.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.
Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.
Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.
Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.
Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Janotti, A. et al., "Native Point Defects in ZnO," Physical Review. B, Oct. 4, 2007, vol. 76, No. 16, pp. 165202-1-165202-22.
Janotti, A. et al., "Oxygen Vacancies in ZnO," Applied Physics Letters, 2005, vol. 87, pp. 122102-1-122102-3.
Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Kanno, H., et al., "White Stacked Electrophosphorecent Organic Light-Emitting Devices Employing MOO3 as a Charge-Generation Layer," Advanced Materials, 2006, vol. 18, No. 3, pp. 339-342.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H. et al., "Polymer-Stabilized Liquid Crystal Blue Phases," Nature Materials, Sep. 2, 2002, vol. 1, pp. 64-68.
Kim, S. et al., "High-Performance Oxide Thin Film Transistors Passivated by Various Gas Plasmas," 214th ECS Meeting, 2008, No. 2317, ECS.
Kimizuka, N. et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C." Journal of Solid State Chemistry, 1985, vol. 60, pp. 382-384.
Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H-S. et al., "Observation of Blue Phases in Chiral Networks," Liquid Crystals, 1993, vol. 14, No. 3, pp. 911-916.
Kurokawa, Y. et al., "UHF RFCPUS on Flexible and Glass Substrates for Secure RFID Systems," Journal of Solid-State Circuits, 2008, vol. 43, No. 1, pp. 292-299.
Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.
Lee, H.N. et al., "Current Status of, Challenges to, and Perspective View of AM-OLED," IDW '06: Proceedings of the 13th International Display Workshops, Dec. 7, 2006, pp. 663-666.
Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.
Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Li, C. et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.
Masuda, S. et al., "Transparent Thin Film Transistors Using ZnO as an Active Channel Layer and their Electrical Properties," Journal of Applied Physics, Feb. 1, 2003, vol. 93, No. 3, pp. 1624-1630.
Meiboom, S. et al., "Theory of the Blue Phase of Cholesteric Liquid Crystals," Physical Review Letters, May 4, 1981, vol. 46, No. 18, pp. 1216-1219.
Miyasaka, M., "SUFTLA Flexible Microelectronics on Their Way to Business," SID Digest '07: SID International Symposium Digest of Technical Papers, 2007, vol. 38, pp. 1673-1676.
Mo, Y-G. et al., "Amorphous Oxide TFT Backplanes for Large Size AMOLED Displays," IDW '08; Proceedings of the 6th International Display Workshops, Dec. 3, 2008, pp. 581-584.
Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.
Nakamura, M., "Synthesis of Homologous Compound with New Long-Period Structure," NIRIM Newsletter, Mar. 1, 1995, vol. 150, pp. 1-4.
Nomura, K. et al., "Amorphous Oxide Semiconductors for High-Performance Flexible Thin-Film Transistors," Japanese Journal of Applied Physics, 2006, vol. 45, No. 5B, pp. 4303-4308.

(56) References Cited

OTHER PUBLICATIONS

Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs with a Novel Passivation Layer," SID Digest '09. SID International Symposium Digest of Technical Papers, May 31, 2009, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s Conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

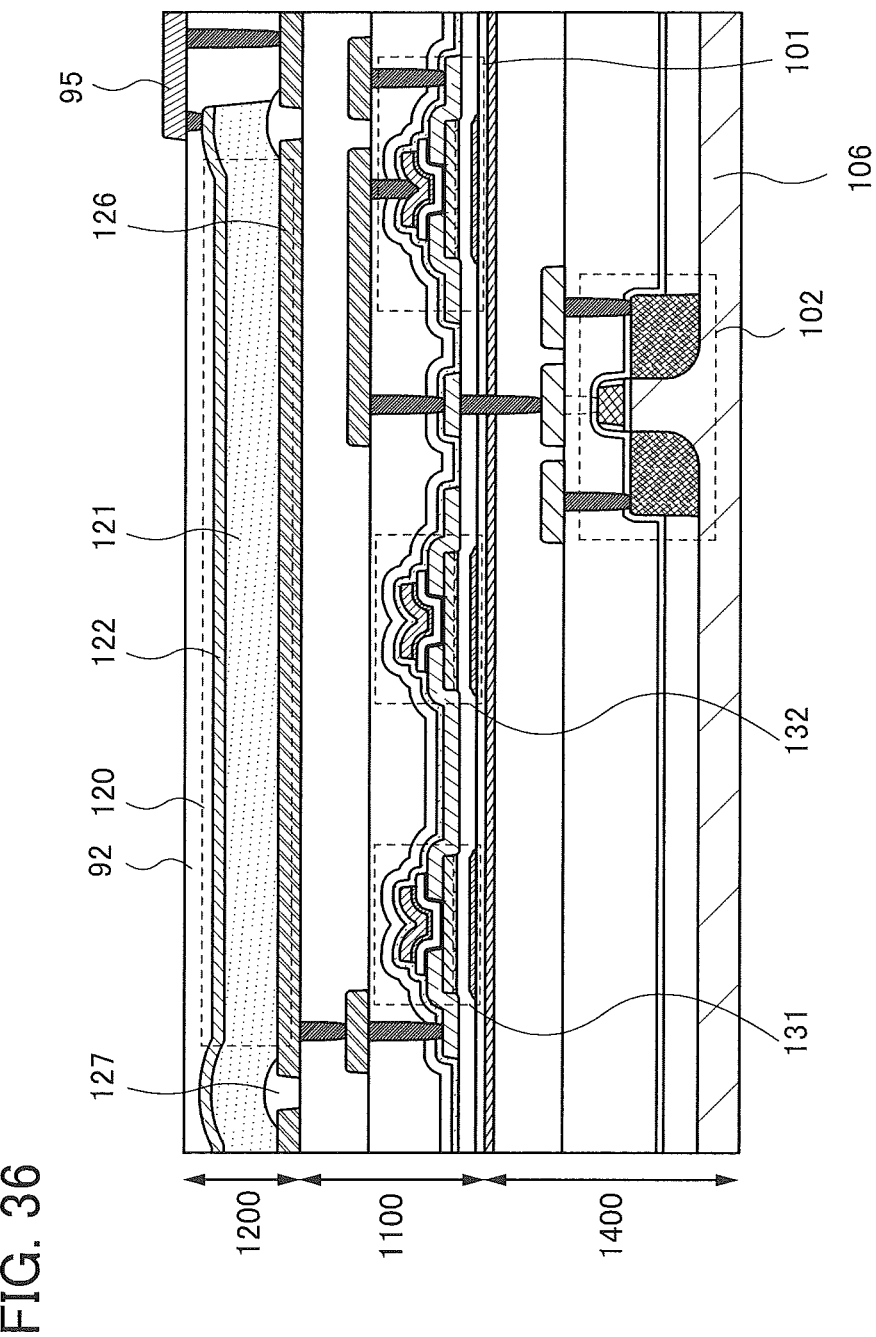

FIG. 45A1
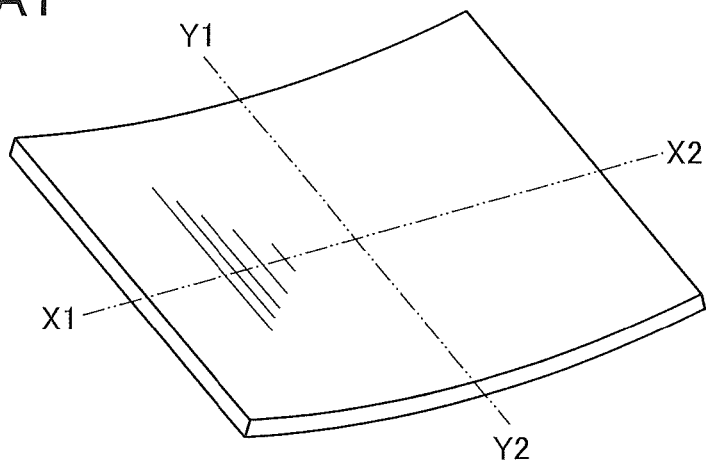
FIG. 45A2
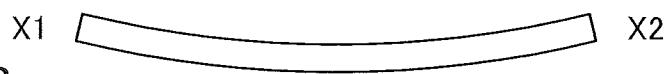
FIG. 45A3
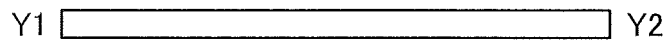
FIG. 45B1
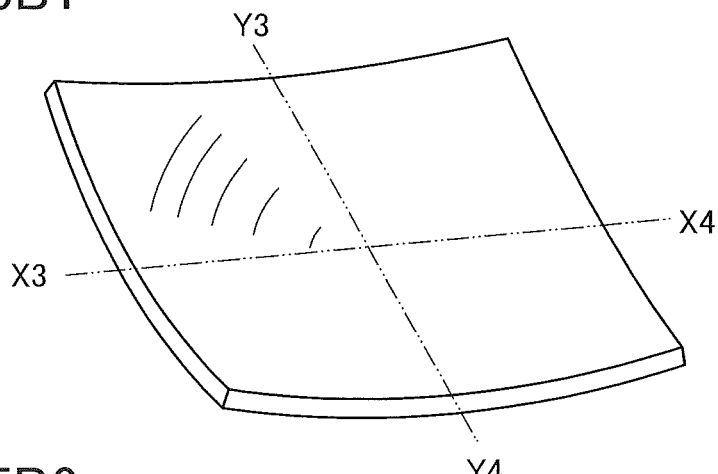
FIG. 45B2
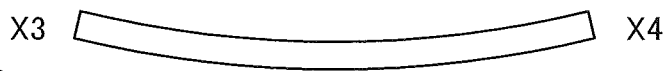
FIG. 45B3

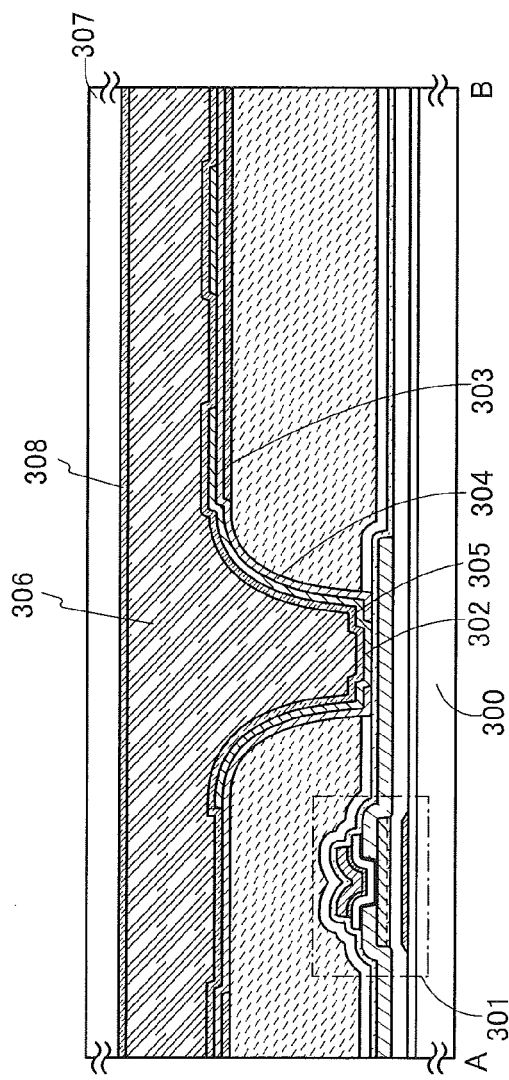
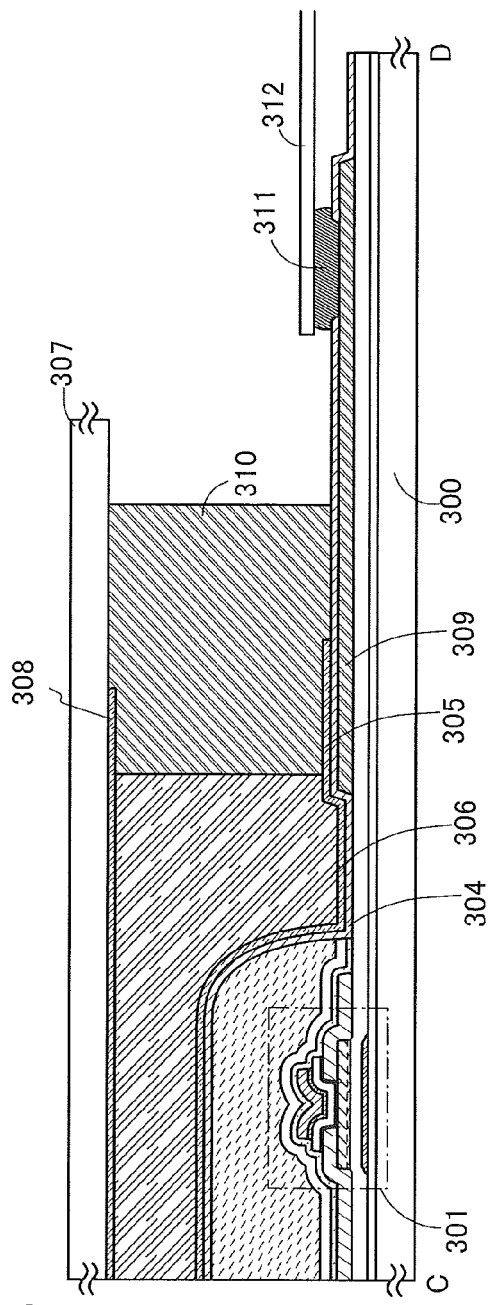
FIG. 49A
FIG. 49B

H1 — 407, 415, 430a/430b/430c (430), 473 — H2

I1 — 408, 415, 430a/430b/430c (430), 473 — I2

J1 — 409, 415, 430a/430b/430c (430), 473 — J2

K1 — 410, 415, 430a/430b/430c (430), 473 — K2

L1 — 411, 415, 430a/430b/430c (430), 473 — L2

M1 — 412, 415, 430a/430b/430c (430), 473 — M2

FIG. 64A
FIG. 64B
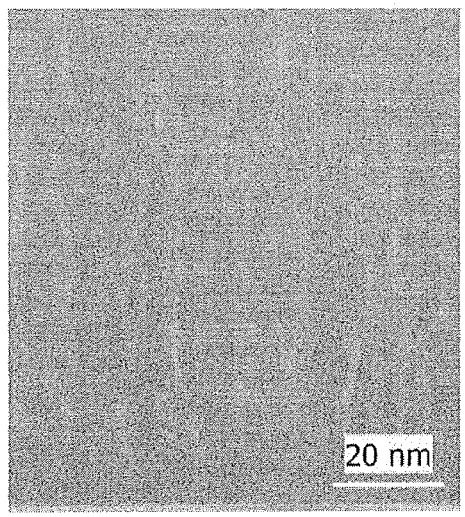
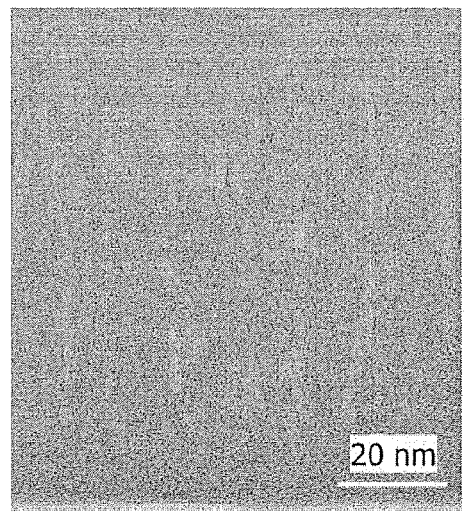

DISPLAY SYSTEM AND ELECTRONIC DEVICE

BACKGROUND OF THE INVENTION

1. Field of the Invention

One embodiment of the present invention relates to a display system and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

A display device in which a transistor with a low leakage current is used in a pixel to reduce a frequency of rewriting image data has been proposed (e.g., Patent Document 1). The necessity of rewriting image data is determined on the basis of a result of digital difference processing where image data of a difference detection frame and image data of a reference frame are compared. A reduction in power consumption of the display device is attempted by a reduction of the frequency of rewriting image data.

REFERENCE

Patent Document

[Patent Document 1] United States Patent Application Publication No. 2011/0090204

SUMMARY OF THE INVENTION

For a further reduction in power consumption in the entire display system, a reduction in power consumed in digital processing is important.

An object of one embodiment of the present invention is to provide a novel display system, a novel imaging device, a novel display device, a novel electronic device, or the like.

Another object of one embodiment of the present invention is to provide a display system or the like having a novel structure with which power consumption can be reduced. Another object of one embodiment of the present invention is to provide an imaging device or the like capable of obtaining high-quality imaging data.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

One embodiment of the present invention is a display system including an imaging device and a display device. The imaging device includes first pixels, a first circuit, and a second circuit. The first pixels are arranged in a matrix. The first circuit is configured to detect a difference between imaging data of a first frame and imaging data of a second frame. The second circuit is configured to detect a row of the first pixels where the difference is detected. The imaging device is configured to operate in a first imaging mode or a second imaging mode. The imaging device in the first imaging mode is configured to capture imaging data of a third frame. The imaging device in the second imaging mode is configured to capture the imaging data of the first frame and the imaging data of the second frame and configured to detect the difference between the imaging data of the first frame and the imaging data of the second frame.

The display device includes second pixels and a third circuit. The second pixels are arranged in a matrix. The second pixels are configured to display an image that corresponds to the imaging data of the third frame outputted from the imaging device. The third circuit is configured to select a row of the second pixels that corresponds to the row of the first pixels detected by the second circuit. The display device is configured to operate in a first display mode, a second display mode, or a third display mode. The display device in the first display mode is configured to display the image that corresponds to the imaging data of the third frame by rewriting image data retained in the second pixels in all rows. The display device in the second display mode is configured to display the image that corresponds to the imaging data of the third frame without rewriting image data retained in the second pixels. The display device in the third display mode is configured to display the image that corresponds to the imaging data of the third frame by rewriting image data retained in the second pixels only in the row selected by the third circuit.

The display system configured to operate in a first mode or a second mode is also one embodiment of the present invention. In the first mode, the imaging device in the first imaging mode captures the imaging data of the third frame in a first step, the display device in the first display mode displays the image that corresponds to the imaging data of the third frame in a second step, and determination whether or not to switch to the second mode is made in a third step. If it is determined not to switch to the second mode, the operation returns to the first step. If it is determined to switch to the second mode, the display device in the second display mode displays the image that corresponds to the imaging data of the third frame in a fourth step, and the imaging device in the second imaging mode outputs differential data between the first frame and the second frame in a fifth step. If no difference is detected, the fifth step is repeated. If the difference is detected, the imaging device in the first imaging mode captures the imaging data of the third frame in a sixth step, and the display device in the third display mode displays the image that corresponds to the imaging data of the third frame in a seventh step. The fourth step to the seventh step are repeated.

The second circuit may be configured to encode an address signal indicating the row of the first pixels where the difference is detected. The third circuit may be configured to decode the address signal encoded.

The first pixels may each include a first transistor and a photoelectric conversion element. The second pixels may each include a second transistor and a display element. The first transistor and the second transistor may each have an active layer containing an oxide semiconductor.

The photoelectric conversion element may include selenium or a compound semiconductor containing selenium.

The display element may be a liquid crystal element or a light-emitting element.

One embodiment of the present invention is an electronic device including the above display system including the imaging device and the display device and an operation key.

One embodiment of the present invention can provide a display system with a novel structure, a novel imaging device, a novel display device, a novel electronic device, or the like.

One embodiment of the present invention can provide a display system or the like having a novel structure with which power consumption can be reduced. One embodiment of the present invention can provide an imaging device or the like capable of obtaining high-quality imaging data.

Note that the effects of one embodiment of the present invention are not limited to the aforementioned effects. The aforementioned effects do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

FIG. 36 is a cross-sectional view illustrating a structure of an imaging device.

FIGS. 45A1, 45A2, 45A3, 45B1, 45B2, and 45B3 illustrate bent imaging devices.

FIGS. 49A and 49B are cross-sectional views each illustrating a structure of a display device.

FIGS. 64A and 64B show cross-sectional TEM images of an a-like OS.

DETAILED DESCRIPTION OF THE INVENTION

Figure 1:
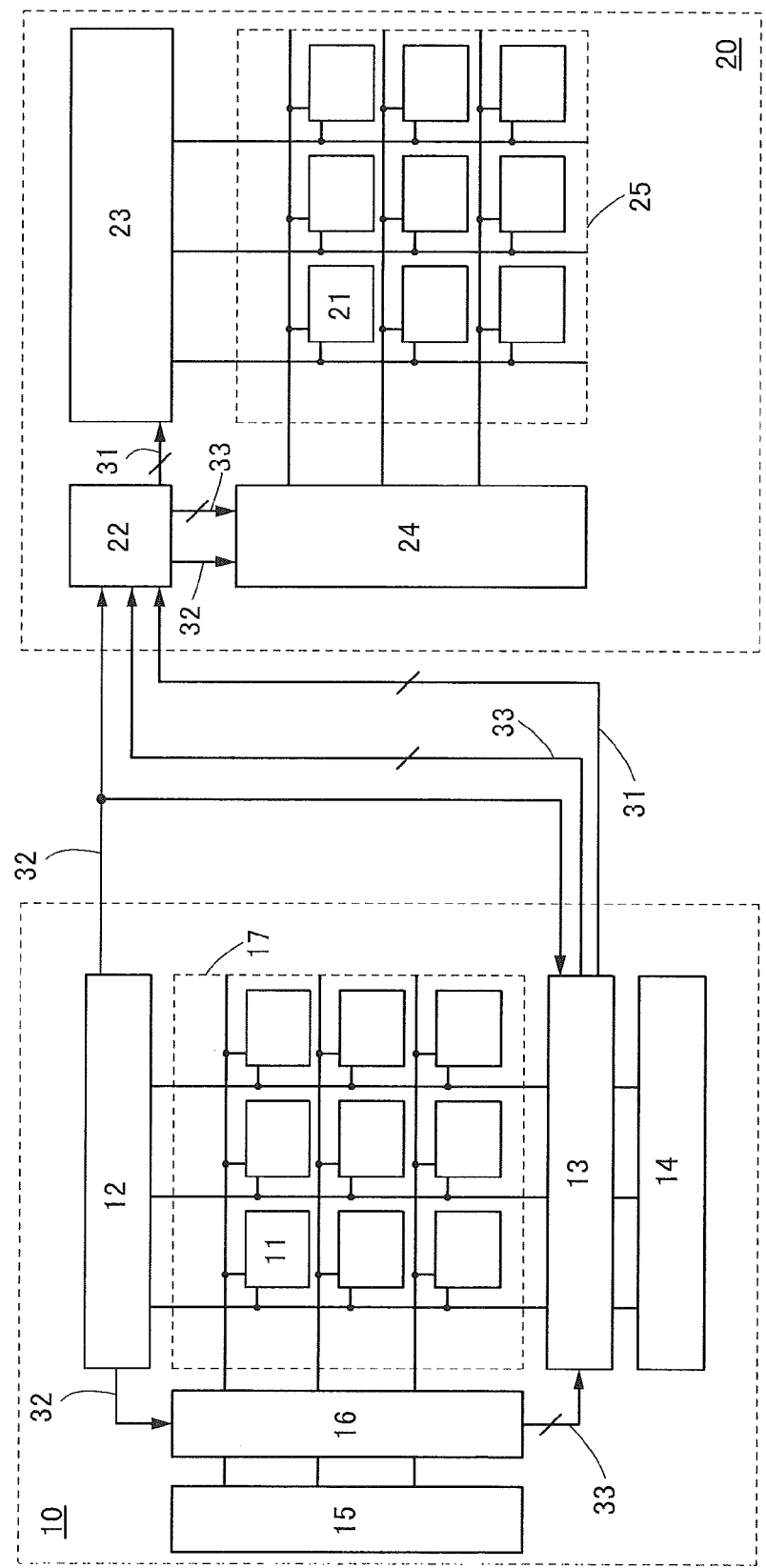
FIG. 1 is a block diagram of an imaging device and a display device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Since the source and the drain of the transistor change depending on the structure, operating conditions, and the like of the transistor, it is difficult to define which is a source or a drain. Thus, the terms "source" and "drain" can be interchanged with each other depending on the case of circumstances.

In this specification, ordinal numbers such as "first," "second," and "third" are used to avoid confusion among components, and thus do not limit the number of the components.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive layer, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal outputted from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring functions as an electrode, one conductive layer functions as the wiring and the electrode. Thus, "electrical connection" in this specification includes in its category such a case where one conductive layer has functions of a plurality of components.

Note that in this specification, terms for explaining arrangement, such as "over" and "under," are used for convenience to describe the positional relationship between components with reference to drawings. The positional relationship between components is changed as appropriate in accordance with a direction in which each component is described. Thus, there is no limitation on terms used in this specification, and description can be made appropriately depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Note that the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Embodiment 1

A configuration of a display system of one embodiment of the present invention will be described with reference to drawings.

In this specification and the like, the display system refers to any system including a display device. The display system may include a semiconductor element such as a transistor, a semiconductor device, an arithmetic device, a memory device, an imaging device, and the like, in addition to a display device.

In this specification and the like, the display device refers to any device that has a display function. The display device includes a plurality of pixels, a circuit for driving the plurality of pixels, and the like. The display device may include a control circuit, a power supply circuit, a signal generation circuit, or the like.

In this specification and the like, an imaging device refers to any device that has an imaging function, or alternatively refers to a circuit having an imaging function or the whole system including the circuit.

FIG. 1 is a block diagram illustrating a configuration of the display system of one embodiment of the present invention. The display system includes an imaging device 10 and a display device 20.

The imaging device 10 includes pixels 11, a circuit 12, a circuit 13, a circuit 14, a circuit 15, and a circuit 16. The pixels 11 are arranged in a matrix to form a pixel array 17. The display device 20 includes pixels 21, a circuit 22, a circuit 23, and a circuit 24. The pixels 21 are arranged in a matrix to form a pixel array 25.

The circuit 12 can have a function of performing data processing on imaging data, which is analog data, outputted from each of the pixels 11.

The circuit 13 can function as an A/D converter circuit that converts imaging data, which is analog data, outputted from the pixels 11 to digital data. The circuit 14 can function as a column driver that selects and reads data outputted from the circuit 13. The circuit 15 can function as a row driver that selects the pixels 11 in a row where imaging data is captured and outputted. The circuit 16 can function as an address encoder that generates an address signal indicating the row of the pixels 11.

Any of a variety of circuits, such as a decoder or a shift register, can be used as the circuit 14 and the circuit 15. The circuit 16 does not necessarily function as an address encoder as long as an address signal indicating a row where a difference between the imaging data of a reference frame and the imaging data of a difference detection frame is detected, as described in detail later.

The circuit 22 can function as a control circuit that supplies control signals to the circuit 23 and the circuit 24. The circuit 22 can have a function of generating a video data signal, which is written to the pixels 21, on the basis of imaging data outputted from the imaging device 10 and supplying the signal to the circuit 23. The circuit 23 can function as a source driver that writes the video data signal to the pixels 21. The circuit 24 can function as a gate driver that selects the pixels 21 in a row to which the video data signal is written. The circuit 24 can function as an address decoder that decodes the address signal encoded by the circuit 16.

Examples of the control signal supplied to the circuit 23 include a source start pulse and a source clock signal. Examples of the control signal supplied to the circuit 24 include a gate start pulse and a gate clock signal. Accordingly, the circuit 23 and the circuit 24 can operate.

As the circuit 23, a shift register, a buffer, or the like can be used. As the circuit 24, a shift register or the like as well as the above-described address decoder can be used.

Figure 2:
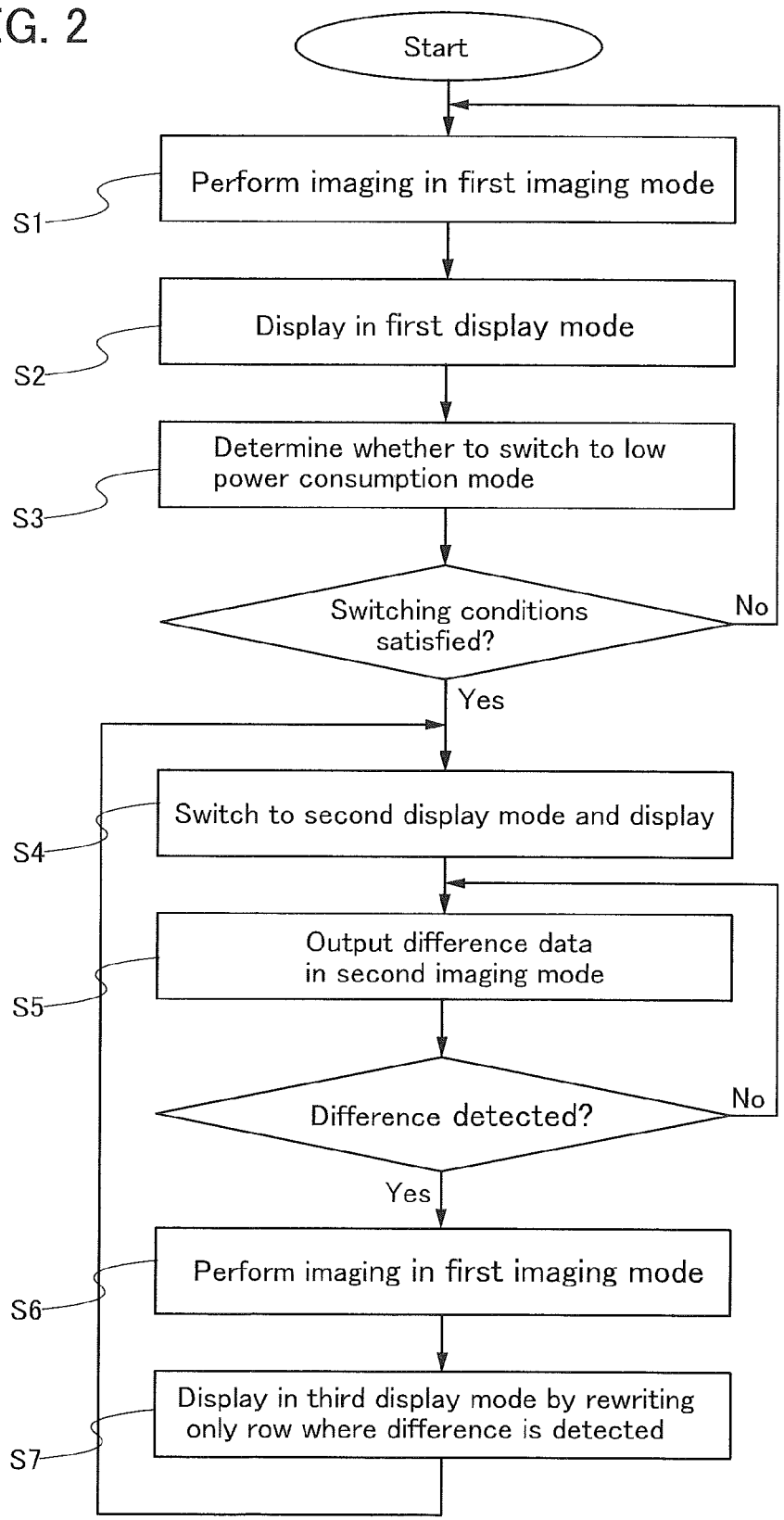
FIG. 2 is a flow chart illustrating the operations of an imaging device and a display device.

Here, the operation of the display system illustrated in FIG. 1 is described with reference to a flow chart illustrated in FIG. 2. The imaging device 10 can operate in a first imaging mode or a second imaging mode. The display device 20 can operate in a first display mode, a second display mode, or a third display mode.

First, the imaging device 10 performs imaging in the first imaging mode (S1). In this imaging mode, the pixels 11 in the pixel array 17 are selected by the circuit 15 row by row, and the imaging data of the pixels 11 in all rows is captured and supplied to the circuit 13. The imaging data captured at this point is sometimes referred to as a normal frame.

The imaging data supplied from the pixels 11 is sequentially converted to digital data by the circuit 13. Subsequently, the digital data is supplied as imaging data 31 from the circuit 13 to the circuit 22 included in the display device 20. The imaging data 31 can also be referred to as image data supplied to the display device 20.

Accordingly, the first imaging mode is a normal imaging mode in which the imaging data 31 is captured.

Next, the display device 20 performs displaying in the first display mode (S2). In this display mode, the circuit 22 that has received the imaging data 31 supplies control signals to the circuit 23 and the circuit 24. Furthermore, the circuit 22 generates a video data signal on the basis of the imaging data 31 and supplies it to the circuit 23. Then, the pixels 21 are selected by the circuit 24 row by row, and the video data signal is written. In this manner, the video data signal is written to the pixels 21 in all rows and an image that corresponds to the imaging data 31 is displayed.

Accordingly, the first display mode is a display mode in which an image that corresponds to the imaging data 31 is displayed by rewriting image data retained in all rows of the pixel array 25.

Next, determination whether or not to switch to a low power consumption mode is made (S3). If predetermined switching conditions are satisfied, the display device 20 switches to the second display mode, which is the low power consumption mode, and displaying is performed (S4). In the second display mode, the circuit 22 stops the supply of the control signals and the video data signal. In the above manner, the display device 20 displays an image corresponding to the imaging data 31 captured in S1 by using the video data signal written to and retained in the pixels 21 in S2. The switching conditions can be, for example, a predetermined time lapse or an input of a control signal for switching to the second display mode.

Accordingly, the second display mode is a display mode in which an image that corresponds to the imaging data 31 captured in the first imaging mode is kept displayed without rewriting the image data retained in the pixel array 25.

If the predetermined switching conditions are not satisfied, the operation returns to S1 so that imaging in the first imaging mode is performed again. Note that a mode in which imaging and displaying are performed through S1 to S3 can be referred to as a normal mode.

After the display device 20 switches to the second display mode, the imaging device 10 captures the imaging data of a reference frame and the imaging data of a difference detection frame in the second imaging mode. In this imaging mode, the pixels 11 are selected by the circuit 15 row by row, and data (differential data) including data on a difference between the imaging data of the reference frame and the imaging data of the difference detection frame is outputted from the pixels 11 in each selected row (S5).

The differential data outputted in the second imaging mode is supplied to the circuit 12, and a determination signal 32 is generated. If it is determined that there is a difference between the imaging data of the reference frame and the imaging data of the difference detection frame, the determination signal 32 is made active. If it is determined that there is no difference, the determination signal 32 is made inactive. The differential data can be retained in the pixels 11.

Note that when the determination signal 32 is made active, for example, a signal "H" (high potential) is outputted. When the determination signal 32 is made inactive, for example, a signal "L" (low potential) is outputted. The logic of the determination signal 32 may be inverted.

In this specification, "L" can be a ground potential, for example.

Accordingly, the second imaging mode is a difference detection mode in which difference detection between the imaging data of the reference frame and the imaging data of the difference detection frame is performed.

The difference detection in the circuit 12 may be performed in the following manner: a sum-of-absolute-difference algorithm is performed on differential data outputted from each of the pixels 11, and it is determined that there is no difference if the algorithm result is the same as a reference value while it is determined that there is a difference if the arithmetic operation result is different from the reference value. Alternatively, for example, the difference detection may be performed in the following manner: current is supplied in accordance with the magnitude of a difference between a reference current value and a current value that corresponds to the differential data outputted from each of the pixels 11, and it is determined that there is a difference if there is a difference in current supply while it is determined that there is no difference if there is no difference in current supply.

If the determination signal 32 is inactive, S5 is repeated. In that case, imaging of the reference frame can be skipped. In other words, differential data can be outputted by performing only imaging of the difference detection frame. If the determination signal 32 is active, the circuit 16 detects a row with a difference and generates an address signal 33 indicating the row. After that, for example, the address signal 33 is encoded into binary data and is then supplied to the circuit 13. Note that the address signal 33 is not necessarily encoded.

The circuit 12 detects a difference in imaging data and does not need to detect a row of the pixels 11 where a difference is detected. The circuit 16 can detect a row of the pixels 11 where a difference is detected if the circuit 12 determines that there is a difference.

Note that the transition of the display device 20 from the first display mode to the second display mode before the transition of the imaging device 10 from the first imaging mode to the second imaging mode can prevent the interruption of supply of the imaging data 31 from the imaging device 10 to the display device 20 in the first display mode. Accordingly, abnormal display in the display device 20 can be prevented.

Note that when the time between the transition of the imaging device 10 from the first imaging mode to the second imaging mode and the transition of the display device 20 from the first display mode to the second display mode is sufficiently short, abnormal display in the display device 20 can be prevented even when the transition of the display device 20 from the first display mode to the second display mode occurs after the transition of the imaging device 10 from the first imaging mode to the second imaging mode. In other words, if it is determined that the conditions for switching to the low power consumption mode are satisfied in S3, S5 may be performed, followed by S4.

After the address signal 33 is supplied to the circuit 13, the imaging device 10 switches to the first imaging mode, and the circuit 13 captures the imaging data 31 and supplies it to the circuit 22 (S6). In addition to the imaging data 31, the address signal 33 is supplied to the circuit 22 included in the display device 20.

Subsequently, the display device 20 switches to the third display mode, and displaying is performed (S7). In this display mode, the circuit 22 that has received the imaging data 31 and the address signal 33 in S6 supplies control signals to the circuit 23 and the circuit 24. Furthermore, the circuit 22 generates a video data signal on the basis of the imaging data 31 and supplies it to the circuit 23. In addition, the circuit 22 supplies the address signal 33 to the circuit 24. The circuit 24 rewrites, after decoding if the address signal 33 is encoded, video data signals that have been written to the pixels 21 only in a row selected in accordance with the address signal 33. In this manner, image data that corresponds to an image to be displayed is rewritten only in a row which is determined to have a difference.

Accordingly, the third display mode is a display mode in which an image that corresponds to the imaging data 31 captured in the first imaging mode is displayed by rewriting only image data retained in the pixels 21 in a row corresponding to a row of the pixels 11 where a difference is detected.

Note that the transition of the display device 20 from the second display mode to the third display mode after the transition of the imaging device 10 from the second imaging mode to the first imaging mode can prevent the interruption of supply of the imaging data 31 from the imaging device 10 to the display device 20 in the third display mode. Accordingly, abnormal display in the display device 20 can be prevented.

Note that when the time between the transition of the display device 20 from the second display mode to the third display mode and the transition of the imaging device 10 from the second imaging mode to the first imaging mode is sufficiently short, abnormal display in the display device 20 can be prevented even when the transition of the display device 20 from the second display mode to the third display mode occurs before the transition of the imaging device 10 from the second imaging mode to the first imaging mode. Hence, when a difference is detected in S5, S7 may be performed, followed by S6.

After image data that corresponds to an image to be displayed on the display device 20 is rewritten in the third display mode, the operation returns to S4 so that the display device 20 switches to the second display mode, and then the imaging device 10 outputs differential data in the second imaging mode in S5.

Note that the transition of the display device 20 from the third display mode to the second display mode before the transition of the imaging device 10 from the first imaging mode to the second imaging mode can prevent the interruption of supply of the imaging data 31 from the imaging device 10 to the display device 20 in the third display mode. Accordingly, abnormal display in the display device 20 can be prevented.

Note that when the time between the transition of the imaging device 10 from the first imaging mode to the second imaging mode and the transition of the display device 20 from the third display mode to the second display mode is sufficiently short, abnormal display in the display device 20 can be prevented even when the transition of the display device 20 from the third display mode to the second display mode occurs after the transition of the imaging device 10 from the first imaging mode to the second imaging mode. This means that after performing S7, S5 may be performed, followed by S4.

After the imaging device 10 switches to the first imaging mode and imaging is performed in S6, the display device 20 switches to the third display mode and displaying is performed by rewriting only image data in the pixels 21 in a row corresponding to a row of the pixels 11 where a difference is detected in S7.

In the above manner, S4 to S7 are repeatedly performed. The above is an operation example of the display system of one embodiment of the present invention.

Figure 3:
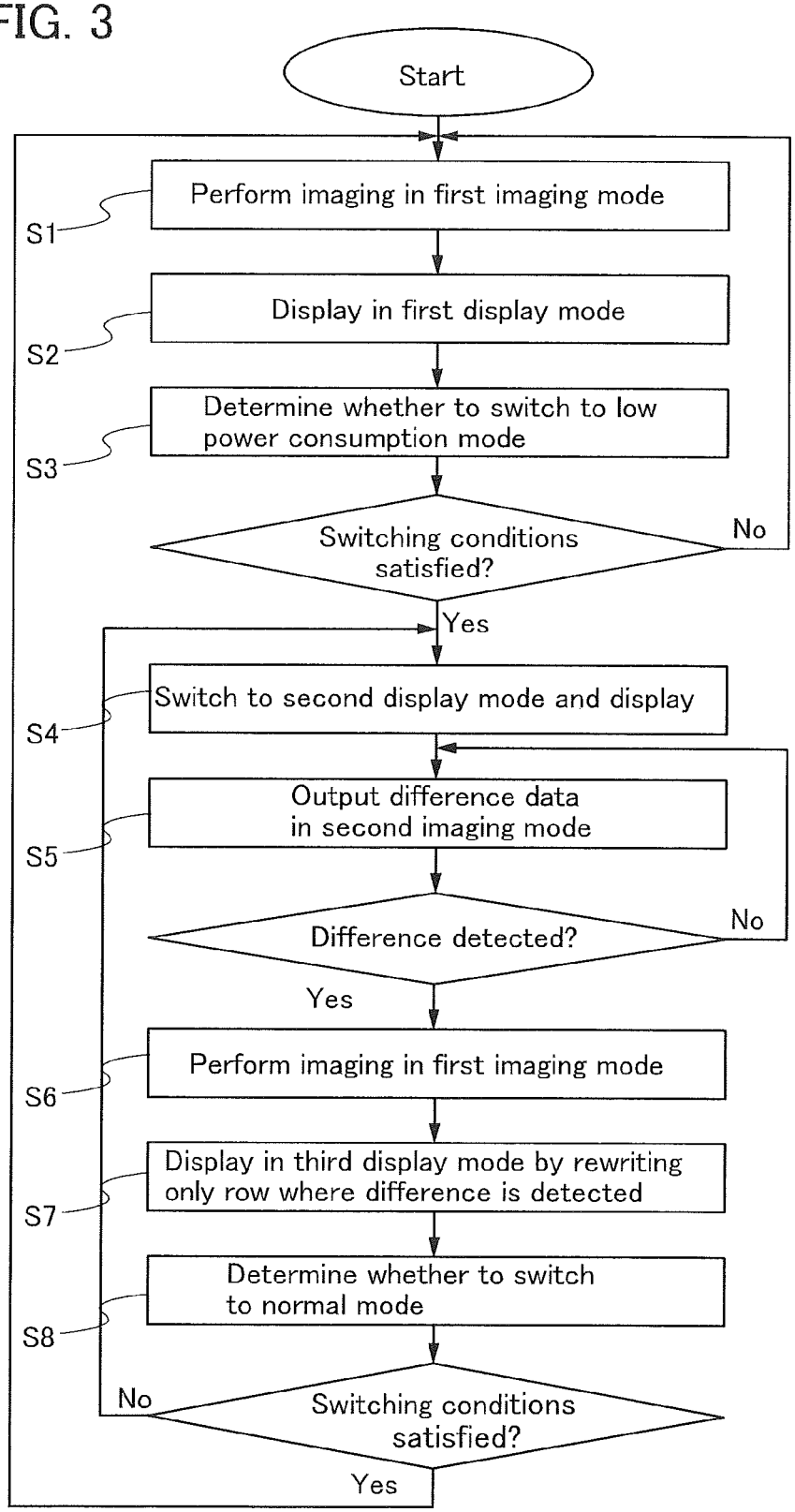
FIG. 3 is a flow chart illustrating the operations of an imaging device and a display device.

After S7, determination whether or not to switch to a normal mode may be made (S8) as illustrated in FIG. 3. If predetermined switching conditions are satisfied, the operation returns to S1 so that imaging by the imaging device 10 is performed in the first imaging mode; then, the display device 20 switches to the first display mode and displaying is performed as in S2. The switching conditions can be, for example, a predetermined time lapse or an input of a control signal for switching to the first display mode. Note that when it is determined that the switching conditions of a normal mode are satisfied, imaging by the imaging device 10 in the first imaging mode may be performed after the display device 20 switches to the first display mode.

Figure 4:
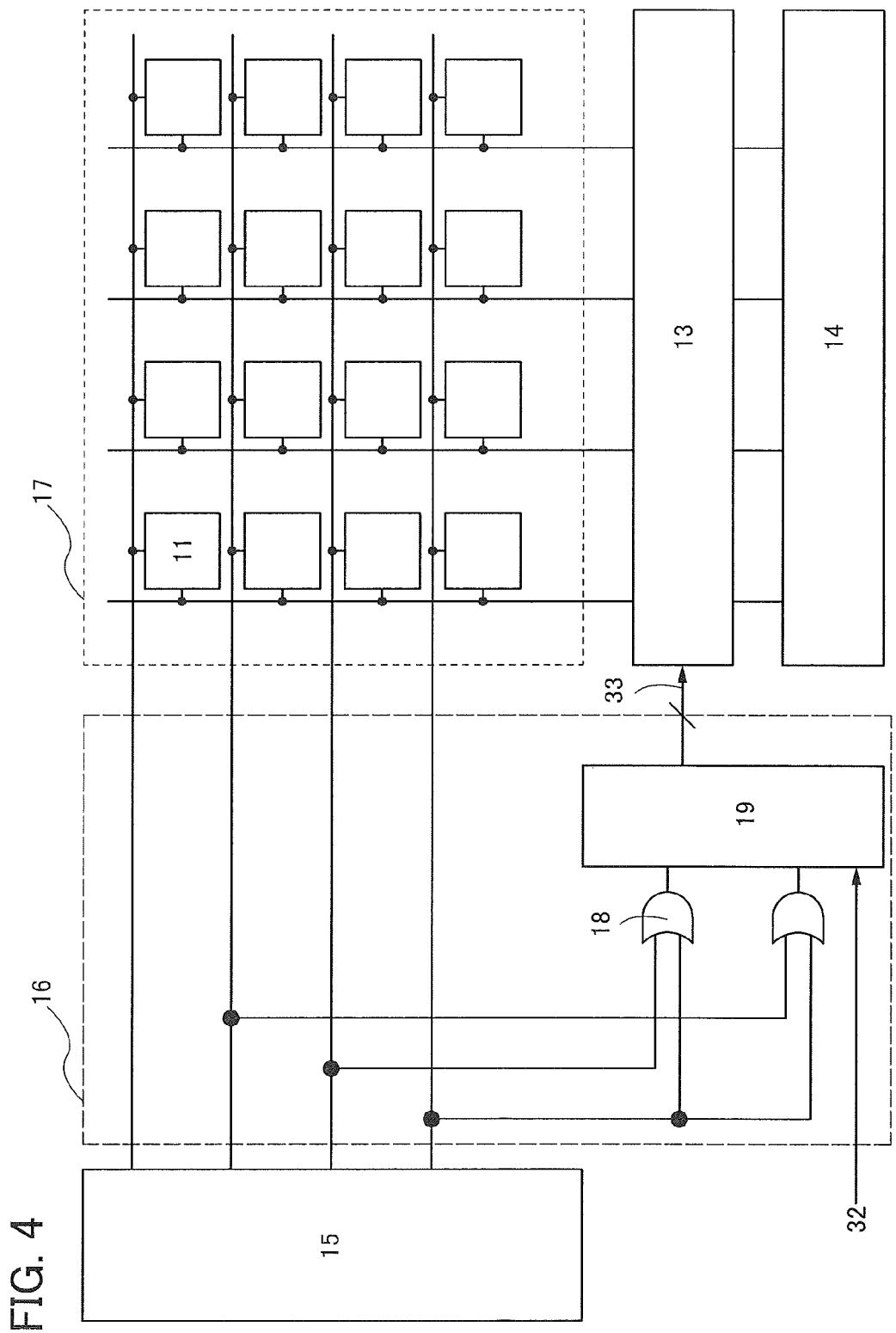
FIG. 4 illustrates a block diagram and a circuit diagram of an imaging device.

In one embodiment of the present invention, the circuit 16 can be an address encoder with a circuit configuration illustrated in FIG. 4. The circuit 16 includes an OR circuit 18 and a circuit 19. The circuit 19 can function as an address memory. The address signal 33 indicating a row of the pixels 11 which is determined to have a difference is stored in the circuit 19 and supplied to the circuit 13, only when the determination signal 32 is active.

Figure 5:
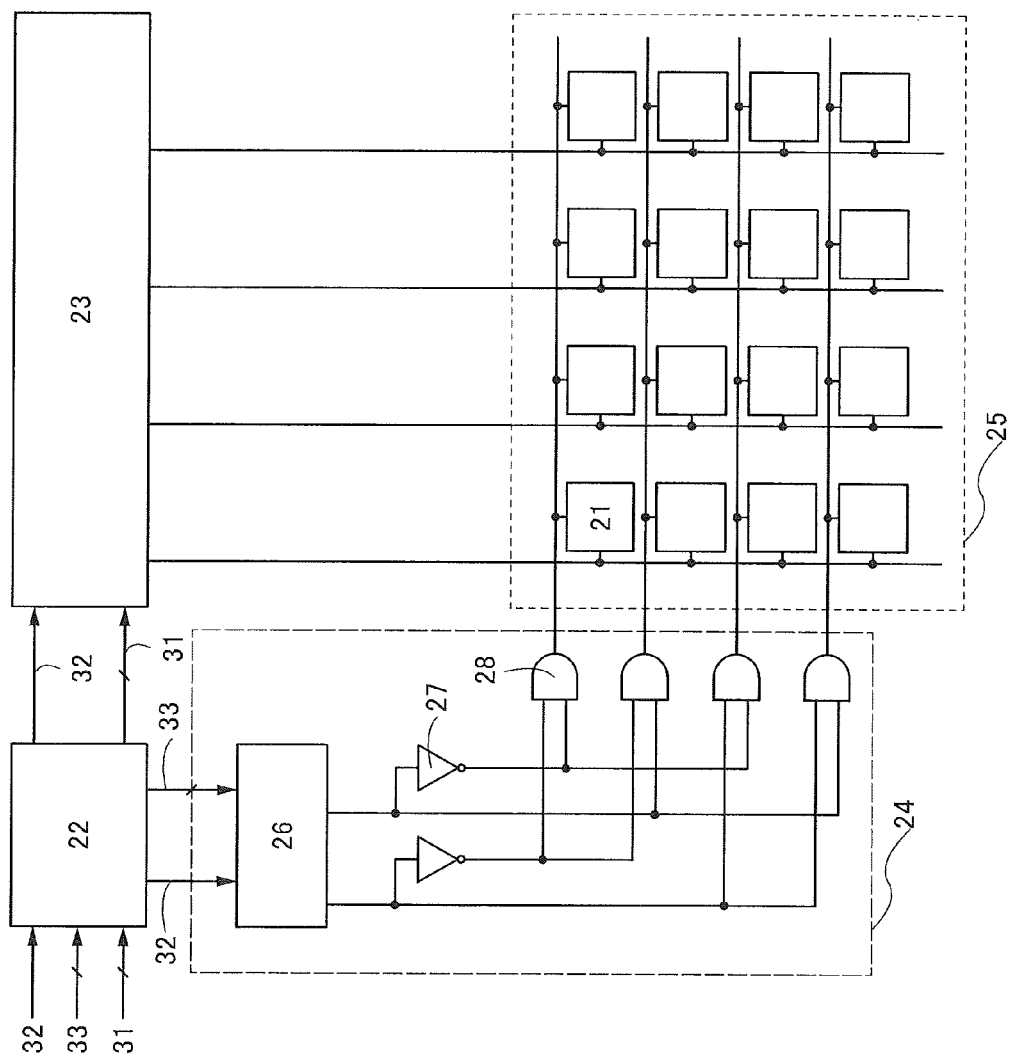
FIG. 5 illustrates a block diagram and a circuit diagram of a display device.

Furthermore, in one embodiment of the present invention, the circuit 24 can be an address decoder with a circuit configuration illustrated in FIG. 5. The circuit 24 includes a circuit 26, a NOT circuit 27, and an AND circuit 28. The circuit 26 can function as an address memory. The encoded address signal 33 supplied from the imaging device 10 is stored in the circuit 26 through the circuit 22. The address signal 33 is read from the circuit 26 and decoded only when the determination signal 32 is active. The circuit 24 may have a function of converting the decoded address signal 33 to a row address of the pixel array 25. Owing to the function, image data that corresponds to an image to be displayed on the display device 20 can be appropriately rewritten and displayed even when the pixel array 17 and the pixel array 25 have different numbers of rows.

Note that the circuit 13 is turned on when the determination signal 32 is active and is turned off when inactive. The circuit 13 can function as an A/D converter circuit. In order for the display device 20 to perform displaying, analog imaging data needs to be digitalized. For this reason, the determination signal 32 is preferably in an active state when imaging operation by the imaging device 10 is performed in the first imaging mode. In contrast, the determination signal 32 is preferably in an inactive state when the transition of the imaging device 10 from the first imaging mode to the second imaging mode is made because the circuit 13 is not used in the second imaging mode.

As described above, power consumption of the display system illustrated in FIG. 1 can be reduced because the imaging device 10 in the second imaging mode does not require processing that consumes an enormous amount of power, such as A/D conversion, and only requires minimum processing for generating the determination signal 32. Furthermore, the display device 20 in the second display mode does not require rewriting of a video data signal to be written to the pixels 21 and thus can minimize the operations of the circuit 23 and the circuit 24, leading to a reduction in power consumption. Moreover, the determination signal 32 can be obtained as a result of analog processing of differential data retained in the pixels 11 by the circuit 12; thus, power consumption can be lower than in the case of a configuration in which imaging data difference detection is performed by digital processing.

In the present invention, the imaging device 10 detects a difference between the imaging data of the reference frame and the imaging data of the difference detection frame row by row, and only image data that corresponds to an image to be displayed on the display device 20 in a row including imaging data which is determined to have a difference is rewritten. Thus, power consumption of the display device 20 can be further reduced.

This embodiment can be implemented in appropriate combination with any of the structures described in the other embodiments.

Embodiment 2

In this embodiment, modification examples of the imaging device described in Embodiment 1 and their operation methods will be described with reference to drawings.

Figure 6:
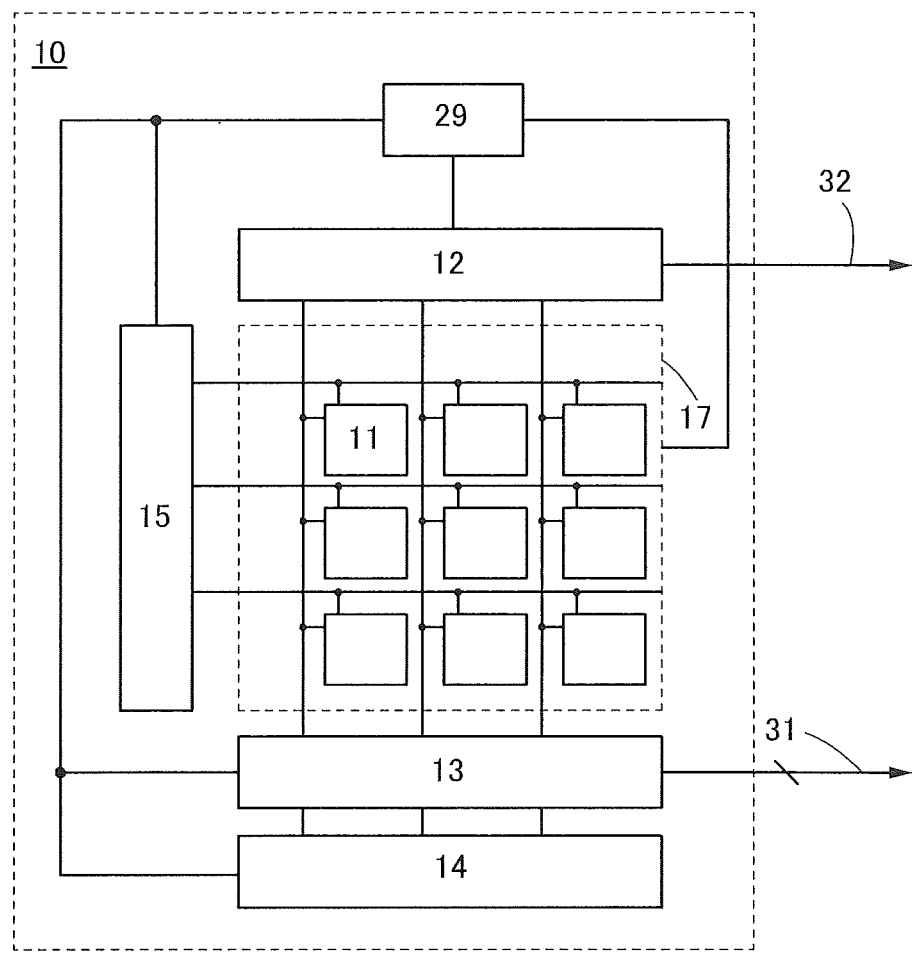
FIG. 6 is a block diagram of an imaging device.

FIG. 6 illustrates a modification example of the imaging device 10 in FIG. 1. The imaging device 10 illustrated in FIG. 6 is different from the imaging device 10 illustrated in FIG. 1 in that a circuit 29 is included, the circuit 16 is not included, the circuit 13 does not output the address signal 33, and the circuit 12 does not supply the generated determination signal 32 to the circuit 13.

The circuit 29 is electrically connected to the circuit 12, the circuit 13, the circuit 14, the circuit 15, and the pixel array 17.

The imaging device 10 illustrated in FIG. 6 can operate in three modes: the first imaging mode, the second imaging mode, and a standby mode. The circuit 29 functions as a controller that controls the pixels 11, the circuit 12, the circuit 13, the circuit 14, and the circuit 15 in accordance with the operation modes.

In the first imaging mode, the pixels 11, the circuit 13, the circuit 14, and the circuit 15 are made active and the circuit 12 is made inactive by the circuit 29. In the second imaging mode, the pixels 11, the circuit 12, and the circuit 15 are made active and the circuit 13 and the circuit 14 are made inactive by the circuit 29. In the standby mode, the pixels 11 and the circuits 12 to 15 are made inactive.

The determination signal 32 functions as a trigger for the transition of operation modes. Imaging is performed in the first imaging mode when the determination signal 32 is active and imaging of the reference frame and the difference detection frame is performed in the second imaging mode when the determination signal 32 is inactive.

Next, the operation of the imaging device 10 in FIG. 6 will be described with reference to a flow chart illustrated in FIG. 7. In the operation method illustrated in FIG. 7, the determination signal 32 is represented by a variable "MT." When the determination signal 32 is active, "MT" is set to "True" and when inactive, "MT" is set to "False."

First, "MT" is set to "True" (S1). Then, determination whether "MT" is "True" or "False" is made. Since "MT" is "True," imaging is performed in the first imaging mode (S2). Imaging data captured by the pixels 11 is sequentially converted to digital data by the circuit 13.

After "MT" is set to "False" (S3), determination whether "MT" is "True" or "False" is made. Since "MT" is "False," a row of the pixel array 17 is selected (S4) and imaging of the reference frame and the difference detection frame in the selected row is performed in the second imaging mode. Then, data (differential data) in the row of the pixel array 17 selected in S4, including data on a difference between the imaging data of the reference frame and the imaging data of the difference detection frame, is outputted (S5).

The differential data outputted in the second imaging mode is supplied to the circuit 12, and determination whether there is a difference or not is made. If it is determined that there is a difference, "MT" is set to "True" (S6) and then transition to the standby mode is made (S7). In the standby mode, power consumption can be reduced because the pixels 11 and the circuits 12 to 15 are made inactive as described above.

Then, determination whether "MT" is "True" or "False" is made. Since "MT" is "True," the operation returns to S2 and imaging in the first imaging mode is performed again.

If it is determined that there is no difference, determination whether differential data in the pixel array 17 in all rows is outputted or not is made. If differential data in all rows is outputted, determination whether "MT" is "True" or "False" is made. Since "MT" is "False," the operation returns to S4 so that a row of the pixel array 17 is selected again and imaging of the reference frame and the difference detection frame in the selected row is performed in the second imaging mode.

If there is a row from which differential data is not outputted, the next row of the pixel array 17 is selected (S8), and S5 is repeated. At this time, imaging of the reference frame can be skipped. In other words, differential data can be outputted by performing only imaging of the difference detection frame. The above is an operation example of the imaging device of one embodiment of the present invention.

Figure 7:
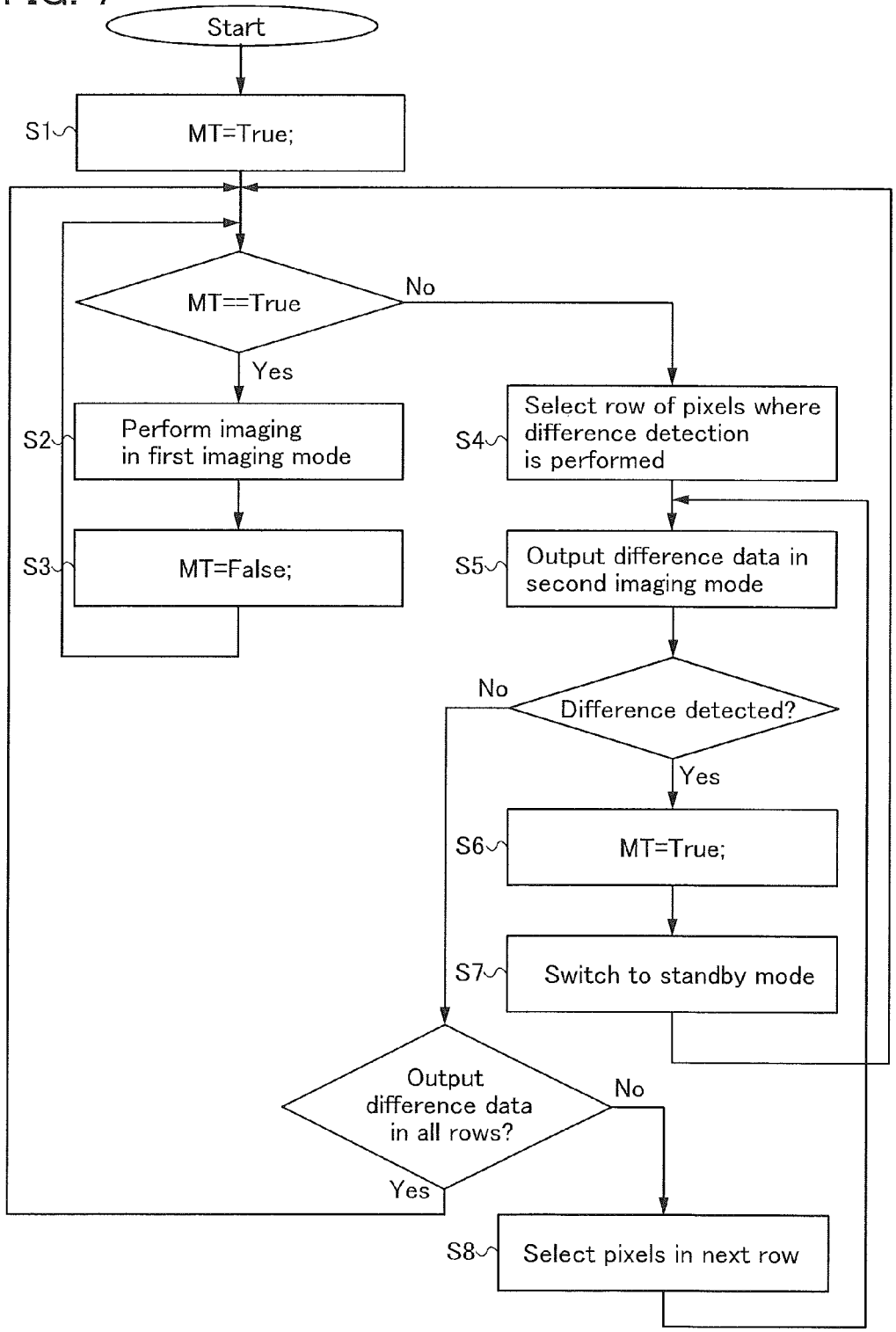
FIG. 7 is a flow chart illustrating the operation of an imaging device.
Figure 8:
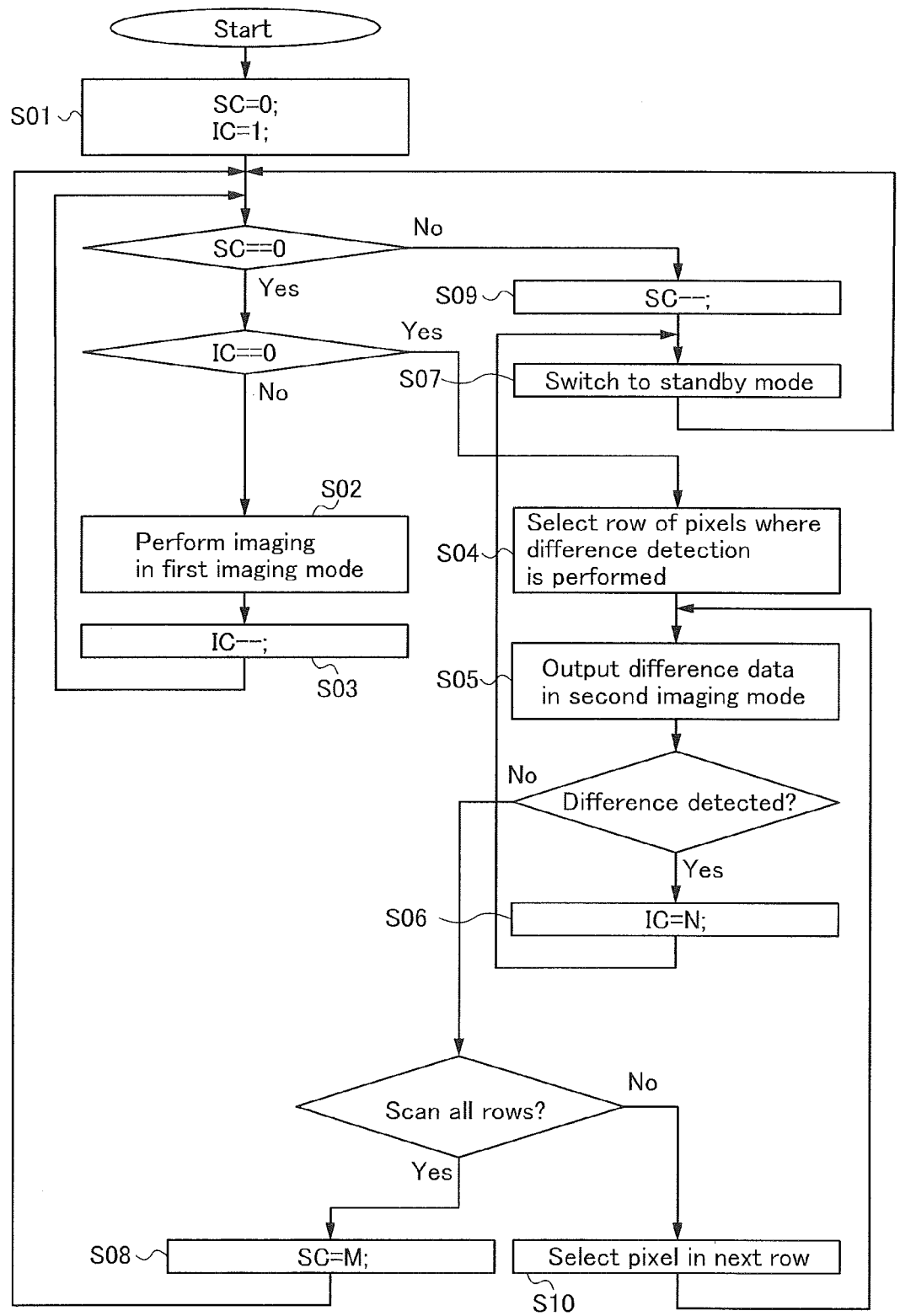
FIG. 8 is a flow chart illustrating the operation of an imaging device.

FIG. 8 illustrates a modification example of the operation method illustrated in FIG. 7. In the operation method illustrated in FIG. 8, the variable "MT" is replaced by a counter "SC" and a counter "IC." Note that "SC" can be an integer greater than or equal to 0 and less than or equal to M (M is a natural number), and "IC" can be an integer greater than or equal to 0 and less than or equal to N (N is a natural number). If "SC" is 0, determination whether "IC" is 0 or not is made. If "IC" is 0, imaging of the reference frame and the difference detection frame is performed in the second imaging mode and if "IC" is not 0, imaging is performed in the first imaging mode. After imaging in the first imaging mode, "IC" decrements by one. If "SC" is not 0, transition to the standby mode is made after "SC" decrements by one.

In the operation method illustrated in FIG. 8, first, "SC=0" and "IC=1" are given as initial values (S01). Then, determination whether "SC" is 0 or not is made. Since "SC" is 0, determination whether "IC" is 0 or not is made. Since "IC" is not 0, imaging is performed in the first imaging mode (S02).

Next, after "IC" decrements by one (S03), determination whether "SC" is 0 or not is made. Since "SC" is 0, determination whether "IC" is 0 or not is made. Since "IC" is 0, a row of the pixel array 17 is selected (S04) and imaging of the reference frame and the difference detection frame in the selected row is performed in the second imaging mode. Then, data (differential data) in the row of the pixel array 17 selected in S04, including data on a difference between the imaging data of the reference frame and the imaging data of the difference detection frame, is outputted (S05).

The differential data outputted in the second imaging mode is supplied to the circuit 12, and determination whether there is a difference or not is made. If it is determined that there is a difference, "IC" is set to N (S06) and then transition to the standby mode is made (S07).

Then, determination whether "SC" is 0 or not is made. Since "SC" is 0, determination whether "IC" is 0 or not is made. Since "IC" is not 0, the operation returns to S02 so that imaging is performed again in the first imaging mode.

If it is determined that there is no difference, determination whether differential data in all rows of the pixel array 17 is outputted or not is made. If differential data in all rows is outputted, "SC" is set to M (S08) and then determination whether "SC" is 0 or not is made. Since "SC" is not 0, after "SC" decrements by one (S09), transition to the standby mode is made as in S07.

If there is a row from which differential data is not outputted, the next row of the pixel array 17 is selected (S10), and S05 is repeated. At this time, imaging of the reference frame can be skipped. In other words, differential data can be outputted by performing only imaging of the difference detection frame. The above is an operation example of the imaging device of one embodiment of the present invention.

In the operation method illustrated in FIG. 8, transition from the second imaging mode to the first imaging mode leads to imaging of N normal frames. If no difference is detected in the second imaging mode between the imaging data of the reference frame and the imaging data of the difference detection frame in all rows of the pixel array 17, the standby mode can last M frames. When a difference between the imaging data of the reference frame and the imaging data of the difference detection frame is detected, it is highly possible that a difference will be detected again. When no difference is detected, it is highly possible that no difference will be detected for a while. Accordingly, the number of times of the mode transition can be reduced and the length of the standby mode can be increased. Thus, the operation method illustrated in FIG. 8 enables a reduction in power consumption.

Figure 9:
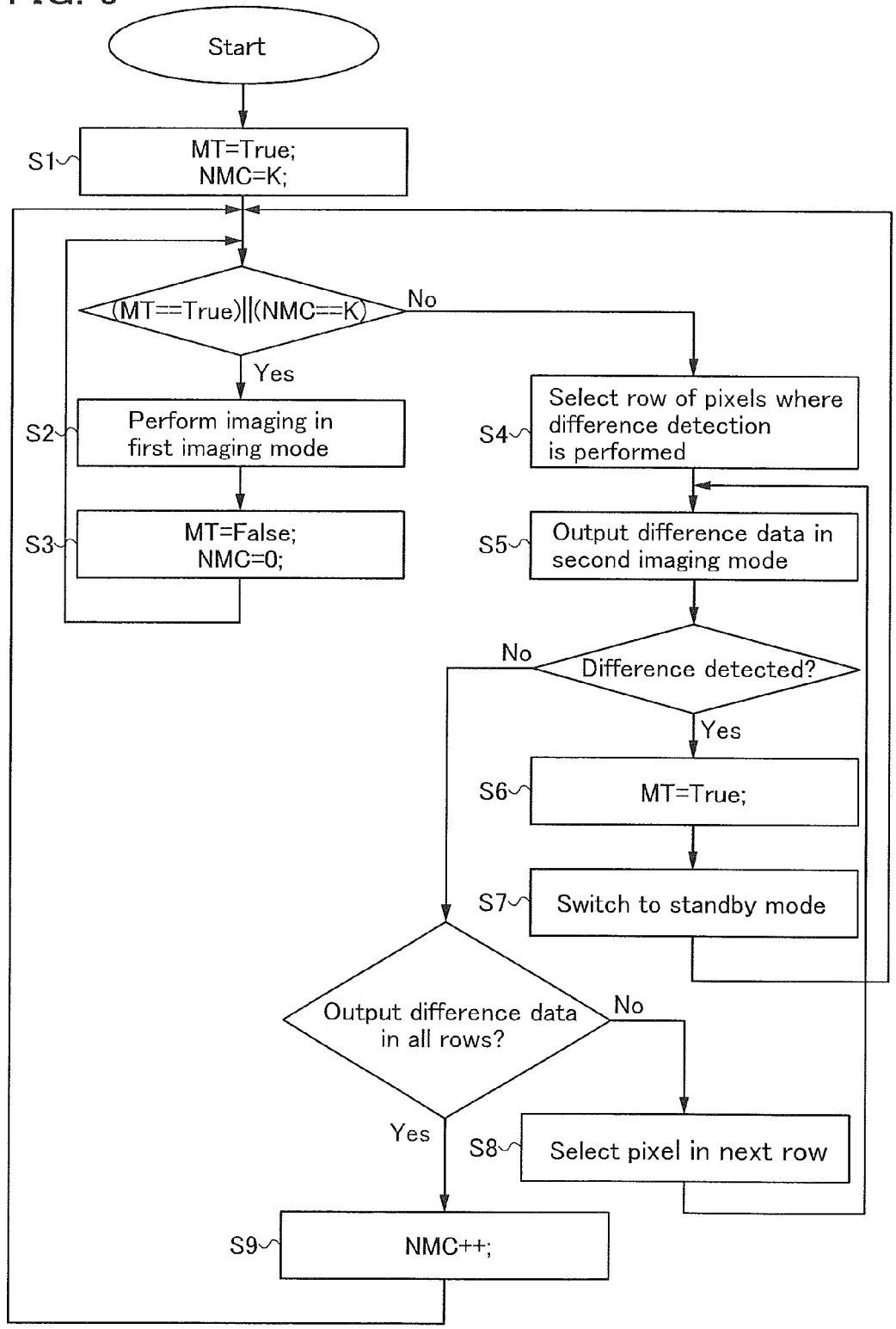
FIG. 9 is a flow chart illustrating the operation of an imaging device.

Note that the imaging device 10 illustrated in FIG. 6 may operate in accordance with a flow chart illustrated in FIG. 9. The operation method illustrated in FIG. 9 is different from the operation method illustrated in FIG. 7 in that a counter "NMC" is used. Note that "NMC" can be an integer greater than or equal to 0 and less than or equal to K (K is a natural number).

After imaging in the first imaging mode, imaging data retained in the pixels 11 might deteriorate in the case where imaging in the first imaging mode is not performed until a difference is detected, because of leakage of charges accumulated in the pixels 11 or the like. Thus, even when no difference is detected between the imaging data of the reference frame and the imaging data of the difference detection frame, imaging in the first imaging mode is performed as in the case where a difference is detected if "NMC" is "K" where K is the maximum number of frames that is calculated using "(the maximum time imaging data can be retained in the pixels 11)×(frame frequency)." Accordingly, deterioration of imaging data in the pixels 11 can be prevented.

In the case where an image that corresponds to imaging data captured by the pixels 11 is displayed on a display device that has a function of displaying in the first display mode and the second display mode described in Embodiment 1, for example, K may be "(the maximum time imaging data can be retained in the pixels 21)×(frame frequency)."

In the operation method illustrated in FIG. 9, "MT" is set to "True" and "NMC" is set to "K" in S1. If at least one of "MT=True" and "NMC=K" is satisfied, imaging in the first imaging mode is performed as in S2. In S3, "MT" is set to "False" and "NMC" is set to 0.

After differential data is outputted in the second imaging mode in S5, "NMC" increments by one (S9) if no difference is detected and differential data in all rows of the pixel array 17 is outputted. After that, if at least one of "MT=True" and "NMC=K" is satisfied, imaging is performed in the first imaging mode as in S2; if neither of them is satisfied, a row of the pixel array 17 where difference detection is performed is selected as in S4 and then differential data is outputted in the second imaging mode as in S5. The above points are different from the operation method illustrated in FIG. 7.

Figure 10:
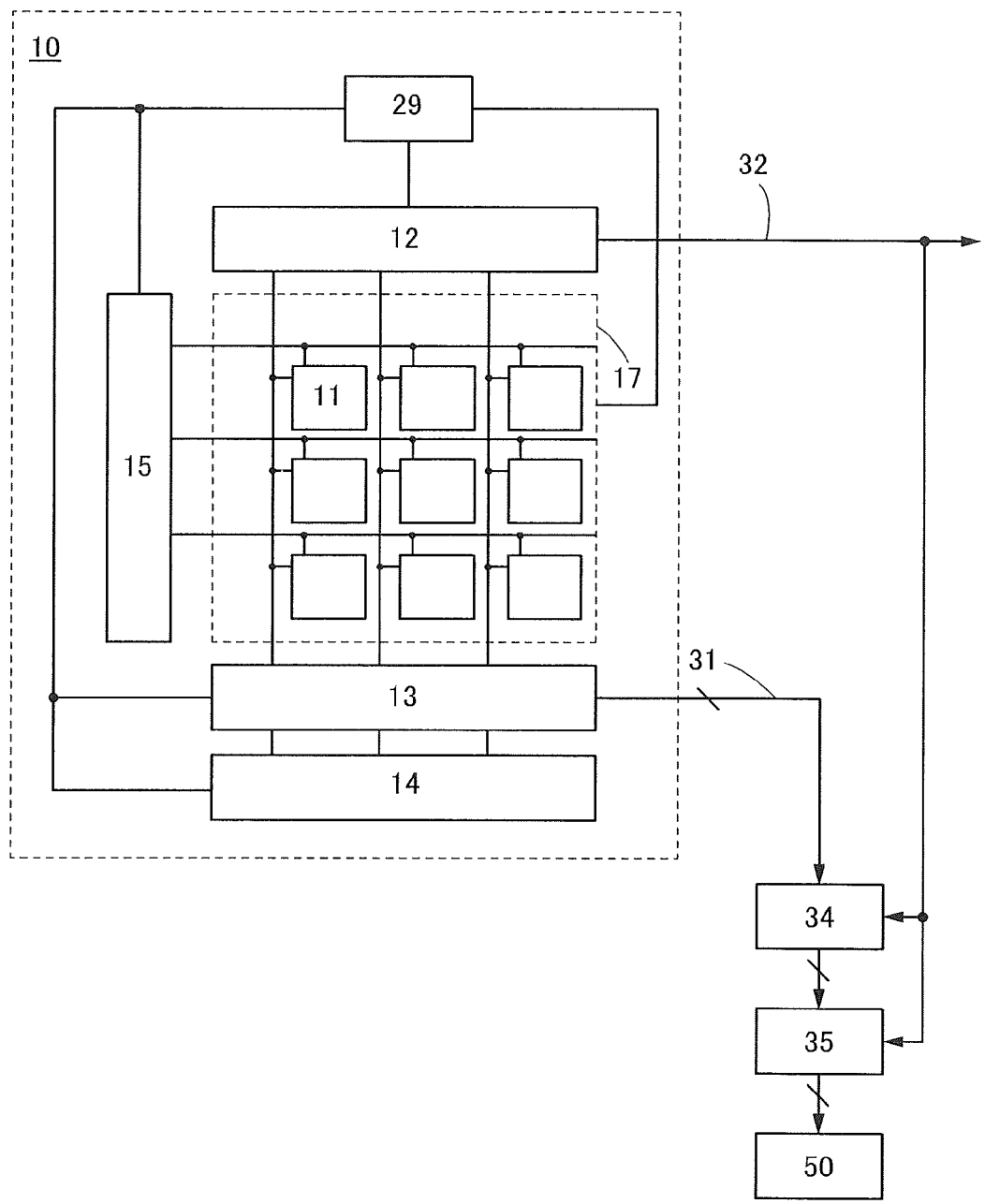
FIG. 10 is a block diagram of an imaging device.

The imaging data 31 captured by the imaging device 10 is supplied to a circuit 34, supplied to a circuit 35, and then supplied to an external device as illustrated in FIG. 10. Examples of the external device include a display device 50 that has a function of displaying in the first display mode and the second display mode described in Embodiment 1. The determination signal 32 can be supplied to the circuit 34 and the circuit 35. Described below is the case where the display device 50 is connected as an external device to the imaging device 10.

The circuit 34 can function as a resolution conversion circuit for converting the resolution of the imaging data 31. In the case where the resolution of the imaging device 10 is 240×160 and the resolution of the display device 50 is 1920×1080, for example, the circuit 34 converts the resolution from 240×160 to 1920×1080.

The circuit 35 can function as a transmission circuit. The transmission circuit performs protocol conversion processing or the like to convert the imaging data 31 whose resolution is converted by the circuit 34 to a data format that can be displayed on the display device 50 and then supplies the data to the display device 50 or the like.

The circuit 34 and the circuit 35 perform resolution conversion processing and transmission processing during the period from when a difference is detected in the second imaging mode and imaging in the first imaging mode terminates until a difference is detected again in the second imaging mode and imaging in the first imaging mode terminates. This means that if a difference is detected in the second imaging mode and in the next second imaging mode, the circuit 34 and the circuit 35 each complete the processing in two frames after imaging in the first imaging mode. In the case where the operating frequency of the imaging device 10 is 60 fps (the operation cycle is approximately 16 ins), for example, each processing needs to be completed in approximately 32 ms after imaging of the reference frame in the first imaging mode.

The circuit 34 and the circuit 35 can be made inactive while performing no processing. As a result, power consumption can be reduced. However, power is consumed in a transition state between active and inactive.

FIGS. 11A to 11D each show a relationship between elapsed time and power consumption in the circuit 34 and the circuit 35. Note that a period between Time T1 and Time T2 and that between Time T2 and Time T5 are equal in FIGS. 11A and 11B and in FIGS. 11C and 11D.

Time T1 is the time at which imaging in the first imaging mode is performed. Time T2 is the time at which resolution conversion processing by the circuit 34 and transmission processing by the circuit 35 terminates. In other words, the circuit 34 and the circuit 35 are made active from Time T1 to Time T2 to perform resolution conversion processing and transmission processing on the imaging data 31 captured at Time T1.

Figure 11A:
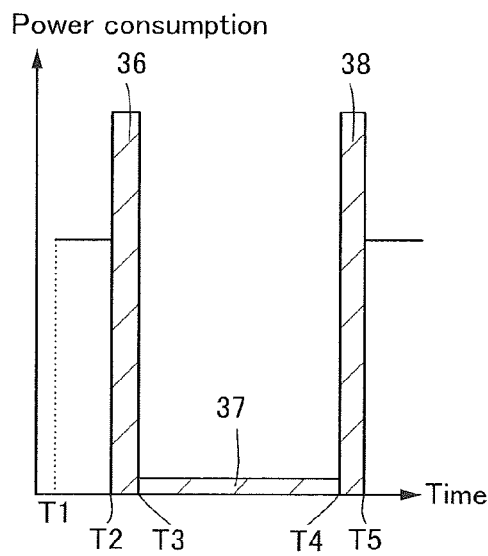
FIGS. 11A to 11D are graphs each showing power consumption of a resolution conversion circuit and a transmission circuit.
Figure 11B:
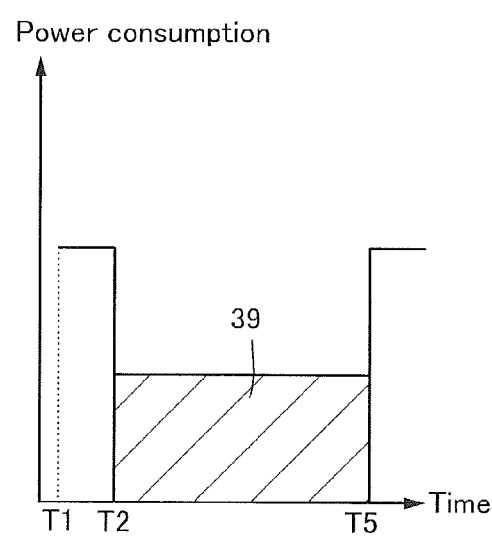
Figure 11C:
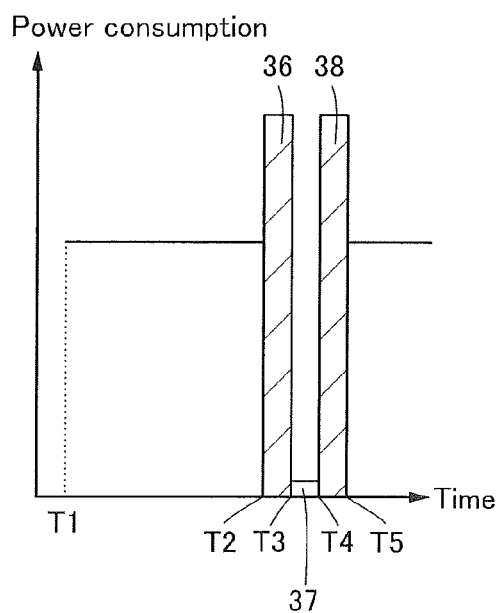

FIGS. 11A and 11C each show the case where the circuit 34 and the circuit 35 switch from active to inactive at Time T2. In that case, the circuit 34 and the circuit 35 are inactive at Time T3. This means that a period between Time T2 and Time T3 is in a transition state from active to inactive during which an amount 36 of power is consumed.

The circuit 34 and the circuit 35 are inactive in a period between Time T3 and Time T4 during which an amount 37 of power is consumed.

The circuit 34 and the circuit 35 switch from inactive to active at Time T4. In that case, the circuit 34 and the circuit 35 are active at Time T5. This means that a period between Time T4 and Time T5 is in a transition state from inactive to active and an amount 38 of power is consumed.

According to the above, power consumption from Time T2 to Time T5 in the cases of FIGS. 11A and 11C is the sum of the amount 36 of power, the amount 37 of power, and the amount 38 of power.

Note that the amount 37 of power is due to the power consumption or the like of a controller having a function of detecting supply of the imaging data 31 and making the circuit 34 and the circuit 35 active.

Time T5 is the time at which imaging in the first imaging mode is performed again. Resolution conversion processing and transmission processing are performed on the captured imaging data 31 after Time T5.

A period between Time T1 and Time T5 is twice as long as the operation cycle of the imaging device 10. In the case where the operation cycle is 16 ms (the operating frequency is 60 ms), for example, Time T5 starts 32 ms after Time T1.

Figure 11D:
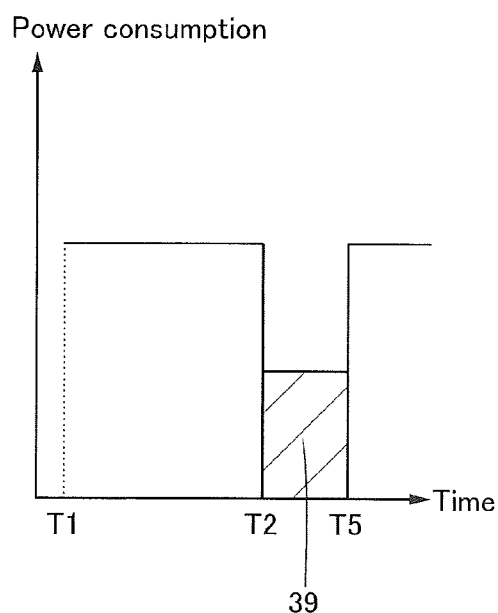

FIGS. 11B and 11D each show the case where the circuit 34 and the circuit 35 are active from Time T1 to Time T5. Even in that case, resolution conversion processing and transmission processing are not performed from Time T2 to Time T5. Thus, power consumption can be lower than in the case of performing processing. However, power consumption is higher than in the case of an inactive state.

FIGS. 11A and 11B each show the case where the sum of the amount 36 of power, the amount 37 of power, and the amount 38 of power is smaller than an amount 39 of power. In that case, the circuit 34 and the circuit 35 are preferably made inactive every time after resolution conversion processing and transmission processing terminate. FIGS. 11C and 11D each show the case where the sum of the amount 36 of power, the amount 37 of power, and the amount 38 of power is larger than the amount 39 of power. In that case, the circuit 34 and the circuit 35 are preferably not made inactive every time after resolution conversion processing and transmission processing terminate, and are preferably kept active for several frames.

The shorter the period between Time T1 and Time T2 becomes, the longer the time during which the circuit 34 and the circuit 35 can be made inactive is, leading to a large effect on reducing power consumption in the case of an inactive state. In other words, the shorter the processing time of the circuit 34 and the circuit 35 becomes, the larger the effect on reducing power consumption in the case of an inactive state.

Figure 12:
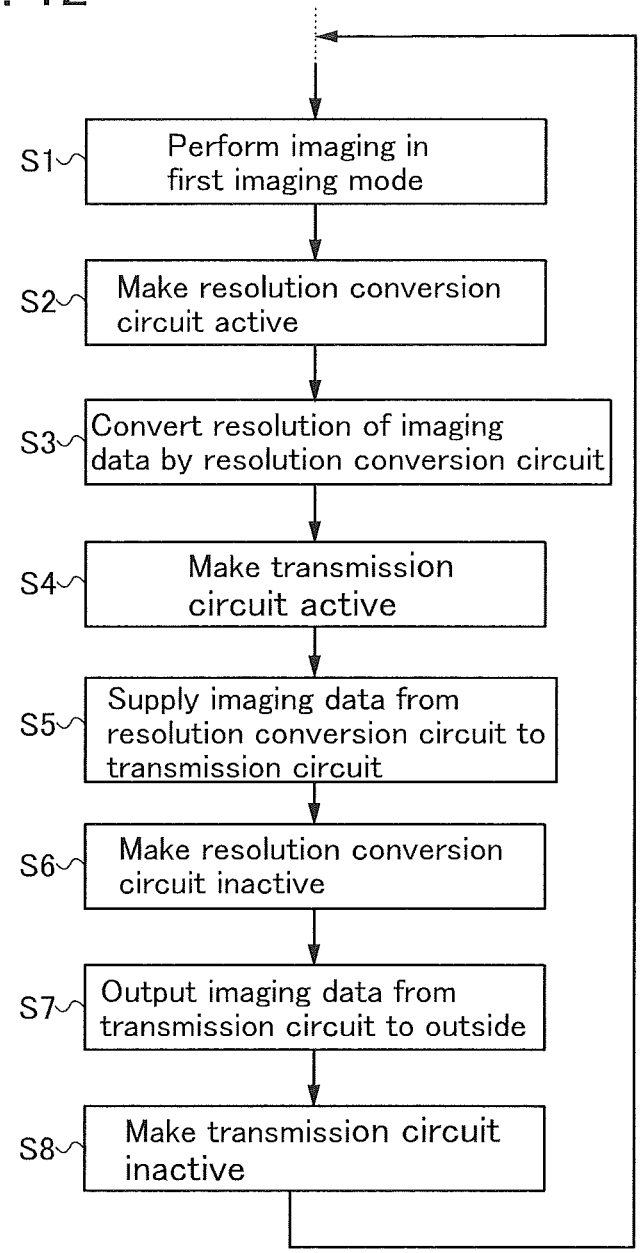
FIG. 12 is a flow chart illustrating the operation of an imaging device.

FIG. 12 is a flow chart illustrating the operation method of the circuit 34 and the circuit 35 in the cases of FIGS. 11A and 11C. In the imaging device 10, after the imaging data 31 is captured in the first imaging mode (S1), the circuit 34 is made active (S2). Then, the resolution of the imaging data 31 is converted by the circuit 34 to a resolution that can be displayed on the display device 50 (S3).

Next, the circuit 35 is made active (S4) and then the imaging data 31 whose resolution is converted is supplied to the circuit 35 (S5). Then, the circuit 34 is made inactive (S6). After the circuit 35 converts the imaging data 31 to a data format that can be displayed on the display device 50, the data is supplied to the display device 50 (S7).

Then, the circuit 35 is made inactive, and the imaging device 10 performs imaging in the first imaging mode or in the second imaging mode. The above is an operation example of the circuit 34 and the circuit 35.

Figure 13:
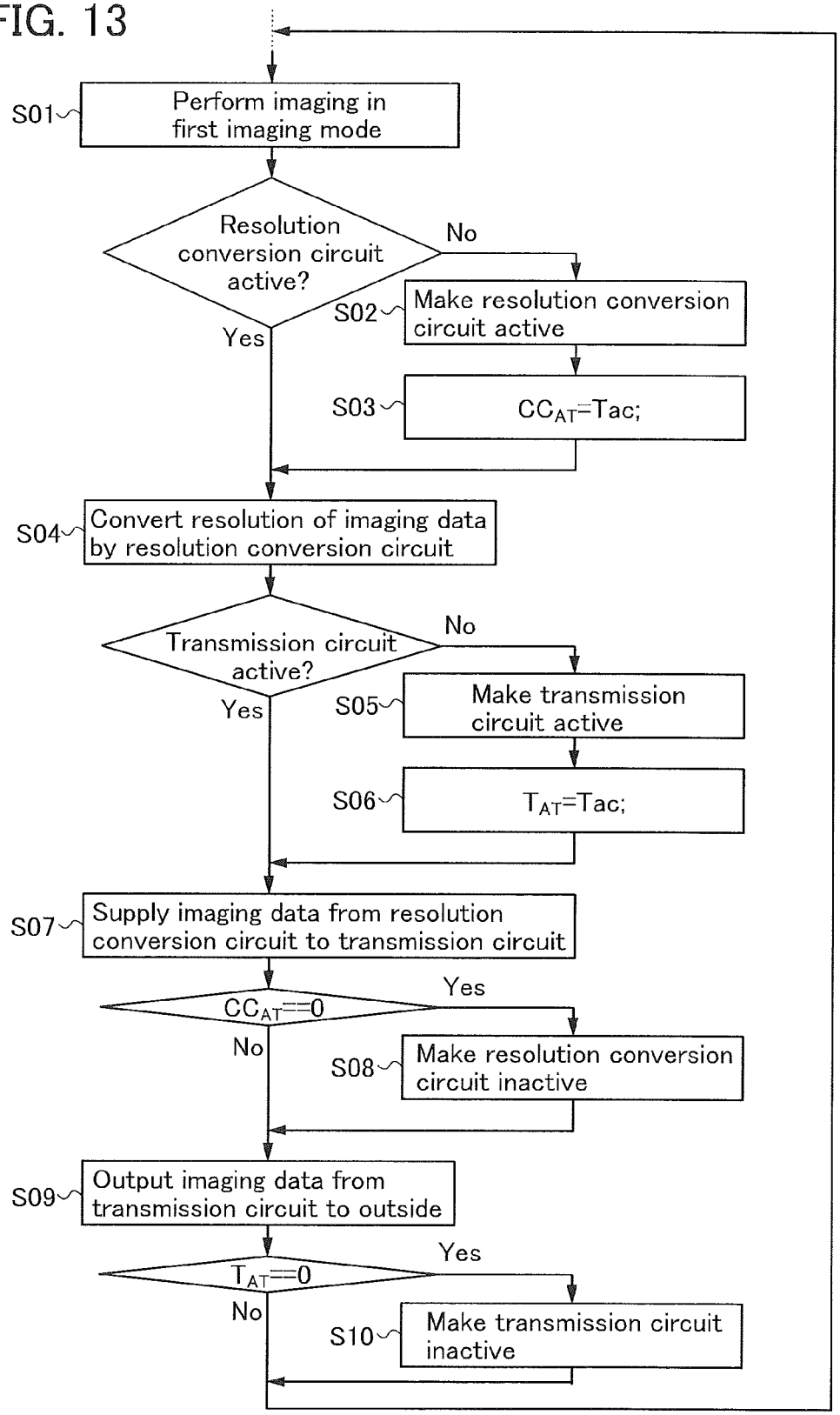
FIG. 13 is a flow chart illustrating the operation of an imaging device.

FIG. 13 is a flow chart illustrating the operation method of the circuit 34 and the circuit 35 in the case of FIGS. 11B and 11D. In the operation method illustrated in FIG. 13, a timer "$CC_{AT}$", a timer "$T_{AT}$", and a variable "The" are used. Note that each of "$CC_{AT}$", "$T_{AT}$", and "$T_{AT}$" can be a real number greater than or equal to 0.

Here, "Tac" represents the time during which the circuit 34 and the circuit 35 are made active and then made inactive. Note that "Tac" can take on an arbitrary value and is preferably set to a time during which a difference between the reference frame and the difference detection frame is assumed to be continuously detected, for example. In the case where a difference is probably detected in every imaging of the difference detection frame for 225 ms after the circuit 34 and the circuit 35 are made active, for example, "Tac" is preferably set to 225 ms.

In the operation method illustrated in FIG. 13, in the imaging device 10, the imaging data 31 is captured in the first imaging mode (S01) and then determination whether the circuit 34 is active or inactive is made. If the circuit 34 is active, the circuit 34 converts the resolution of the imaging data 31 to a resolution that can be displayed on the display device 50 (S04). If the circuit 34 is inactive, the circuit 34 is made active (S02), "$CC_{AT}$" is set to "Tac" (S03), and then the resolution is converted in S04.

Next, determination whether the circuit 35 is active or inactive is made. If the circuit 35 is active, the imaging data 31 whose resolution is converted is supplied to the circuit 35 (S07). If the circuit 35 is inactive, the circuit 35 is made active (S05), "$T_{AT}$" is set to "Tac" (S06), and then the imaging data 31 whose resolution is converted is supplied to the circuit 35 as in S07.

Then, determination whether "$CC_{AT}$" is 0 or not is made. If "$CC_{AT}$" is 0, the circuit 34 is made inactive (S08). After the circuit 35 converts the imaging data 31 to a data format that can be displayed on the display device 50, the data is supplied to the display device 50 (S09). If "$CC_{AT}$" is not 0, the circuit 34 is kept active. Then, after the circuit 35 converts the imaging data 31 to a data format that can be displayed on the display device 50, the data is supplied to the display device 50 as in S09.

Next, determination whether "$T_{AT}$" is 0 or not is made. If "$T_{AT}$" is 0, the circuit 35 is made inactive (S10), and the imaging device 10 performs imaging in the first imaging mode or in the second imaging mode. If "$T_{AT}$" is not 0, the circuit 35 is kept active, and the imaging device 10 performs imaging in the first imaging mode or in the second imaging mode. The above is an operation example of the circuit 34 and the circuit 35.

Note that the timer "$CC_{AT}$" and the timer "$T_{AT}$" may be counters. In that case, for example, "Tac" is set to an initial value of "$CC_{AT}$" or "$T_{AT}$," "$CC_{AT}$" decrements by one after S07, and "$T_{AT}$" decrements by one after S09. Here, "Tac" represents the number of times of imaging in the first imaging mode performed while the circuit 34 and the circuit 35 are kept active.

Figure 14:
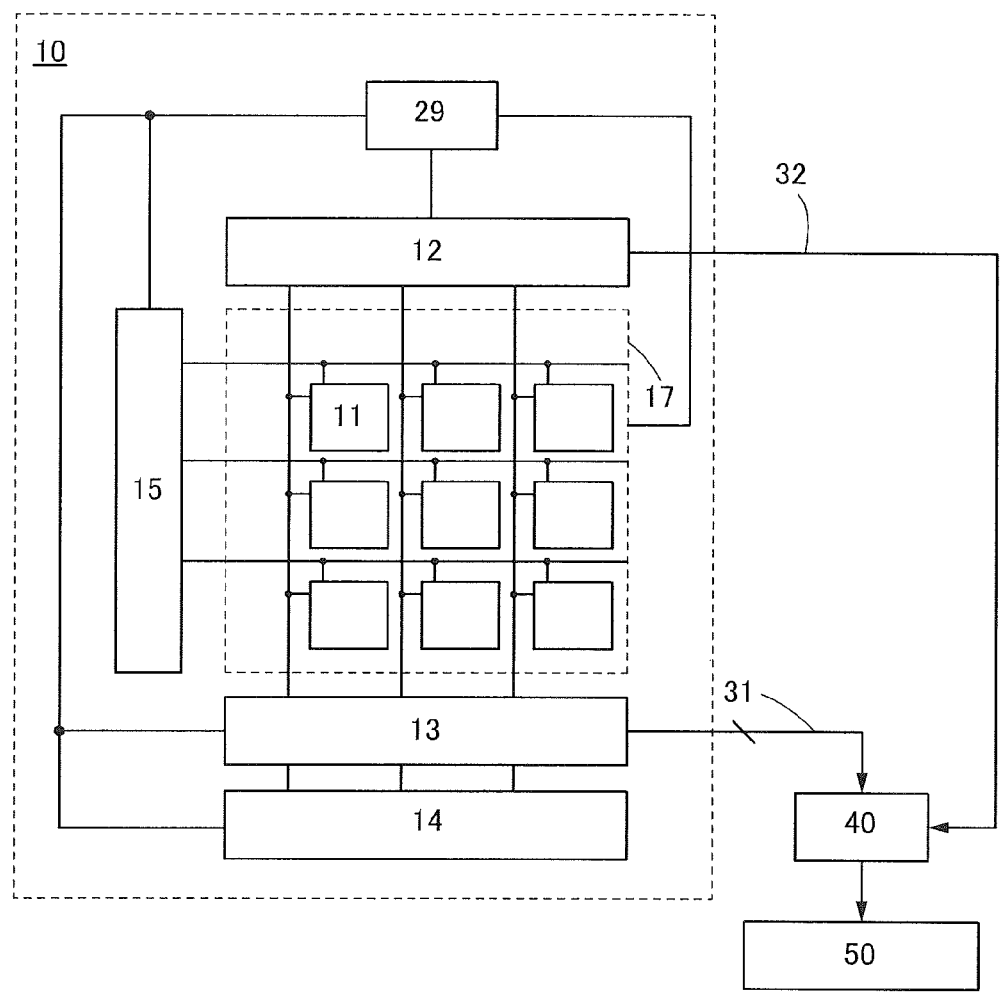
FIG. 14 is a block diagram of an imaging device.

FIG. 14 illustrates a modification example of FIG. 10. Instead of the circuit 34 and the circuit 35, a circuit 40 is provided. FIG. 14 also illustrates the display device 50 that has a function of displaying in the first display mode and the second display mode described in Embodiment 1. The imaging data 31 and the determination signal 32 are supplied to the circuit 40. The circuit 40 can be, for example, a field-programmable gate array/digital visual interface board (FPGA/DVI board).

The imaging data 31 supplied to the circuit 40 is subjected to data processing with the FPGA included in the circuit 40, converted to a DVI format through the DVI board included in the circuit 40, and transmitted to software.

Note that the software incorporates a watchdog timer. The watchdog timer is set to, for example, a time (retention time) during which the pixels 21 included in the display device 50 can retain image data in the second display mode.

Figure 15:
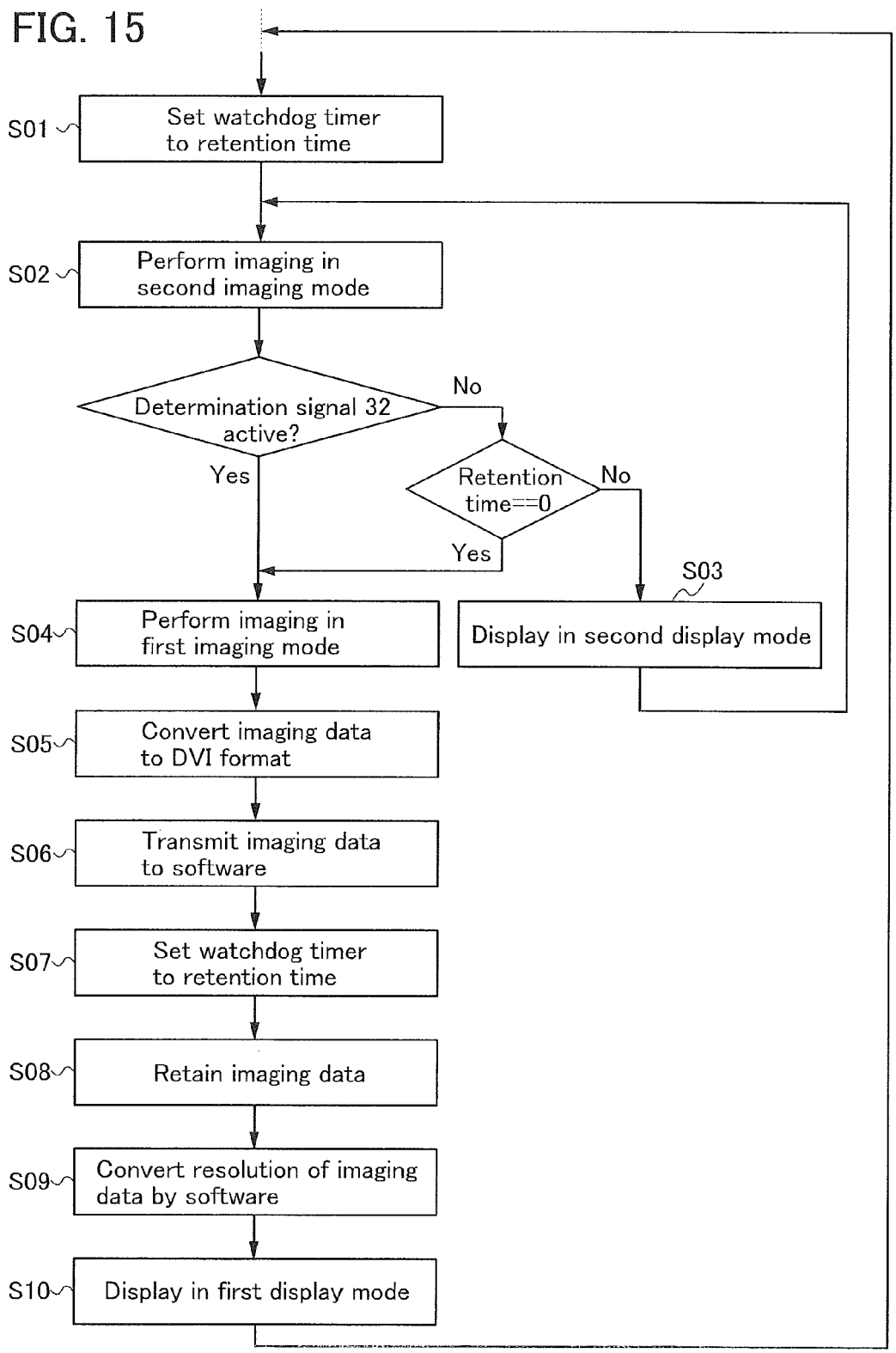
FIG. 15 is a flow chart illustrating the operation of an imaging device.

FIG. 15 is a flow chart illustrating the operation method of the circuit 40 illustrated in FIG. 14 and the software. First, the watchdog timer is set to the retention time (S01), and imaging in the second imaging mode is performed (S02). If the determination signal 32 generated in S02 is inactive, determination whether the retention time set on the watchdog timer is 0 or not is made. If the retention time is not 0, displaying in the second display mode is performed (S03), and then imaging in the second imaging mode is performed again in S02.

If the determination signal 32 is active or the retention time set on the watchdog timer is 0, the imaging data 31 is captured in the first imaging mode (S04) and then is transmitted to the circuit 40 and converted to a DVI format (S05). Next, the imaging data 31 converted to the DVI format is transmitted to the software (S06). After the retention time is set to the watchdog timer again (S07), the software retains the imaging data 31 (S08).

After that, the software converts the resolution of the imaging data 31 (S09), and the display device 50 performs displaying in the first display mode on the basis of the imaging data whose resolution is converted (S10). Then, the imaging device 10 performs imaging in the first imaging mode or in the second imaging mode. The above is an operation example of the circuit 40 and the software.

This embodiment can be implemented in appropriate combination with any of the structures described in the other embodiments.

Embodiment 3

In this embodiment, an example of the pixel 11 included in the imaging device 10 and operation examples of the pixel 11 will be described with reference to drawings.

Figure 16:
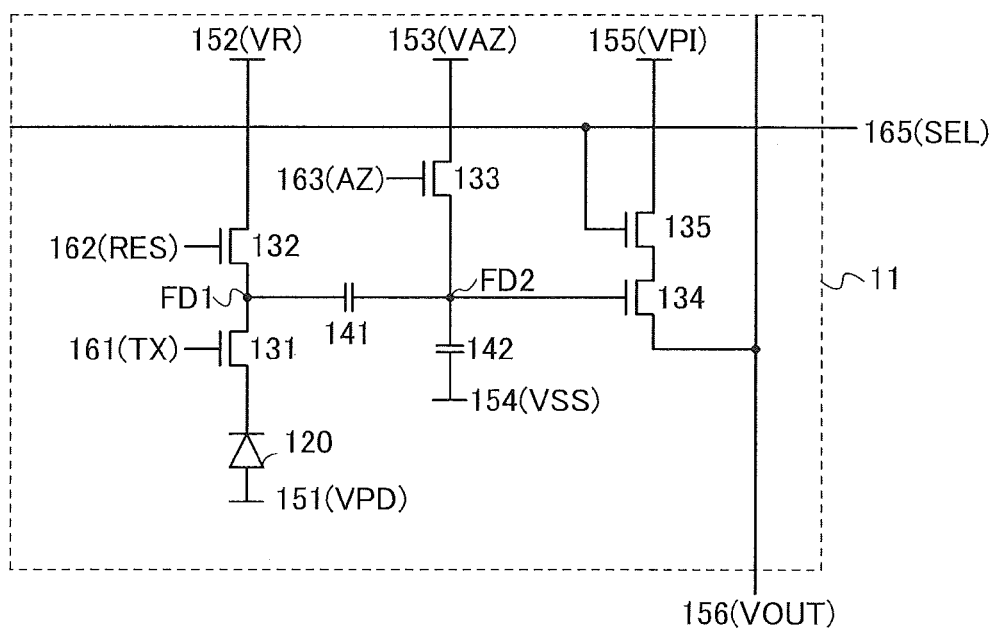
FIG. 16 illustrates a pixel circuit of an imaging device.

FIG. 16 is a circuit diagram of the pixel 11. The pixel 11 includes a photoelectric conversion element 120, a transistor 131, a transistor 132, a transistor 133, a transistor 134, a transistor 135, a capacitor 141, and a capacitor 142. In FIG. 16, the transistors 131 to 135 are all n-channel transistors.

In the pixel 11 in FIG. 16, one terminal of the photoelectric conversion element 120 is electrically connected to one of a source and a drain of the transistor 131. The other of the source and the drain of the transistor 131 is electrically connected to one of a source and a drain of the transistor 132 and one terminal of the capacitor 141. One of a source and a drain of the transistor 133 is electrically connected to the other terminal of the capacitor 141, one terminal of the capacitor 142, and a gate of the transistor 134. One of a source and a drain of the transistor 134 is electrically connected to one of a source and a drain of the transistor 135.

The other terminal of the photoelectric conversion element 120 is electrically connected to a wiring 151 (VPD). The other of the source and the drain of the transistor 132 is electrically connected to a wiring 152 (VR). The other of the source and the drain of the transistor 133 is electrically connected to a wiring 153 (VAZ). The other terminal of the capacitor 142 is electrically connected to a wiring 154 (VSS). The other terminal of the transistor 135 is electrically connected to a wiring 155 (VPI). The other of the source and the drain of the transistor 134 is electrically connected to a wiring 156 (VOUT).

A gate of the transistor 131 is electrically connected to a wiring 161 (TX). A gate of the transistor 132 is electrically connected to a wiring 162 (RES). A gate of the transistor 133 is electrically connected to the wiring 163 (AZ). A gate of the transistor 135 is electrically connected to a wiring 165 (SEL).

The wirings 151 (VPD), 152 (VR), 153 (VAZ), 154 (VSS), and 155 (VPI) can function as power lines. The wiring 156 (VOUT) can have a function of outputting imaging data captured by the pixel 11 as a signal. The wirings 161 (TX), 162 (RES), 163 (AZ), and 165 (SEL) can function as signal lines.

In the above configuration, a node to which the other of the source and the drain of the transistor 131, the one of the source and the drain of the transistor 132, and the one terminal of the capacitor 141 are connected is a node FD1. A node to which the one of the source and the drain of the transistor 133, the gate of the transistor 134, the other terminal of the capacitor 141, and the one terminal of the capacitor 142 are connected is a node FD2.

In the pixel 11, the photoelectric conversion element 120 is a light-receiving element that can have a function of generating current based on light incident on the pixel 11. The transistor 131 can have a function of controlling accumulation/release of charge from the photoelectric conversion element 120 into the node FD1. The transistor 132 can have a function of resetting the potential of the node FD1. The transistor 133 can have a function of resetting the potential of the node FD2. The transistor 134 can function as an amplifier transistor that outputs a signal based on the potential of the node FD2. The transistor 135 can function as a selection transistor that controls selection of the pixel 11 in reading.

Figure 17:
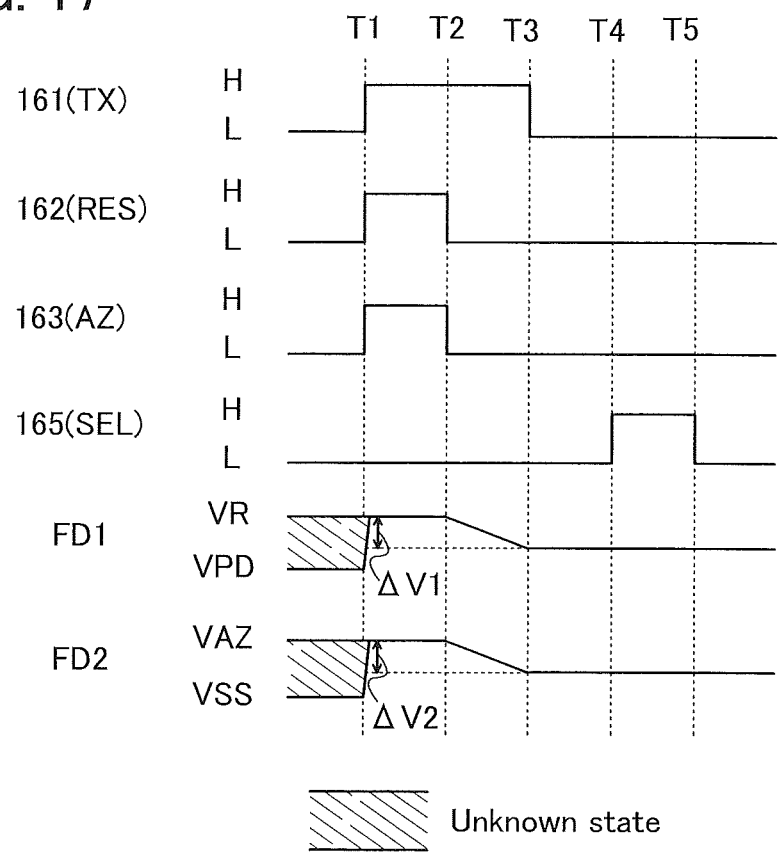
FIG. 17 is a timing chart illustrating imaging operation.

The operation of the pixel 11 in the first imaging mode is described in detail with reference to a timing chart illustrated in FIG. 17. The timing chart illustrated in FIG. 17 shows the potentials of the wirings 161 (TX), 162 (RES), 163 (AZ), and 165 (SEL) and the nodes FD1 and FD2. Note that each transistor is turned on/off when a potential for turning on/off the transistor is supplied to a wiring electrically connected to a gate of the transistor.

The wiring 151 (VPD) is set to "L," the wiring 152 (VR) is set to "H," the wiring 153 (VAZ) is set to "H," the wiring 154 (VSS) is set to "L," and the wiring 155 (VPI) is set to "H." Note that the wirings can be supplied with a different potential for operation.

The wiring 161 (TX), the wiring 162 (RES), and the wiring 163 (AZ) are set to "H" at Time T1, whereby the transistor 131, the transistor 132, and the transistor 133 are turned on. In addition, the wiring 165 (SEL) is set to "L," whereby the transistor 135 is turned off. Accordingly, the potential of the node FD1 is reset to a potential "VR" of the wiring 152 (VR), and the potential of the node FD2 is reset to a potential "VAZ" of the wiring 153 (VAZ).

The wiring 162 (RES) and the wiring 163 (AZ) are set to "L" at Time T2, whereby the transistor 132 and the transistor 133 are turned off. Accordingly, the potential of the node FD1 is decreased.

When a potential decrease at the node FD1 is represented by "$\Delta V1$," the potential of the node FD1 is "VR−$\Delta V1$." The potential of the node FD2 is also decreased because of capacitive coupling between the capacitor 141 (capacitance "C1") and the combined capacitance of the capacitor 142 (capacitance "C2") and the gate capacitance (capacitance "Cg") of the transistor 134. When a potential decrease at the node FD2 is represented by "$\Delta V2$," "$\Delta V2 = \Delta V1 \cdot C1/(C1+C2+Cg) = \Delta V1 \cdot \alpha$" is satisfied, and the potential of the node FD2 is "VAZ−$\Delta V2$." Note that a is "C1/(C1+C2+Cg)."

To make "$\Delta V1$" and "$\Delta V2$" equal as much as possible, the capacitance of the capacitor 141 is preferably larger than the sum of the capacitance of the capacitor 142 and the gate capacitance of the transistor 134.

The higher the illuminance of light irradiating the photoelectric conversion element 120 is, the larger the potential decrease at the node FD1 and the potential decrease at the node FD2 are.

The wiring 161 (TX) is set to "L" at Time T3, whereby the transistor 131 is turned off. Accordingly, the potentials of the nodes FD1 and FD2 are retained.

The wiring 165 (SEL) is set to "H" at Time T4, whereby the transistor 135 is turned on. Thus, a signal that corresponds to imaging data is outputted to the wiring 156 (VOUT) in accordance with the potential of the node FD2. Note that the lower the potential of the node FD2 is, the lower the potential of the signal outputted from the wiring 156 (VOUT) is. That is, the higher the illuminance of light irradiating the photoelectric conversion element 120 is, the lower the potential of the signal outputted from the wiring 156 (VOUT).

The wiring 165 (SEL) is set to "L" at Time T5, whereby the transistor 135 is turned off. The above is an operation example of the pixel 11 in the first imaging mode.

Figure 18:
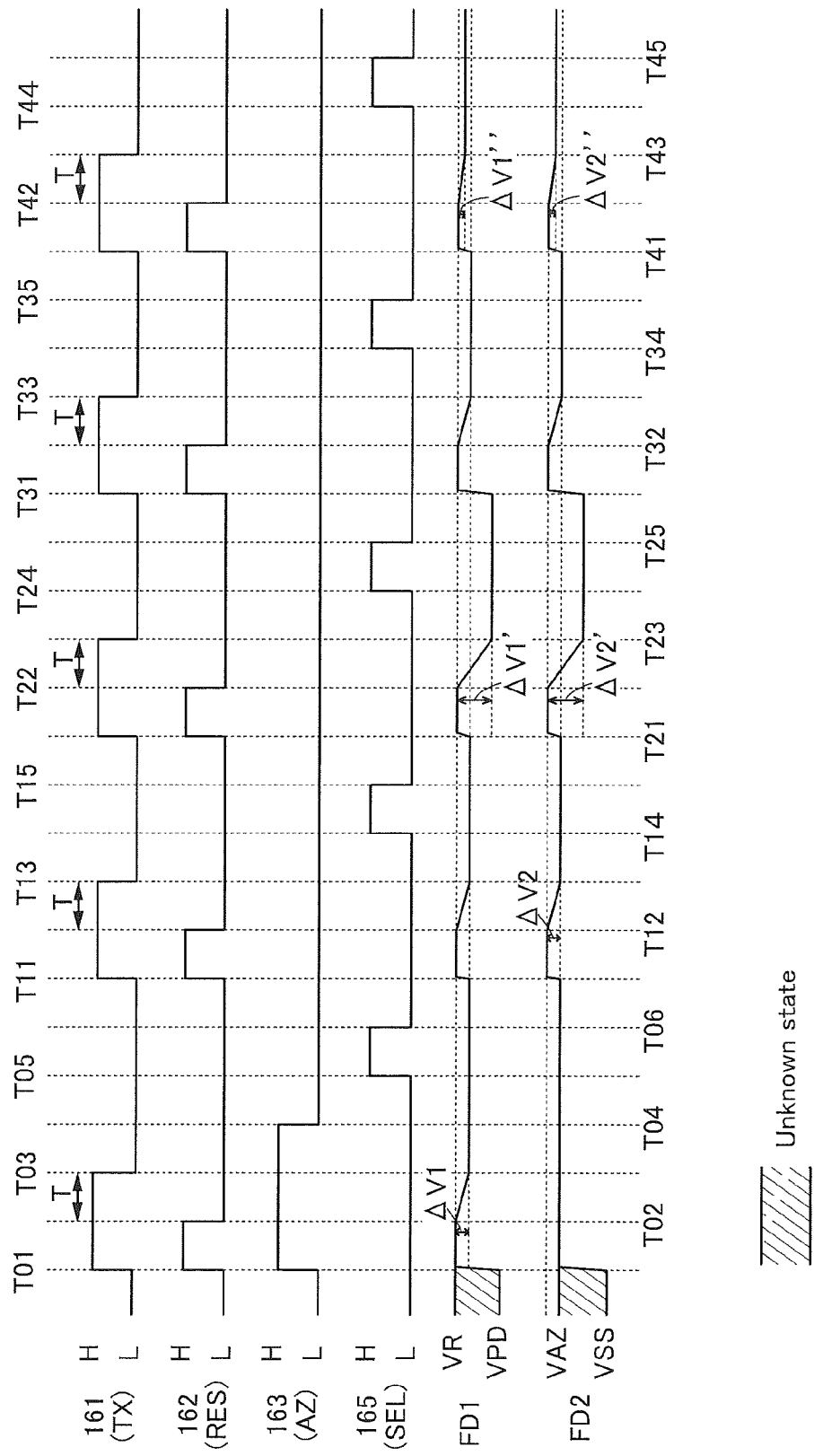
FIG. 18 is a timing chart illustrating imaging operation.

Next, an operation in the second imaging mode will be described with reference to FIG. 18.

A period between Time T01 and Time T06 corresponds to a period during which the imaging data of the reference frame is captured and outputted. The wiring 161 (TX), the wiring 162 (RES), and the wiring 163 (AZ) are set to "H" at Time T01, whereby the transistor 131, the transistor 132, and the transistor 133 are turned on. In addition, the wiring 165 (SEL) is set to "L," whereby the transistor 135 is turned off. Accordingly, the potential of the node FD1 is reset to a potential "VR" of the wiring 152 (VR), and the potential of the node FD2 is reset to a potential "VAZ" of the wiring 153 (VAZ).

The wiring 162 (RES) is set to "L" at Time T02, whereby the transistor 132 is turned off. Accordingly, the potential of the node FD1 is decreased. The wiring 161 (TX) is set to "L" at Time T03, whereby the transistor 131 is turned off. Accordingly, the potential of the node FD1 is retained. Note that the interval between Time T02 and Time T03 is represented by T.

When a potential decrease at the node FD1 from Time T02 to Time T03 is represented by "$\Delta V1$," the potential of the node FD1 is "VR−$\Delta V1$." The higher the illuminance of light irradiating the photoelectric conversion element 120 is, the larger the potential decrease at the node FD1. Note that the potential of the node FD2 does not change.

Then, the wiring 163 (AZ) is set to "L" at Time T04, whereby the transistor 133 is turned off. Accordingly, the imaging data of the reference frame is captured.

The wiring 165 (SEL) is set to "H" at Time T05, whereby the transistor 135 is turned on. Thus, a signal that corresponds to imaging data is outputted to the wiring 156 (VOUT) in accordance with the potential of the node FD2.

The wiring 165 (SEL) is set to "L" at Time T06, whereby the transistor 135 is turned off. The above is the capturing and outputting operations of image data of the reference frame.

A period between Time T11 and Time T15 corresponds to a period during which the imaging data of the difference detection frame is captured and outputted in order to capture differential data in the case where there is no difference between the imaging data of the reference frame and the imaging data of the difference detection frame. The case where there is no difference corresponds to the case where the illuminance of light irradiating the photoelectric conversion element 120 is the same in a period between Time T12 and Time T13 described later and in a period between Time T02 and Time T03.

The wiring 161 (TX) and the wiring 162 (RES) are set to "H" at Time T11, whereby the transistor 131 and the transistor 132 are turned on. Accordingly, the potential of the node FD1 changes from "VR−ΔV1" to "VR." In other words, the potential is increased by "ΔV1," which is the potential decrease from Time T02 to Time T03. The potential of the node FD2 is also increased. When the potential increase at the node FD2 is represented by "ΔV2," "ΔV2=ΔV1−α" is satisfied. The potential of the node FD2 changes from "VAZ" to "VAZ+ΔV2."

The wiring 162 (RES) is set to "L" at Time T12, whereby the transistor 132 is turned off. Accordingly, the potential of the node FD1 is decreased, and the potential of the node FD2 is also decreased.

The wiring 161 (TX) is set to "L" at Time T13, whereby the transistor 131 is turned off. Accordingly, the potentials of the nodes FD1 and FD2 are retained.

When the interval between Time T12 and Time T13 is assumed to be T, the potential decrease at the node FD1 is equal to the potential decrease "ΔV1" from Time T02 to Time T03 because the photoelectric conversion element 120 is irradiated with light with the same illuminance as that from Time T02 to Time T03. That is, the potential decrease at the node FD1 from Time T12 to Time T13 is equal to the potential increase at the node FD1 at Time T11. The potential decrease at the node FD2 is equal to the potential increase "ΔV2" at Time T11. Thus, the potential of the node FD2 becomes "VAZ," which is equal to the potential of the wiring 153 (VAZ).

The wiring 165 (SEL) is set to "H" at Time T14, whereby the transistor 135 is turned on. Thus, a signal that corresponds to imaging data is outputted to the wiring 156 (VOUT) in accordance with the potential of the node FD2. Note that the potential of the signal is equal to the potential of the signal outputted from Time T05 to Time T06.

The wiring 165 (SEL) is set to "L" at Time T15, whereby the transistor 135 is turned off. The above is the capturing and outputting operations of image data of the difference detection frame in the case where there is no difference between image data of the reference frame and that of the difference detection frame.

A period between Time T21 and Time T25 corresponds to a period during which the imaging data of the difference detection frame is captured and outputted in order to capture differential data in the case where there is a difference between the imaging data of the reference frame and the imaging data of the difference detection frame. The case where there is a difference corresponds to the case where light irradiating the photoelectric conversion element 120 has higher illuminance from Time T22 to Time T23 described later than from Time T12 to Time T13.

The operations of the transistors 131, 132, 133, and 135 from Time T21 to Time T25 are similar to those from Time T11 to Time T15.

The potential of the node FD1 at Time T21 is "VR." Accordingly, the potential is increased by "ΔV1," which is the potential decrease from Time T12 to Time T13. Meanwhile, the potential of the node FD2 is increased by "ΔV2," which is the potential decrease from Time T12 to Time T13. That is, the potential of the node FD2 becomes "VAZ+ΔV2."

At Time T22, the potentials of the nodes FD1 and FD2 are decreased.

The potentials of the nodes FD1 and FD2 are retained at Time T23. When the interval between Time T22 and Time T23 is assumed to be T, the potential decrease "ΔV1'" at the node FD1 from Time T22 to Time T23 is larger than the potential decrease "ΔV1" from Time T12 to Time T13 (ΔV1'>ΔV1) because the illuminance of light irradiating the photoelectric conversion element 120 is higher than the illuminance of light irradiating the photoelectric conversion element 120 from Time T12 to Time T13. Furthermore, the potential decrease "ΔV2'=ΔV1'·α" at the node FD2 is larger than the potential decrease "ΔV2" from Time T12 to Time T13 (ΔV2'>ΔV2). Thus, the potential "VAZ+ΔV2−ΔV2'" of the node FD2 is lower than the potential "VAZ" of the wiring 153 (VAZ).

At Time T24, a signal that corresponds to imaging data is outputted to the wiring 156 (VOUT) in accordance with the potential of the node FD2. Note that the higher the illuminance of light irradiating the photoelectric conversion element 120 from Time T22 to Time T23 is, the lower the potential of the signal outputted from the wiring 156 (VOUT) is, therefore making the potential of the output signal lower than the potential of an output signal from Time T14 to Time T15.

Similarly to the case from Time T11 to Time T15, a period between Time T31 and Time T35 corresponds to a period during which the imaging data of the difference detection frame is captured and outputted in order to capture differential data in the case where there is no difference between the imaging data of the reference frame and the imaging data of the difference detection frame.

The operations of the transistors 131, 132, 133, and 135 from Time T31 to Time T35 are similar to those from Time T11 to Time T15.

The potential of the node FD1 from Time T31 to Time T32 is "VR." Accordingly, the potential is increased by "ΔV1'," which is the potential decrease from Time T22 to Time T23. Meanwhile, the potential of the node FD2 is increased by "ΔV2'," which is the potential decrease from Time T22 to Time T23. That is, the potential of the node FD2 becomes "VAZ+ΔV2."

When the interval between Time T32 and Time T33 is assumed to be T, the potential decrease at the node FD1 is equal to the potential decrease "ΔV1" from Time T12 to Time T13 because the photoelectric conversion element 120 is irradiated with light with the same illuminance as that from Time T12 to Time T13. The potential decrease at the node FD2 is equal to the potential decrease "ΔV2" from Time T12 to Time T13. Thus, the potential of the node FD2 becomes "VAZ," which is equal to the potential of the wiring 153 (VAZ).

A period between Time T41 and Time T45 corresponds to a period during which the imaging data of the difference detection frame is captured and outputted in order to capture differential data in the case where there is a difference between the imaging data of the reference frame and the imaging data of the difference detection frame. The case where there is a difference corresponds to the case where light irradiating the photoelectric conversion element 120 has lower illuminance from Time T42 to Time T43 described later than from Time T32 to Time T33.

The operations of the transistors 131, 132, 133, and 135 from Time T41 to Time T45 are similar to those from Time T31 to Time T35.

The potential of the node FD1 at Time T41 is "VR." Accordingly, the potential is increased by "ΔV1," which is the potential decrease from Time T32 to Time T33. Meanwhile, the potential of the node FD2 is increased by "ΔV2," which is the potential decrease from Time T32 to Time T33. That is, the potential of the node FD2 becomes "VAZ+ΔV2."

At Time T42, the potentials of the nodes FD1 and FD2 are decreased.

The potentials of the nodes FD1 and FD2 are retained at Time T43. When the interval between Time T42 and Time T43 is assumed to be T, the potential decrease "ΔV1"" at the node FD1 from Time T42 to Time T43 is smaller than the potential decrease "ΔV1" from Time T32 to Time T33 (ΔV1"<ΔV1) because the illuminance of light irradiating the photoelectric conversion element 120 is lower than the illuminance of light irradiating the photoelectric conversion element 120 from Time T32 to Time T33. Furthermore, the potential decrease "ΔV2"=ΔV1"·α" at the node FD2 is smaller than the potential decrease "ΔV2" from Time T32 to Time T33 (ΔV2"<ΔV2). Thus, the potential "VAZ+ΔV2−ΔV2"" of the node FD2 is higher than the potential "VAZ" of the wiring 153 (VAZ).

At Time T44, a signal that corresponds to imaging data is outputted to the wiring 156 (VOUT) in accordance with the potential of the node FD2. Note that the lower the illuminance of light irradiating the photoelectric conversion element 120 from Time T42 to Time T43 is, the higher the potential of the signal outputted from the wiring 156 (VOUT) is, therefore making the potential of the output signal higher than the potential of an output signal from Time T34 to Time T35.

Described above is an operation example of the pixel 11 in the second imaging mode.

This embodiment can be implemented in appropriate combination with any of the structures described in the other embodiments.

Embodiment 4

In this embodiment, modification examples of the pixel 11 included in the imaging device 10 will be described with reference to drawings.

Figure 19:
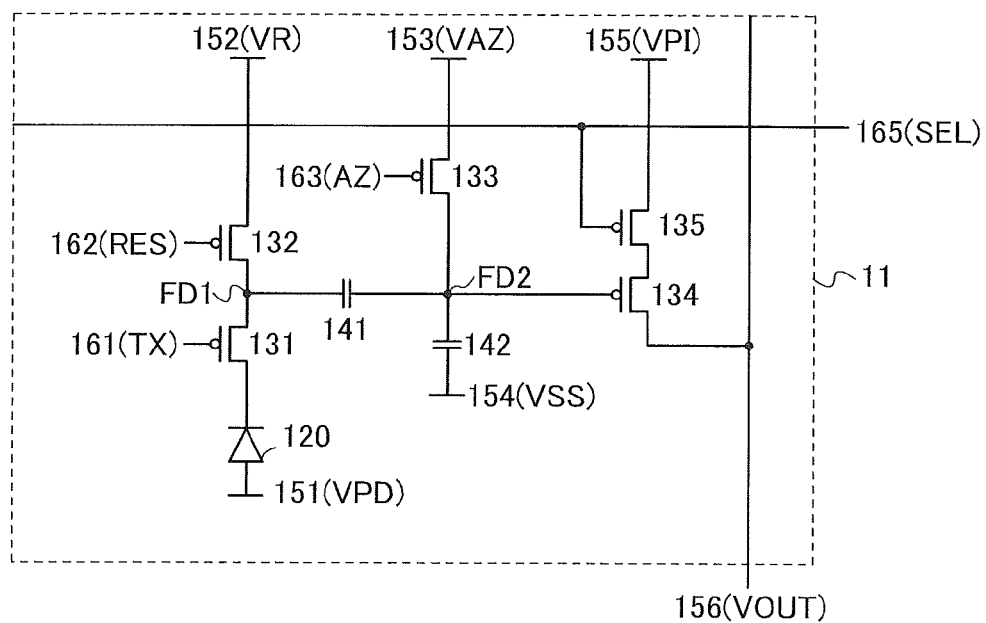
FIG. 19 illustrates a pixel circuit of an imaging device.

The pixel 11 included in the imaging device 10 of one embodiment of the present invention can have a configuration illustrated in FIG. 19 as well as the configuration FIG. 16. FIG. 19 is different from FIG. 16 in that the transistors 131 to 135 are all p-channel transistors. When the magnitude relationships of the potentials are reversed as appropriate, for example, FIG. 17 and FIG. 18 can be referred to for the operations in the first imaging mode and in the second imaging mode, respectively. Note that only some of the transistors 131 to 135 may be p-channel transistors. Alternatively, a CMOS transistor may be employed.

Figure 20:
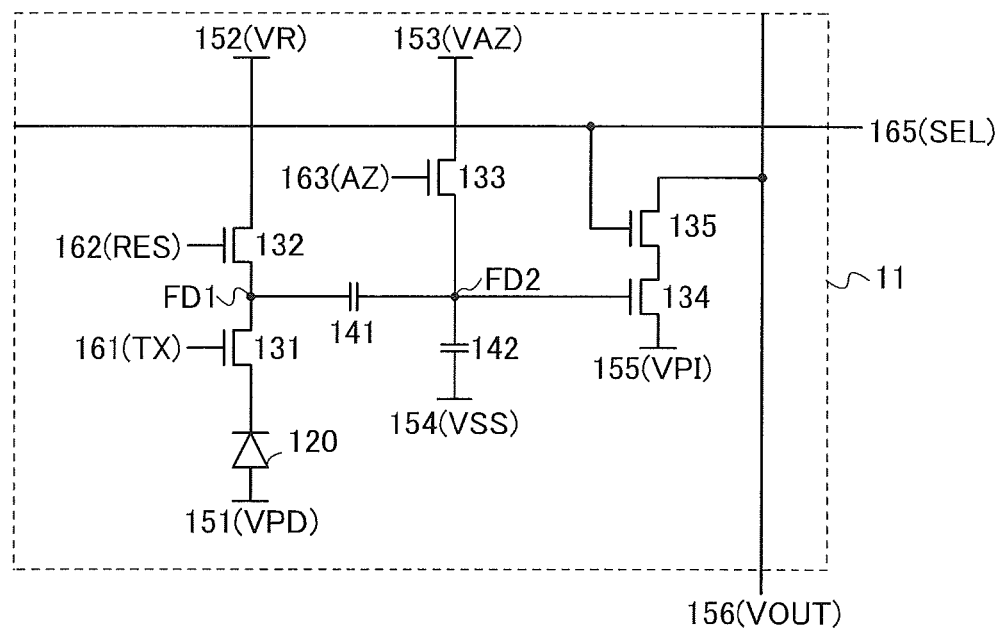
FIG. 20 illustrates a pixel circuit of an imaging device.

Although the transistor 135 is provided between the transistor 134 and the wiring 155 (VPI) in FIG. 16, the transistor 134 may be provided between the transistor 135 and the wiring 155 (VPI) as illustrated in FIG. 20.

Figure 21:
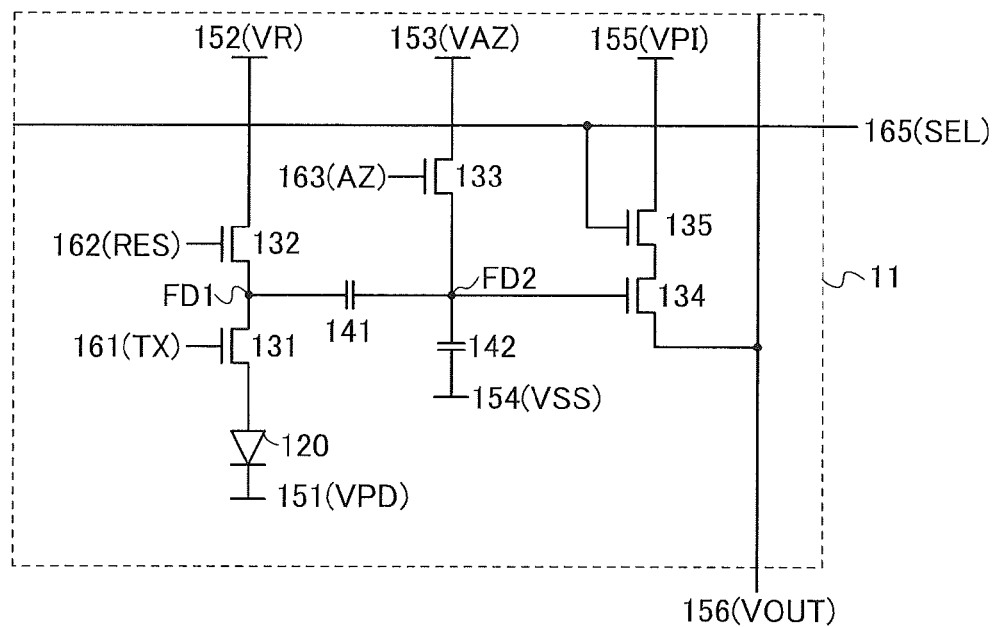
FIG. 21 illustrates a pixel circuit of an imaging device.

The pixel 11 included in the imaging device 10 of one embodiment of the present invention may have a configuration illustrated in FIG. 21. FIG. 21 illustrates a configuration in which the connection orientation of the photoelectric conversion element 120 in the pixel 11 is opposite to that in FIG. 16. In this case, the wiring 151 (VPD) is set to "H" and the wiring 152 (VR) is set to "L." FIG. 17 and FIG. 18 can be referred to for the operations in the first imaging mode and in the second imaging mode, respectively; in this case however, the higher the illuminance of light irradiating the photoelectric conversion element 120 is, the higher the potentials of the nodes FD1 and FD2 are. Thus, in the circuit configuration illustrated in FIG. 21, the higher the illuminance of light irradiating the photoelectric conversion element 120 is, the higher the potential of the output signal from the wiring 156 (VOUT) is.

Figure 22A:
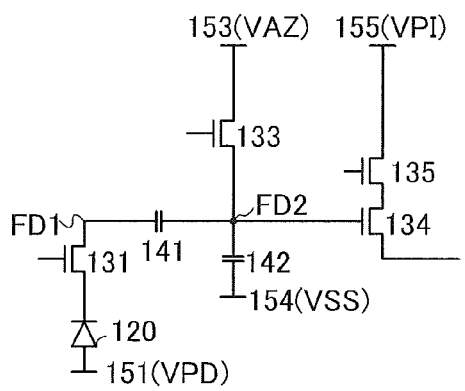
FIGS. 22A to 22C each illustrate a pixel circuit of an imaging device.

FIG. 22A illustrates a configuration in which the transistor 132 is excluded from the pixel 11 illustrated in FIG. 16. In this case, the wiring 151 (VPD) is configured to be able to switch between "L" and "H." The reset operation of the node FD1 can be performed when the wiring 151 (VPD) is set to "H." In a predetermined period, when the wiring 151 (VPD) is set to "H," a forward bias is applied to the photoelectric conversion element 120. Thus, the potential of the node FD1 can be set to the potential "VPD" of the wiring 151 (VPD).

To capture imaging data, the wiring 151 (VPD) is set to "L." When the wiring 151 (VPD) is set to "L," a reverse bias is applied to the photoelectric conversion element 120; thus, charge can be released from the node FD1 to the wiring 151 (VPD) in accordance with the illuminance of light. In that case, the higher the illuminance of light irradiating the photoelectric conversion element 120 is, the lower the potentials of the nodes FD1 and FD2 are. Thus, in the circuit configuration illustrated in FIG. 22A, the higher the illuminance of light irradiating the photoelectric conversion element 120 is, the lower the potential of the output signal from the wiring 156 (VOUT) is.

Figure 22B:
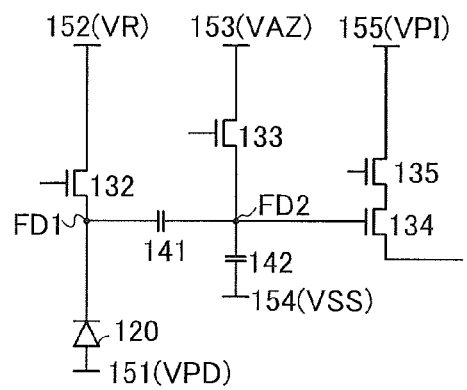
Figure 22C:
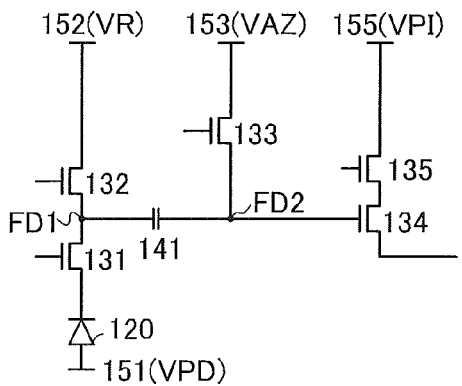

As another configuration of the pixel 11 included in the imaging device 10 of one embodiment of the present invention, the transistor 131 may be excluded as illustrated in FIG. 22B; alternatively, the capacitor 142 may be excluded as illustrated in FIG. 22C.

Note that some wirings are not illustrated in FIGS. 22A to 22C.

Figure 23A:
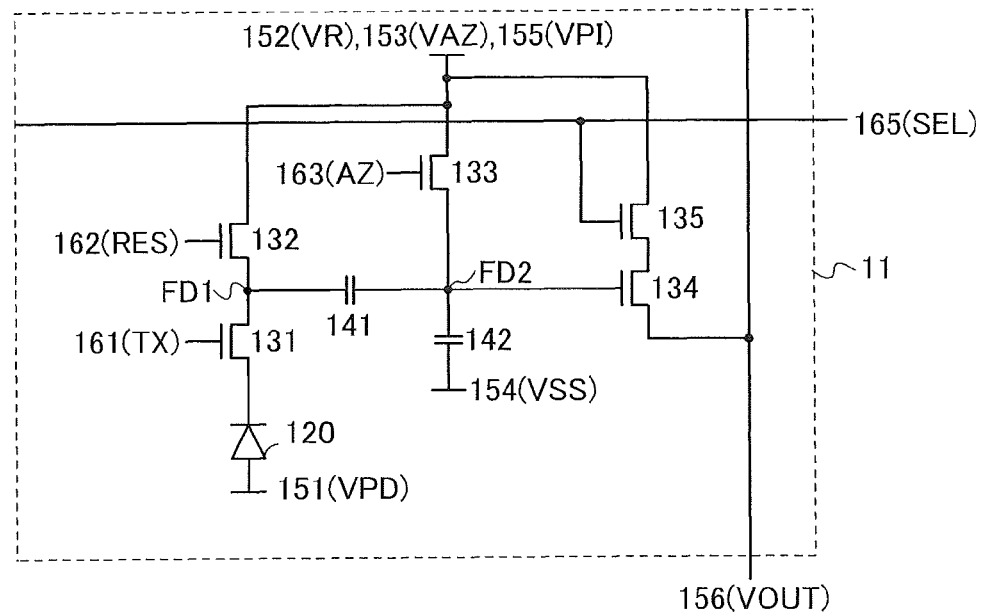
FIGS. 23A and 23B each illustrate a pixel circuit of an imaging device.
Figure 23B:
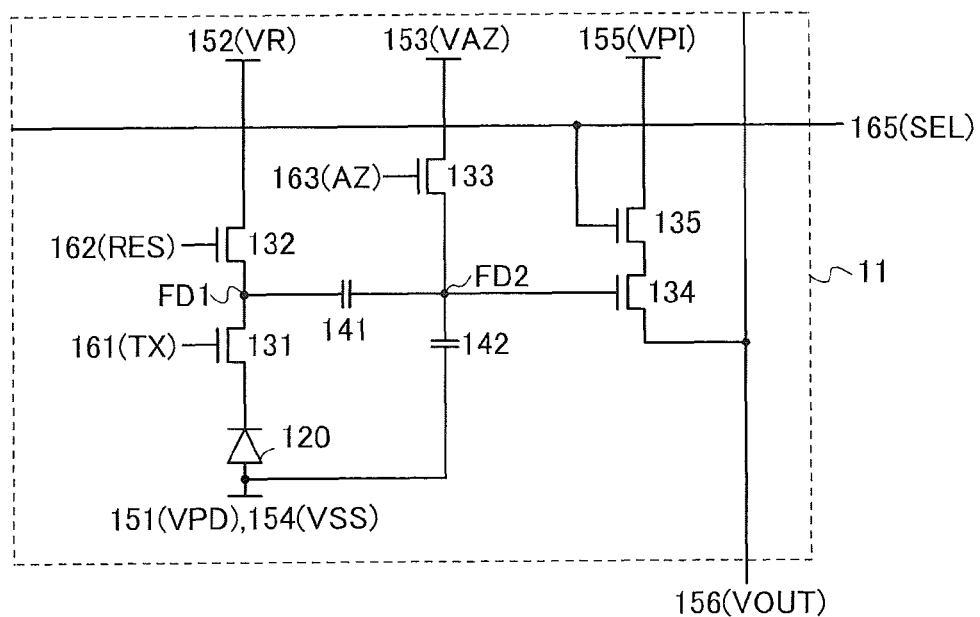

Although FIG. 16 illustrates wirings supplying the same potential as different wirings, one wiring may serve as those wirings. For example, as in the pixel 11 illustrated in FIG. 23A, the wiring 152 (VR), the wiring 153 (VAZ), and the wiring 155 (VPI) to which "H" is applied may be the same wiring. Alternatively, as in the pixel 11 illustrated in FIG. 23B, the wiring 151 (VPD) and the wiring 154 (VSS) to which "L" is applied may be the same wiring.

Figure 24A:
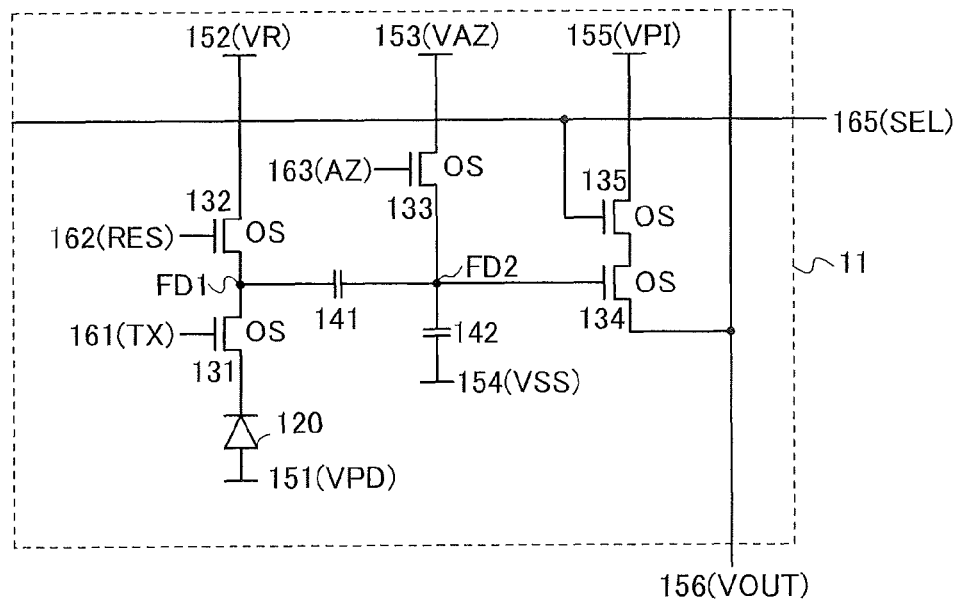
FIGS. 24A and 24B each illustrate a pixel circuit of an imaging device.

FIG. 24A is different from FIG. 16 in that the transistors 131 to 135 included in the pixel 11 are transistors (hereinafter referred to as OS transistors) whose active layers or active regions contain oxide semiconductors.

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage "$V_{th}$," and the off state of a p-channel transistor means that the gate-source voltage "$V_{gs}$" is higher than the threshold voltage "$V_{th}$." For example, the off-state current of an n-channel transistor sometimes refers to a drain current that flows when the gate-source voltage "$V_{gs}$" is lower than the threshold voltage "$V_{th}$."

The off-state current of a transistor depends on "$V_{gs}$" in some cases. Thus, "the off-state current of a transistor is lower than or equal to I" means "there is $V_{gs}$ with which the off-state current of a transistor becomes lower than or equal to I" in some cases. Furthermore, the off-state current of a transistor may refer to the off-state current in an off state at predetermined "$V_{gs}$," the off-state current in an off state at "$V_{gs}$" in a predetermined range, the off-state current in an off state at "$V_{gs}$" with which sufficiently reduced off-state current is obtained, or the like.

As an example, the assumption is made of an n-channel transistor where the threshold voltage "$V_{th}$" is 0.5 V and the drain current is $1\times10^{-9}$ A at "$V_{gs}$" of 0.5 V, $1\times10^{-13}$ A at "$V_{gs}$" of 0.1 V, $1\times10^{-19}$ A at "$V_{gs}$" of –0.5 V, and $1\times10^{-22}$ A at "$V_{gs}$" of –0.8 V. The drain current of the transistor is $1\times10^{-19}$ A or lower at "$V_{gs}$" of –0.5 V or at "$V_{gs}$" in the range of –0.8 V to –0.5 V; therefore, it can be said that the off-state current of the transistor is $1\times10^{-19}$ A or lower. Since there is "$V_{gs}$" at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). The description "an off-state current of a transistor is lower than or equal to I" may refer to a situation where there is "$V_{gs}$" at which the off-state current of a transistor is lower than or equal to I at room temperature, 60° C., 85° C., 95° C., 125° C., a temperature at which the reliability of a semiconductor device including the transistor is ensured, or a temperature at which the semiconductor device or the like including the transistor is used (e.g., temperature in the range of 5° C. to 35° C.).

The off-state current of a transistor depends on voltage "$V_{ds}$" between its drain and source in some cases. Unless otherwise specified, the off-state current in this specification may be an off-state current at "$V_{ds}$" of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at "$V_{ds}$" at which the reliability of a semiconductor device or the like including the transistor is ensured or "$V_{ds}$" used in the semiconductor device or the like. The state where the off-state current of a transistor is "I" or lower may indicate that the off-state current of the transistor at "$V_{ds}$" of 0.1 V, 0.8 V, 1 V, 1.2 V, 1.8 V, 2.5 V, 3 V, 3.3 V, 10 V, 12 V, 16 V, or 20 V, at "$V_{ds}$" at which the reliability of a semiconductor device or the like including the transistor is ensured, or at "$V_{ds}$" used in the semiconductor device or the like including the transistor is "I" or lower at a certain "$V_{gs}$."

In this specification, the term "leakage current" sometimes expresses the same meaning as off-state current.

In this specification, the off-state current sometimes refers to a current that flows between a source and a drain when a transistor is off, for example.

The use of the OS transistor in the pixel 11 can broaden the dynamic range of imaging. In the circuit configuration in FIG. 16, the potential of the node FD1 is decreased when light with high illuminance enters the photoelectric conversion element 120 and thus the potential of the node FD2 is also decreased. Since the OS transistor has extremely low off-state current, a current based on a gate potential can be accurately outputted even when the potential of the node FD2 (gate potential of the transistor 134) is extremely low. Accordingly, it is possible to widen the detection range of illuminance, i.e., the dynamic range.

A period during which charge can be held in the node FD1 and the node FD2 can be extremely long owing to the low off-state current of the transistor. Therefore, a global shutter system in which imaging data is captured in all the pixels at the same time can be used without complicated circuit configurations and operation methods.

Figure 25A:
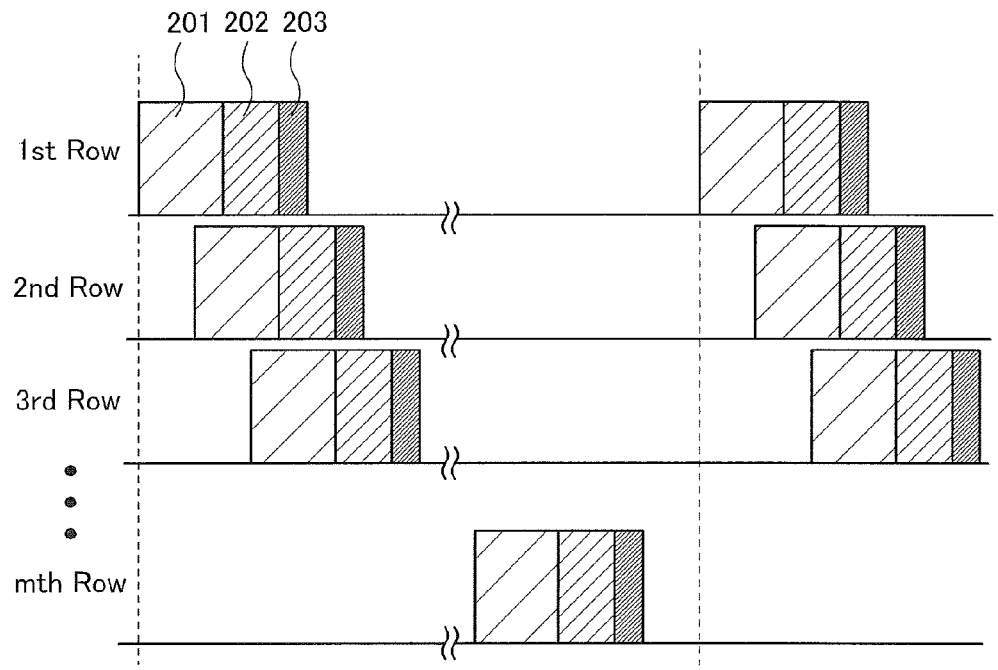
FIGS. 25A and 25B illustrate the operations of a global shutter system and a rolling shutter system.

In a general imaging device where pixels are arranged in a matrix, a rolling shutter system is employed in which an imaging operation 201, a data retention operation 202, and a read operation 203 are performed row by row as illustrated in FIG. 25A. In the case of employing the rolling shutter system, simultaneousness of imaging is lost. Therefore, when an object moves, an image is distorted.

Figure 25B:
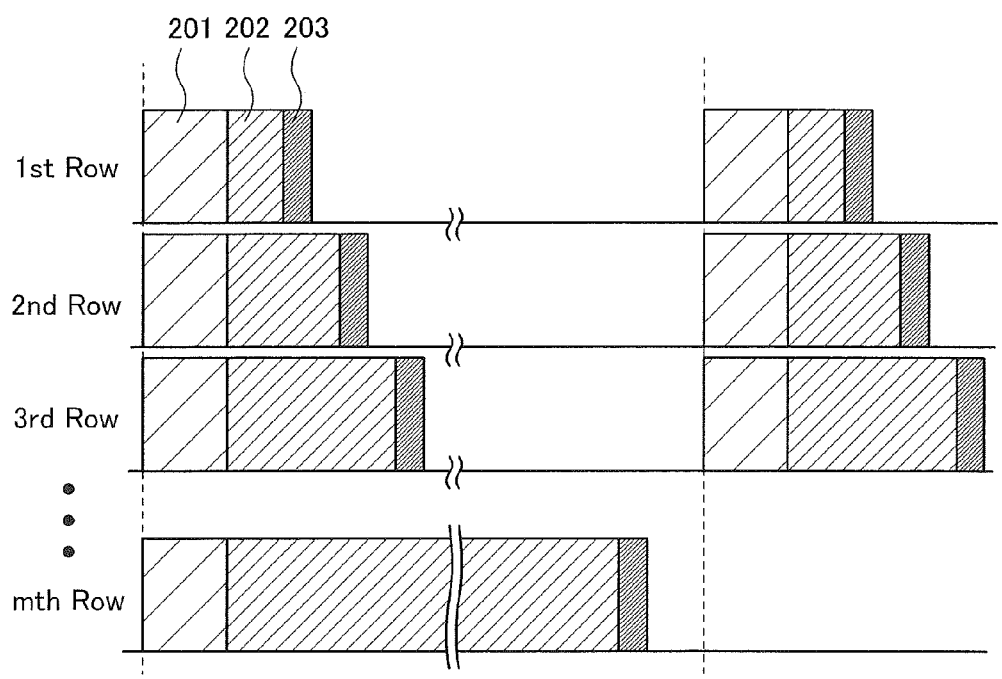

For this reason, in one embodiment of the present invention, it is preferable to employ a global shutter system in which the imaging operation 201 can be performed simultaneously in all the rows and the read operation 203 can be sequentially performed row by row as illustrated in FIG. 25B. By employing the global shutter system, simultaneousness of imaging in all the pixels in the imaging device can be ensured, and an image with little distortion can be easily obtained even when an object moves.

In addition, the OS transistor has lower temperature dependence of change in electrical characteristics than a transistor whose active layer or active region contains silicon (hereinafter, such a transistor is referred to as a Si transistor), and thus can be used in an extremely wide range of temperatures. Therefore, an imaging device and a semiconductor device that include OS transistors are suitable for use in automobiles, aircrafts, and spacecrafts.

A transistor connected to either the node FD1 or the node FD2 needs to be a transistor with low noise. The channel of a transistor including two or three oxide semiconductor layers to be described later is a buried channel, which has significantly high resistance to noise. Thus, the use of the transistor leads to an image with low noise.

With the configuration illustrated in FIG. 24A, the pixel can be composed of OS transistors and a photoelectric conversion element formed using silicon. Such a configuration facilitates an increase in the effective area of the photoelectric conversion element because a Si transistor need not be formed in the pixel. Thus, the imaging sensitivity can be improved Not only the pixel 11 but also peripheral circuits such as the circuit 12, the circuit 13, the circuit 14, the circuit 15, and the circuit 16 may include OS transistors. A configuration in which the peripheral circuits are composed only of OS transistors requires no process of forming a Si transistor, and thus is effective in reducing cost of the imaging device. A configuration in which the peripheral circuits are composed only of OS transistors and p-channel Si transistors requires no process of forming an n-channel Si transistor, and thus is effective in reducing cost of the imaging device. Moreover, the peripheral circuits can be CMOS circuits, resulting in lower power consumption of the peripheral circuits, that is, lower power consumption of the imaging device.

Figure 24B:
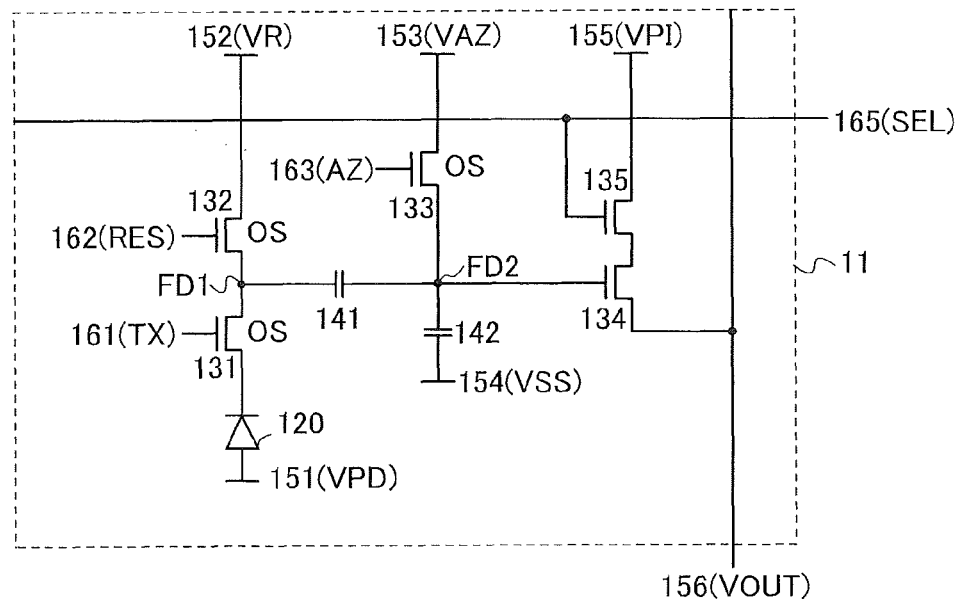

FIG. 24B illustrates a modification example of the circuit diagram of the pixel 11 illustrated in FIG. 24A. In the pixel 11 illustrated in FIG. 24B, the transistor 134 and the transistor 135 are Si transistors.

The Si transistor has a characteristic of excellent field-effect mobility as compared to the OS transistor. Thus, the amount of current flowing in a transistor functioning as an amplifier transistor or a selection transistor can be increased. For example, in FIG. 24B, the amount of current flowing in the transistors 134 and 135 can be increased depending on charge accumulated in the node FD2.

In the circuit diagrams illustrated in FIGS. 24A and 24B, "OS" is written beside a circuit symbol of an OS transistor for clarification.

Figure 26A:
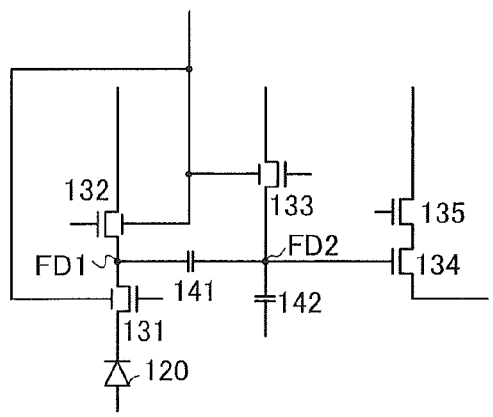
FIGS. 26A to 26F each illustrate a pixel circuit of an imaging device.
Figure 26B:
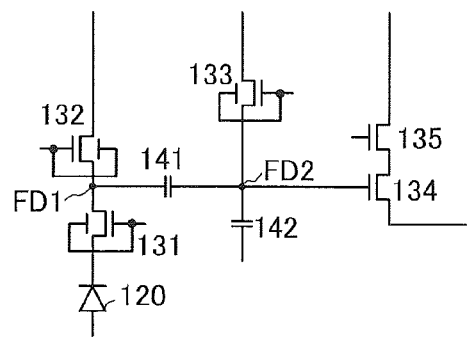
Figure 26C:
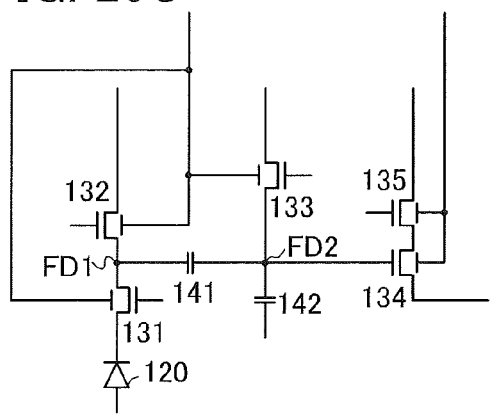
Figure 26D:
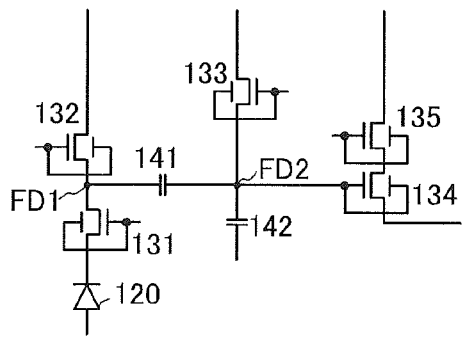

The transistors 131, 132, and 133 in the pixels 11 may each include a back gate as illustrated in FIGS. 26A and 26B. FIG. 26A illustrates a configuration in which a constant potential is applied to the back gates, which enables control of the threshold voltages. FIG. 26B illustrates a configuration in which the same potential is applied to the back gates and front gates, which enables an increase in on-state current. The transistors 131 to 135 may each have a back gate as illustrated in FIGS. 26C and 26D.

Figure 26E:
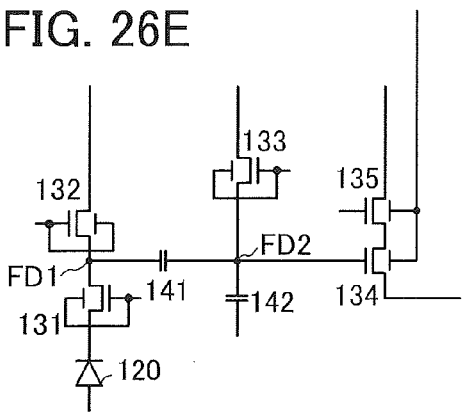
Figure 26F:
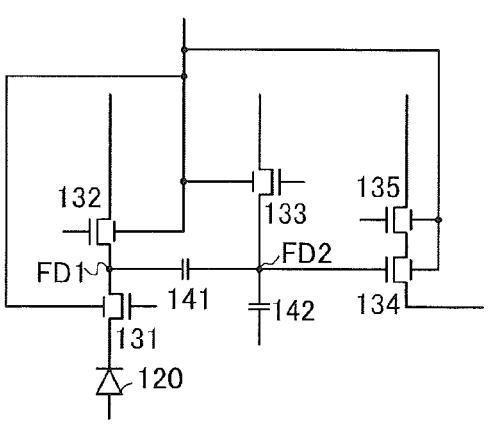

Moreover, as illustrated in FIG. 26E, a configuration in which the same potential is applied to a front gate and a back gate and a configuration in which a constant potential is applied to a back gate may be arbitrarily combined as necessary for the transistors in one pixel. Furthermore, a circuit configuration in which a back gate is not provided may be arbitrarily combined with any of the above configurations. As the configuration in which a constant potential is applied to a back gate, for example, a configuration in which the same potential is applied to all the back gates can be employed as illustrated in FIG. 26F, for example.

Note that some wirings are not illustrated in FIGS. 26A to 26F.

Since an OS transistor has lower on-state current than a Si transistor, it is particularly preferable that the OS transistor have a back gate. For example, in the case where the transistors 131 to 135 are OS transistors as illustrated in FIG. 24A, the transistors 131 to 135 preferably have back gates. In the case where the transistors 131 to 133 are OS transistors as illustrated in FIG. 24B, for example, the transistors 131 to 133 preferably have back gates.

Figure 27:
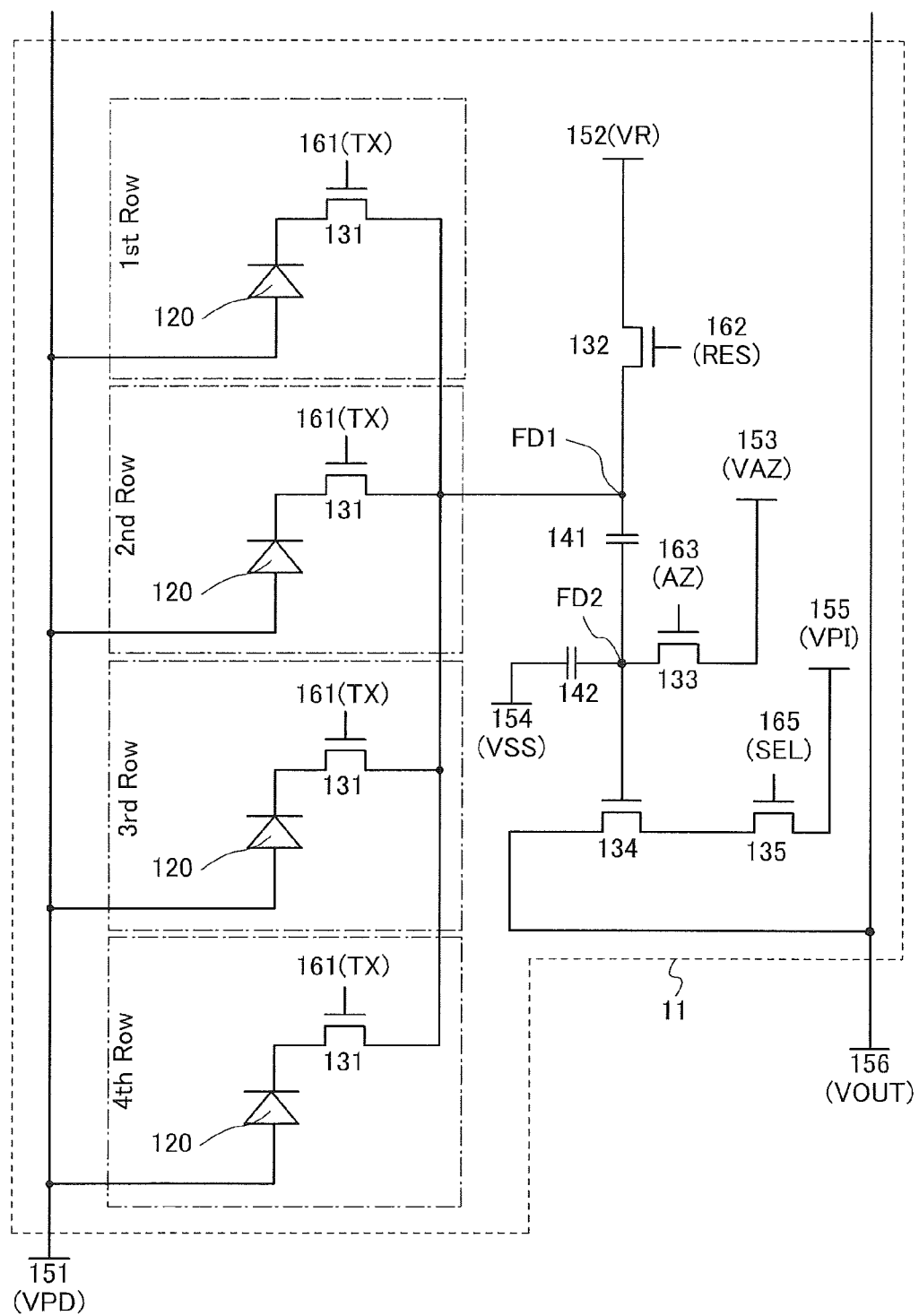
FIG. 27 illustrates a pixel circuit of an imaging device.

The pixel 11 may have a configuration in which the transistors 132 to 135 are shared among a plurality of pixels as illustrated in FIG. 27. FIG. 27 illustrates a configuration in which the transistors 132 to 135 are shared among a plurality of pixels in a perpendicular direction. Note that the transistors 132 to 135 may be shared among a plurality of pixels in a horizontal direction or among a plurality of pixels in horizontal and perpendicular directions. Such a configuration can reduce the number of transistors included in one pixel.

Although FIG. 27 illustrates a configuration in which the transistors 132 to 135 are shared among four pixels, the transistors 132 to 135 may be shared among two pixels, three pixels, or five or more pixels.

Such a configuration can provide an imaging device that includes a highly integrated pixel array. Furthermore, such a configuration can provide an imaging device capable of obtaining high-quality imaging data.

Note that the configurations illustrated in FIG. 16, FIG. 19, FIG. 20, FIG. 21, FIGS. 22A to 22C, FIGS. 23A and 23B, FIGS. 24A and 24B, FIGS. 26A to 26F, and FIG. 27 can be combined with each other arbitrarily.

This embodiment can be implemented in appropriate combination with any of the structures described in the other embodiments.

Embodiment 5

In this embodiment, specific structure examples of the imaging device of one embodiment of the present invention will be described below with reference to drawings.

Figure 28A:
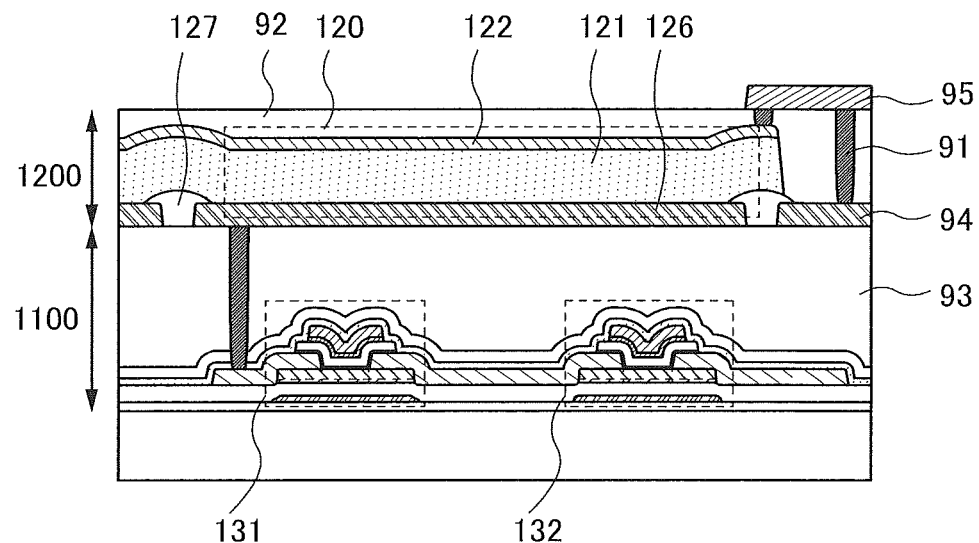
FIGS. 28A to 28C are cross-sectional views each illustrating a structure of an imaging device.

FIG. 28A illustrates an example of a cross-sectional view of the imaging device of one embodiment of the present invention and illustrates a specific connection between the photoelectric conversion element 120, the transistor 131, and the transistor 132 which are included in each of the pixels 11 in FIG. 1. Note that the transistors 133 to 135 are not illustrated in FIG. 28A. The imaging device includes a tier 1100 including the transistors 131 to 135 and a tier 1200 including the photoelectric conversion element 120.

Although the wirings, electrodes, and conductors are illustrated as independent components in cross-sectional views in this embodiment, some of them are provided as one component in some cases when they are electrically connected to each other. In addition, a structure in which a gate, a source, or a drain of the transistor is connected to the wirings through a conductor is only an example. The gate, the source, and the drain of the transistor might each function as a wiring.

Over the components, an insulating layer 92, an insulating layer 93, and the like that can function as protective films, interlayer insulating layers, or planarization films are provided. For example, an inorganic insulating film such as a silicon oxide film or a silicon oxynitride film can be used as each of the insulating layers 92 and 93 and the like. Alternatively, an organic insulating film such as an acrylic resin film or a polyimide resin film may be used. Top surfaces of the insulating layers 92 and 93 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In some cases, a layer that is not illustrated in the drawing is included in the stacked-layer structure. One or more of the layers illustrated in the drawing are not included in some cases.

Figure 28B:
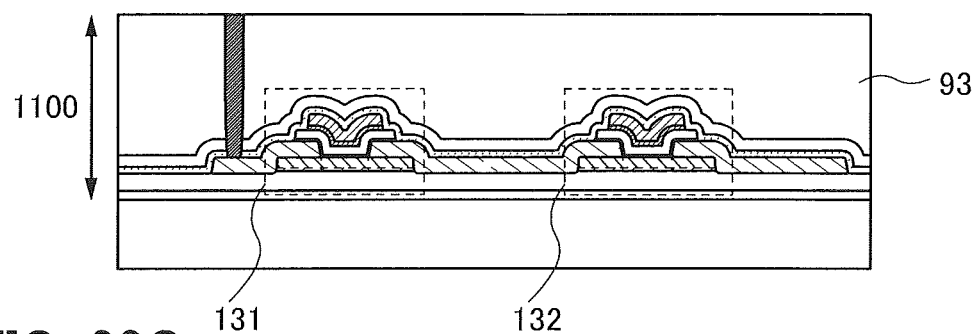
Figure 28C:
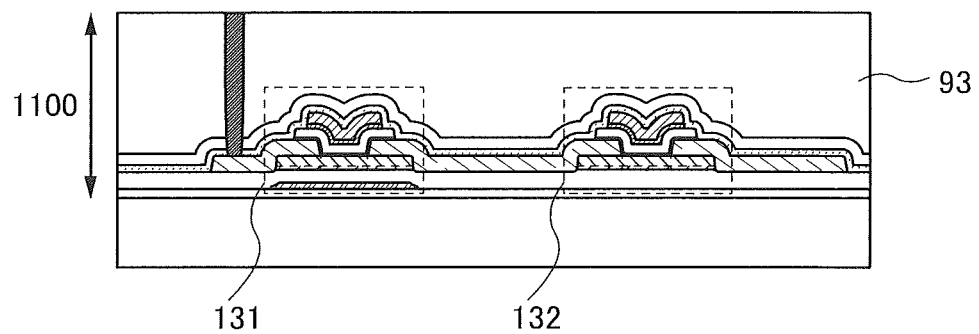

Note that although each transistor includes a back gate in FIG. 28A, each transistor does not necessarily include a back gate as illustrated in FIG. 28B. Alternatively, one or more transistors, for example, only the transistor 131, as illustrated in FIG. 28C, may include a back gate. The back gate might be electrically connected to a front gate of the transistor, which faces the back gate. Note that different fixed potentials might be supplied to the back gate and the front gate. The presence or absence of the back gate can also be applied to another imaging device described in this embodiment.

Any of a variety of elements can be used as the photoelectric conversion element 120 provided in the tier 1200. FIG. 28A illustrates the photoelectric conversion element 120 containing a selenium-based material in a photoelectric conversion layer 121. The photoelectric conversion element 120 containing a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 121 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

The photoelectric conversion layer 121 may be a layer containing a compound of copper, indium, and selenium (CIS). Alternatively, a layer containing a compound of copper, indium, gallium, and selenium (CIGS) may be used. With the CIS or CIGS, a photoelectric conversion element that can utilize an avalanche phenomenon as in the case of using a single layer of selenium can be formed.

In the photoelectric conversion element 120 containing the selenium-based material, for example, the photoelectric conversion layer 121 can be provided between a light-transmitting conductive layer 122 and an electrode 126 formed using a metal material or the like. Since CIS and CIGS are p-type semiconductors, an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, the combination of the OS transistor having high drain breakdown voltage and the photoelectric conversion element containing the selenium-based material in the photoelectric conversion layer can provide a highly sensitive and highly reliable imaging device.

Figure 29A:
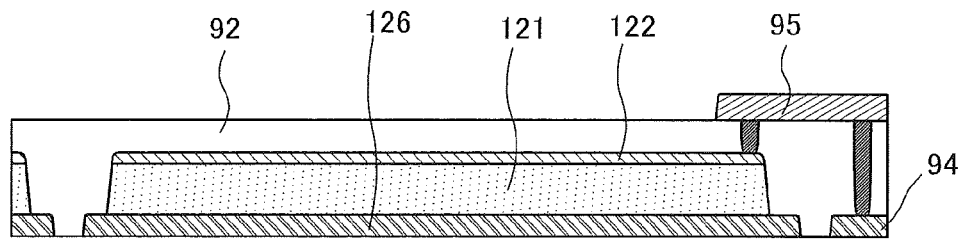
FIGS. 29A to 29D are cross-sectional views each illustrating a structure of an imaging device.
Figure 29B:
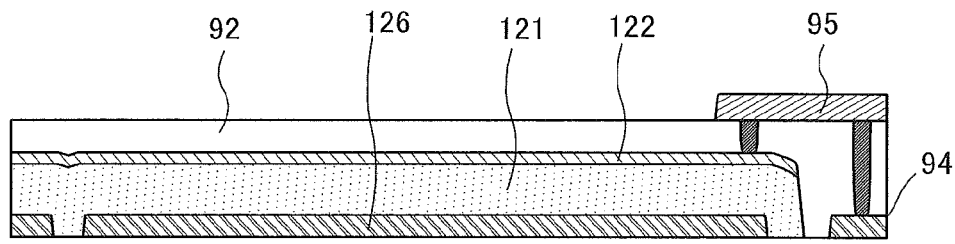
Figure 29C:
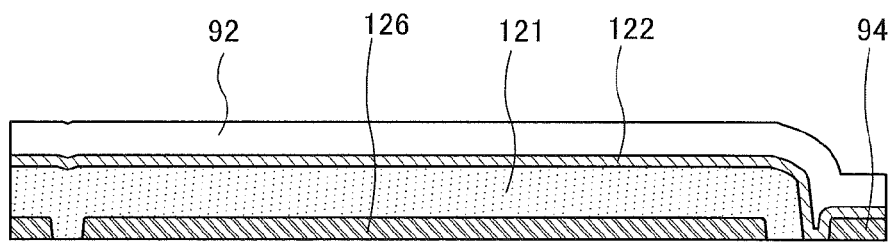
Figure 29D:
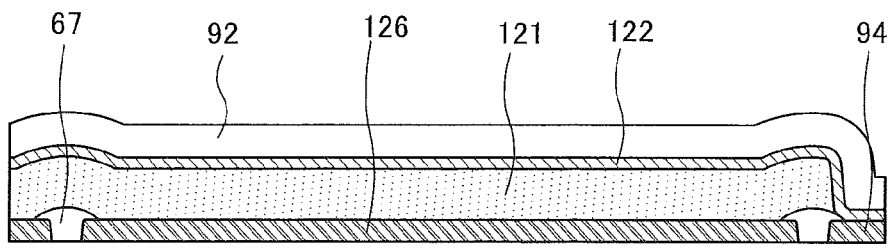

Although the photoelectric conversion layer 121 and the light-transmitting conductive layer 122 are not divided between pixels in FIG. 28A, they may be divided between circuits as illustrated in FIG. 29A. In a region between pixels where the electrode 126 is not provided, a partition wall 127 formed of an insulator is preferably provided, thereby preventing generation of a crack in the photoelectric conversion layer 121 and the light-transmitting conductive layer 122. However, the partition wall 127 is not necessarily provided as illustrated in FIG. 29B. Although the light-transmitting conductive layer 122 and a wiring 94 are connected to each other through a wiring 95 and a conductor 91 in FIG. 28A, the light-transmitting conductive layer 122 and the wiring 94 may be in direct contact with each other as in FIGS. 29C and 29D.

Figure 30A:
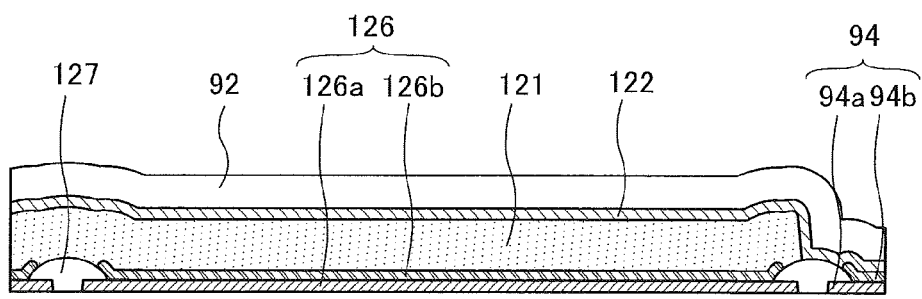
FIGS. 30A and 30B are cross-sectional views each illustrating a structure of an imaging device.

The electrode 126, the wiring 94, and the like may each be a multilayer. For example, as illustrated in FIG. 30A, the electrode 126 can include two conductive layers 126a and 126b and the wiring 94 can include two conductive layers 94a and 94b. In the structure in FIG. 30A, for example, the conductive layers 126a and 94a may be made of a low-resistance metal or the like, and the conductive layer 126b may be made of a metal or the like that exhibits an excellent contact property with the photoelectric conversion layer 121. Such a structure can improve the electrical characteristics of the photoelectric conversion element. Furthermore, even when the conductive layer 94a contains a metal that causes electrolytic corrosion by being in contact with the light-transmitting conductive layer 122, the electrolytic corrosion can be prevented because the conductive layer 94b is between the conductive layer 94a and the light-transmitting conductive layer 122.

The conductive layers 126a and 94a can be formed using, for example, aluminum, titanium, or a stack of titanium, aluminum, and titanium that are layered in this order. The conductive layers 126b and 94b can be formed using, for example, molybdenum, tungsten, or the like.

Figure 30B:
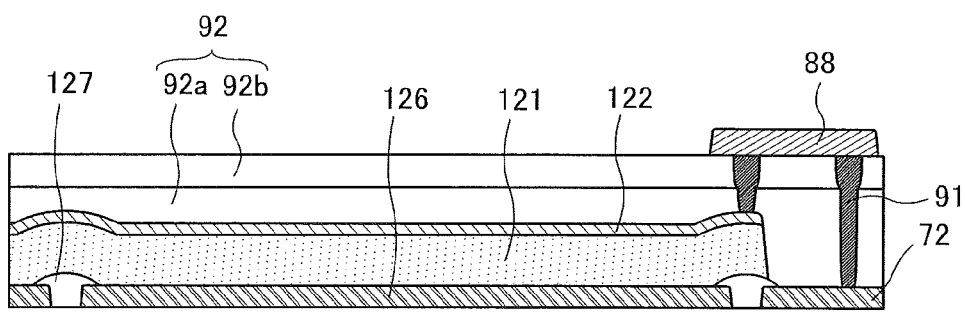

The insulating layer 92 and the like may each be a multilayer. In the case where the insulating layer 92 includes insulating layers 92a and 92b that have different etching rates as illustrated in FIG. 30B, for example, the conductor 91 has a difference in level. In the case where another insulating layer used as an interlayer insulating layer or a planarization film is a multilayer, the conductor 91 also has a difference in level. Although the insulating layer 92 is formed using two layers here, the insulating layer 92 and another insulating layer may each be formed using three or more layers.

Note that the partition wall 127 can be formed using an inorganic insulator, an insulating organic resin, or the like. The partition wall 127 may be colored black or the like in order to shield the transistors and the like from light and/or to determine the area of a light-receiving portion in each pixel.

As the photoelectric conversion element 120, a PIN diode element formed using an amorphous silicon film, a microcrystalline silicon film, or the like may be used.

Figure 31:
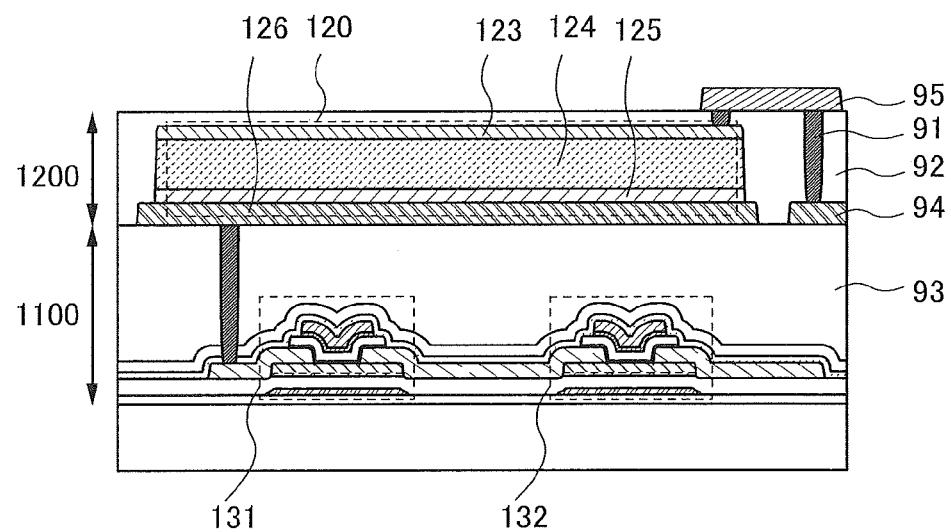
FIG. 31 is a cross-sectional view illustrating a structure of an imaging device.

FIG. 31 illustrates an example in which a thin film PIN photodiode is used as the photoelectric conversion element 120. In the photodiode, a p-type semiconductor layer 125, an i-type semiconductor layer 124, and an n-type semiconductor layer 123 are stacked in this order. The i-type semiconductor layer 124 is preferably formed using amorphous silicon. The n-type semiconductor layer 123 and the p-type semiconductor layer 125 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

In the photoelectric conversion element 120 illustrated in FIG. 31, the p-type semiconductor layer 125 is electrically connected to the electrode 126. Furthermore, the n-type semiconductor layer 123 is electrically connected to the wiring 94 through the conductor 91.

FIGS. 32A to 32F show other examples of the structure of the photoelectric conversion element 120 having a configuration of a PIN thin film photodiode and the connection between the photoelectric conversion element 120 and the wirings. Note that the structure of the photoelectric conversion element 120 and the connection between the photoelectric conversion element 120 and the wirings are not limited thereto, and other configurations may be applied.

Figure 32A:
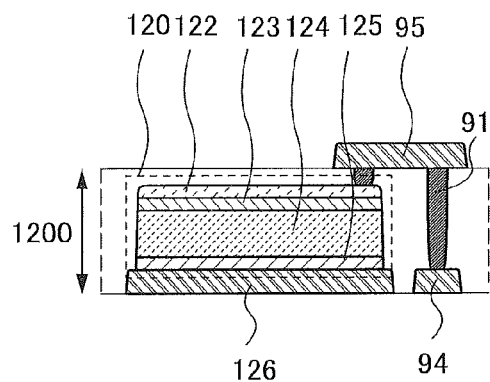
FIGS. 32A to 32F are cross-sectional views each illustrating a structure of an imaging device.

FIG. 32A illustrates a structure of the photoelectric conversion element 120 that includes the light-transmitting conductive layer 122 in contact with the n-type semiconductor layer 123. The light-transmitting conductive layer 122 serves as an electrode and can increase the output current of the photoelectric conversion element 120.

For the light-transmitting conductive layer 122, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 122 is not limited to a single layer, and may be a stacked layer of different films.

Figure 32B:
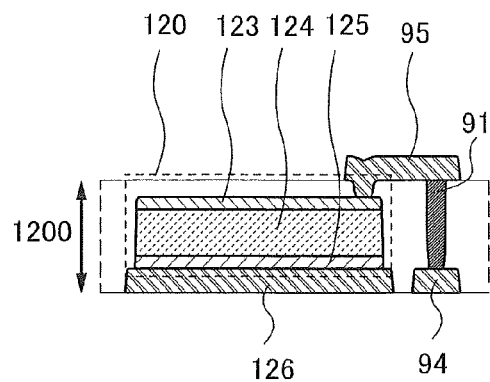

FIG. 32B illustrates a structure in which the n-type semiconductor layer 123 of the photoelectric conversion element 120 is directly connected to the wiring 95.

Figure 32C:
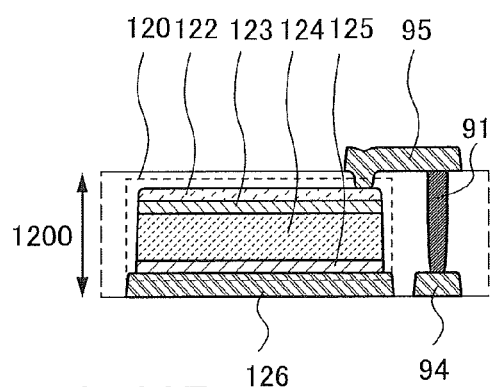

FIG. 32C illustrates a structure of the photoelectric conversion element 120 in which the light-transmitting conductive layer 122 is in contact with the n-type semiconductor layer 123 and the wiring 95 is electrically connected to the light-transmitting conductive layer 122.

Figure 32D:
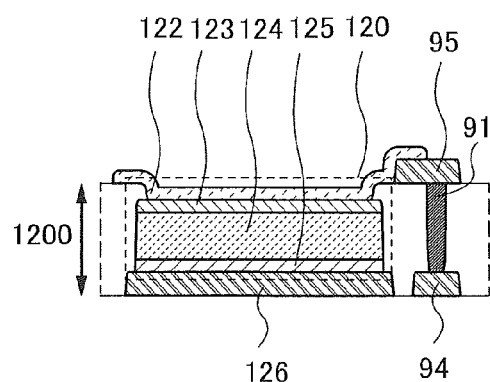

FIG. 32D illustrates a structure in which an opening exposing the n-type semiconductor layer 123 is provided in an insulating layer covering the photoelectric conversion element 120, and the light-transmitting conductive layer 122 that covers the opening is electrically connected to the wiring 95.

Figure 32E:
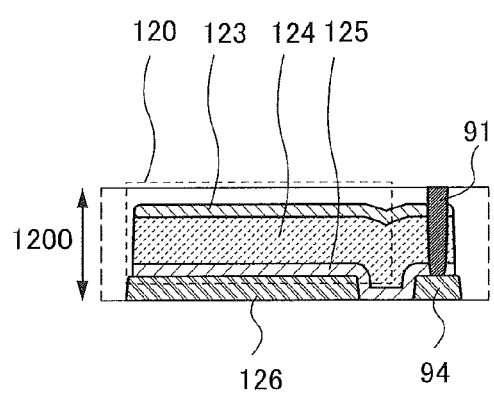

FIG. 32E illustrates a structure including the conductor 91 which penetrates the photoelectric conversion element 120. In the structure, the wiring 94 is electrically connected to the n-type semiconductor layer 123 through the conductor 91. Note that in the drawing, the wiring 94 appears to be electrically connected to the electrode 126 through the p-type semiconductor layer 125. However, because of a high electric resistance in the lateral direction of the p-type semiconductor layer 125, the resistance between the wiring 94 and the electrode 126 is extremely high when there is an appropriate distance therebetween. Thus, the photoelectric conversion element 120 can have diode characteristics without a short circuit between the anode and the cathode. Note that two or more conductors 91 that are electrically connected to the n-type semiconductor layer 123 may be provided.

Figure 32F:
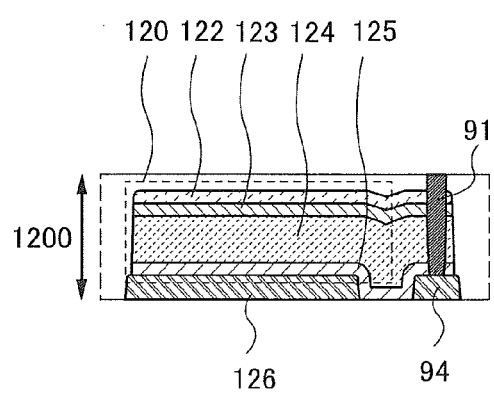

FIG. 32F illustrates a structure in which the photoelectric conversion element 120 in FIG. 32E is provided with the light-transmitting conductive layer 122 in contact with the n-type semiconductor layer 123.

Note that each of the photoelectric conversion elements 120 illustrated in FIGS. 32D to 32F has an advantage of having a large light-receiving area because wirings and the like do not overlap with a light-receiving region.

Figure 33:
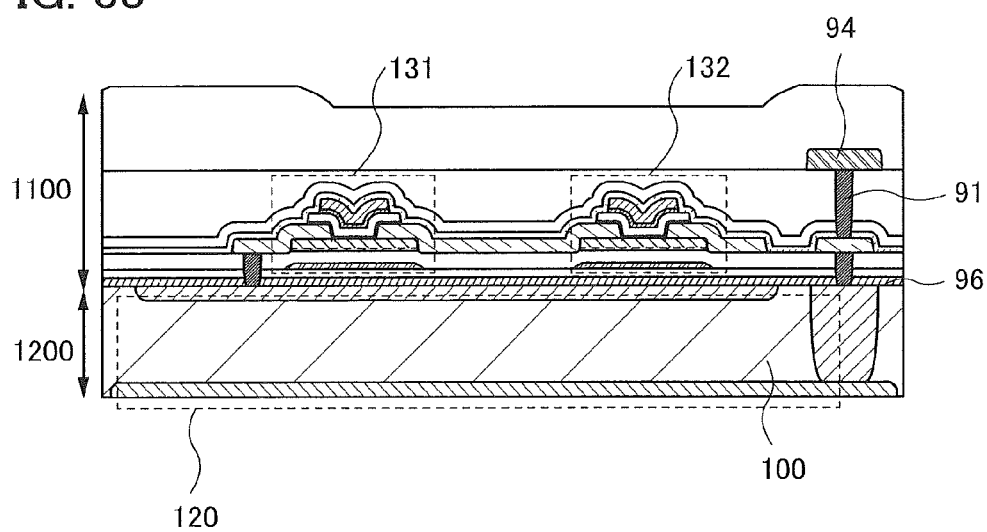
FIG. 33 is a cross-sectional view illustrating a structure of an imaging device.

Alternatively, as illustrated in FIG. 33, the photoelectric conversion element 120 may be a photodiode including a silicon substrate 100 as a photoelectric conversion layer.

The photoelectric conversion element 120 formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 121 does not need to be divided between circuits as illustrated in FIG. 28A. Therefore, the imaging device of one embodiment of the present invention can be manufactured with a high yield at low cost. In contrast, a photodiode including the silicon substrate 100 as the photoelectric conversion layer requires difficult processes such as a polishing process and a bonding process.

Figure 34A:
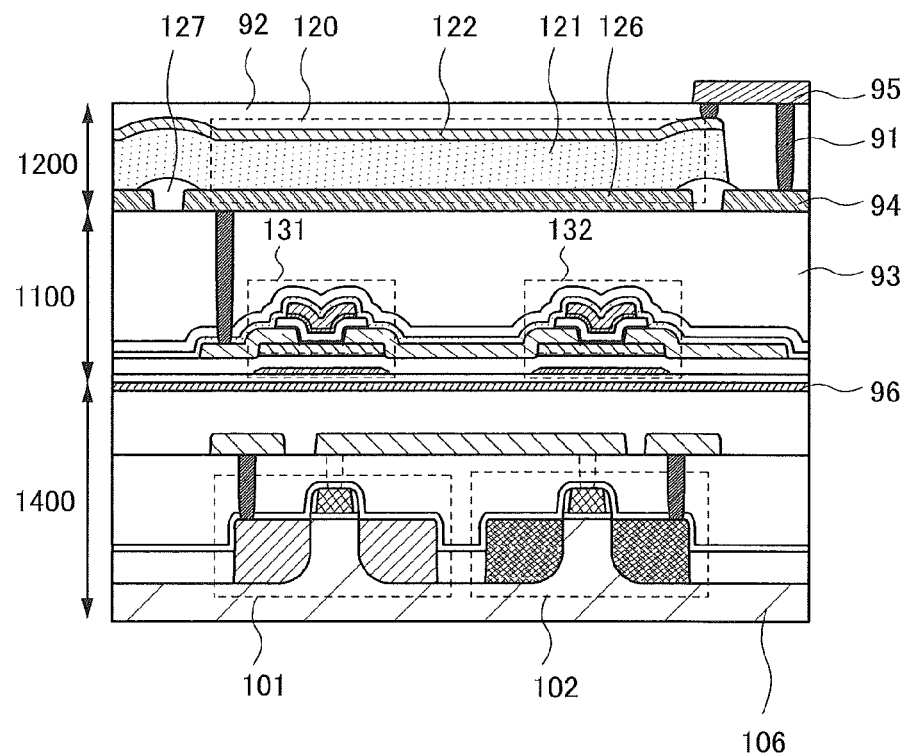
FIGS. 34A to 34C are cross-sectional views and a circuit diagram each illustrating a structure of an imaging device.

Furthermore, in the imaging device of one embodiment of the present invention, a stack including a silicon substrate 106 in which a circuit is formed may be used. For example, as illustrated in FIG. 34A, the pixel circuit may overlap with a tier 1400 that includes a transistor 101 and a transistor 102 whose active regions are formed in the silicon substrate 106.

Figure 34B:
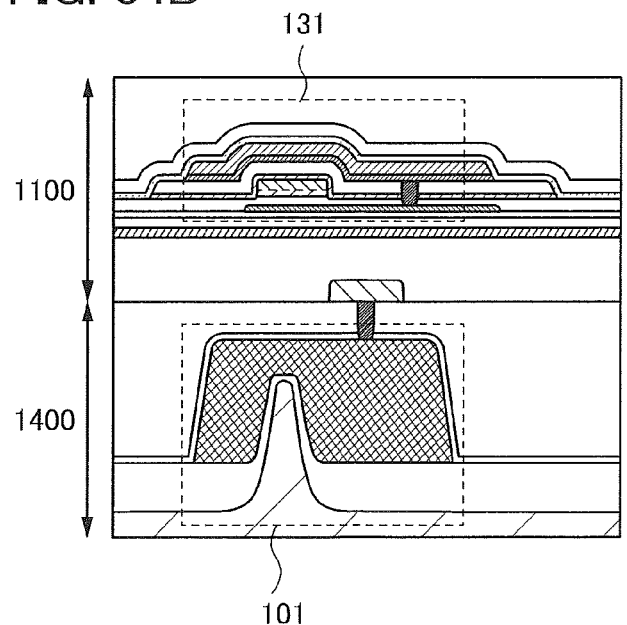

FIG. 34B is a cross-sectional view illustrating the transistors in the channel width direction.

Figure 34C:
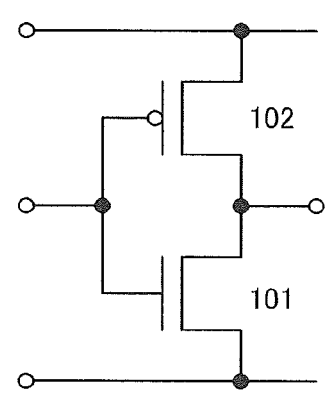

The circuit formed in the silicon substrate 106 is capable of reading a signal outputted from the pixel circuit and converting the signal, for example. The circuit may include, for example, a CMOS inverter as illustrated in the circuit diagram in FIG. 34C. A gate of the transistor 101 (n-channel transistor) is electrically connected to a gate of the transistor 102 (p-channel transistor). One of a source and a drain of one of the transistors 101 and 102 is electrically connected to one of a source and a drain of the other transistor. The other of the source and the drain of the one transistor and the other of the source and the drain of the other transistor are electrically connected to different wirings.

Each of the silicon substrate 100 and the silicon substrate 106 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 33 and FIG. 34A, an insulating layer 96 is provided between a region including an oxide semiconductor transistor and a region including a S1 device (a Si transistor or a S1 photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers provided in the vicinity of the oxide semiconductor layer that is the active layer of the transistor 131 or the like causes generation of carriers in the oxide semiconductor layer, and thus may reduce the reliability of the transistor 131 or the like. For this reason, the insulating layer 96 that can have a function of preventing diffusion of hydrogen is preferably provided between one layer including the Si transistor and another layer stacked thereover that includes the OS transistor. Hydrogen is confined in the one layer owing to the insulating layer 96, so that the reliability of the transistors 101 and 102 can be improved. Furthermore, diffusion of hydrogen from the one layer to the other layer is inhibited, leading to an improvement in the reliability of the transistor 131 or the like.

The insulating layer 96 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 34A, a circuit (e.g., a driver circuit) formed in the silicon substrate 106, the transistor 131 or the like, and the photoelectric conversion element 120 can overlap with each other; thus, the integration degree of pixels can be increased. In other words, the resolution of the imaging device can be increased. Such a structure is suitable for an imaging device with, for example, 4K2K, 8K4K, or 16K8K pixels. Note that since the 8K4K imaging device includes thirty-three million pixels, it can also be referred to as "33M." Furthermore, for example, a structure may be employed in which Si transistors are formed as the transistors 134 and 135 included in the pixel 11 and there is a region where the transistors 134 and 135 overlap with the transistors 131 to 133 and the photoelectric conversion element 120. In that case, the transistors 131 to 133 are OS transistors.

In the imaging device in FIG. 34A, no photoelectric conversion element is provided on the silicon substrate 106. Therefore, an optical path for the photoelectric conversion element 120 can be ensured without being influenced by the transistors or wirings, and a pixel with a high aperture ratio can be formed.

Figure 35A:
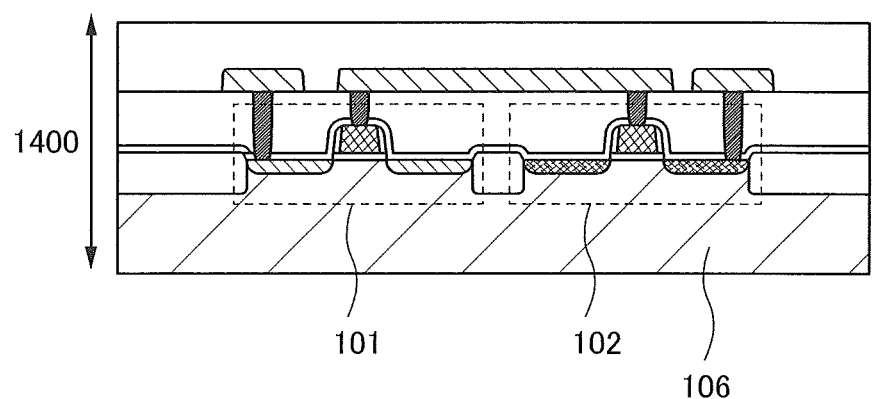
FIGS. 35A and 35B are cross-sectional views each illustrating a structure of an imaging device.
Figure 35B:
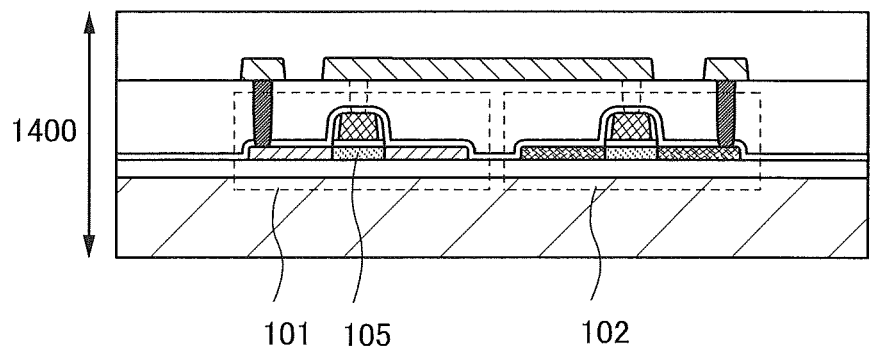

Although FIGS. 34A and 34B show fin type Si transistors, planar type transistors may be used as illustrated in FIG. 35A. Alternatively, as illustrated in FIG. 35B, transistors each including an active layer 105 formed using a silicon thin film may be used. The active layer 105 can be formed using polycrystalline silicon or single crystal silicon of a silicon-on-insulator (SOI) structure.

The imaging device of one embodiment of the present invention can also have a structure in FIG. 36.

An imaging device in FIG. 36 is a modification example of the imaging device in FIG. 34A. A CMOS inverter is formed using an OS transistor and a Si transistor.

Here, the transistor 102 provided in the tier 1400 is a p-channel Si transistor, and the transistor 101 provided in the tier 1100 is an n-channel OS transistor. When only the p-channel transistor is provided in the silicon substrate 106, a step of forming a well, an n-type impurity layer, or the like can be omitted.

Although selenium or the like is used for the photoelectric conversion element 120 in the imaging device in FIG. 36, a thin film PIN photodiode may be used as in FIG. 31.

In the imaging device in FIG. 36, the transistor 101 can be formed through the same process as the transistors 131 and 132 formed in the tier 1100. Thus, the manufacturing process of the imaging device can be simplified.

Figure 37:
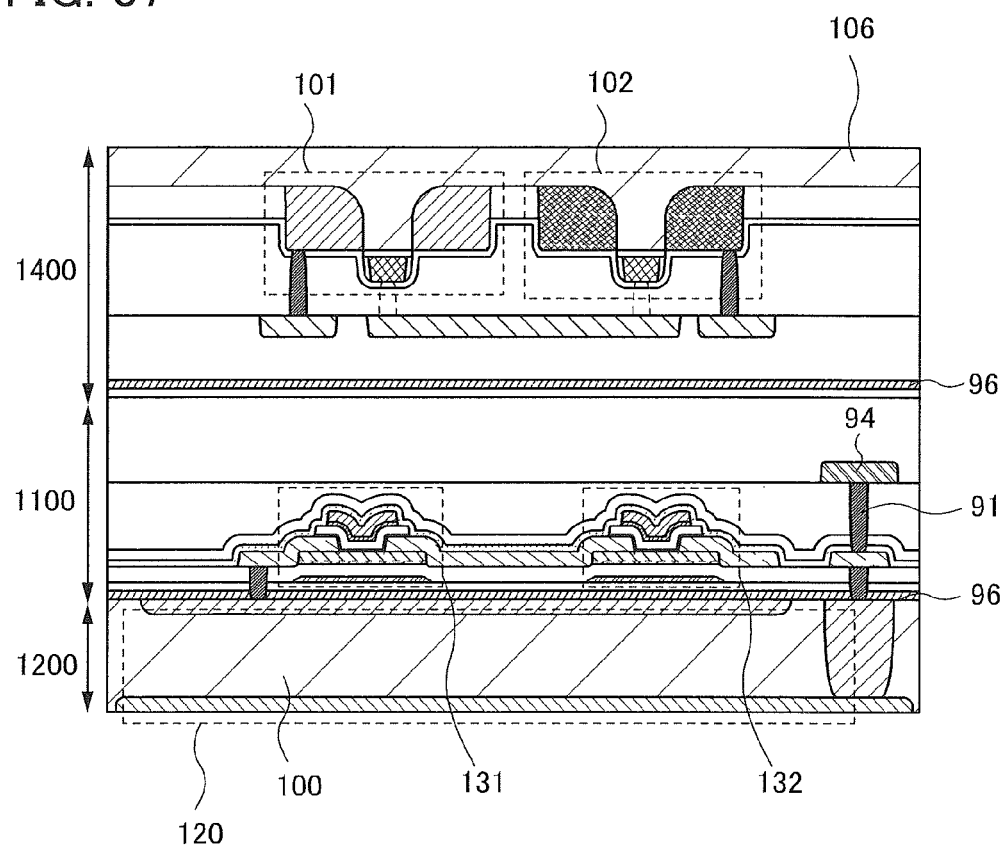
FIG. 37 is a cross-sectional view illustrating a structure of an imaging device.

As illustrated in FIG. 37, the imaging device of one embodiment of the present invention may have a structure where a pixel and the silicon substrate 106 in which a circuit is formed are attached to each other. Note that the pixel includes a photodiode formed in the silicon substrate 100 and OS transistors formed over the photodiode. Such a structure facilitates an increase in the effective area of the photodiode formed in the silicon substrate 100. Furthermore, when the integration degree of the circuit formed in the silicon substrate 106 is improved using miniaturized Si transistors, a high-performance semiconductor device can be provided.

Figure 38:
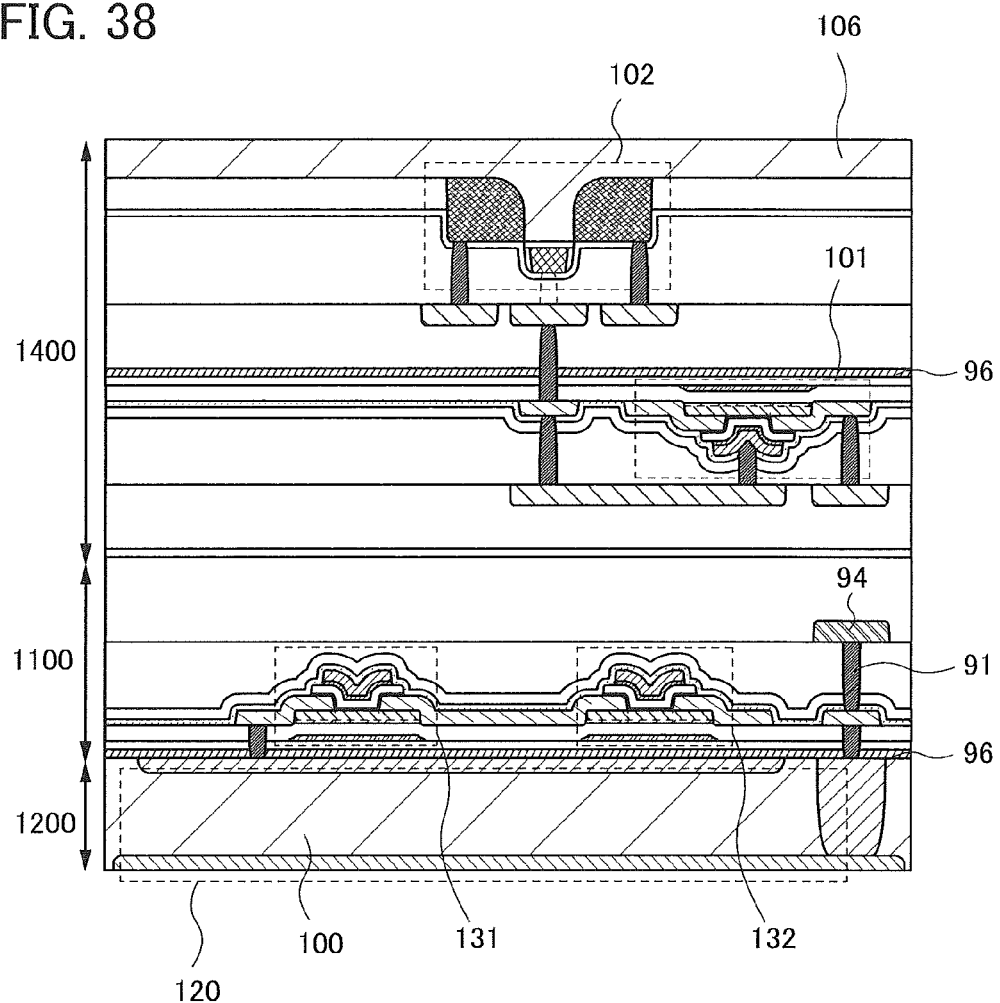
FIG. 38 is a cross-sectional view illustrating a structure of an imaging device.
Figure 39:
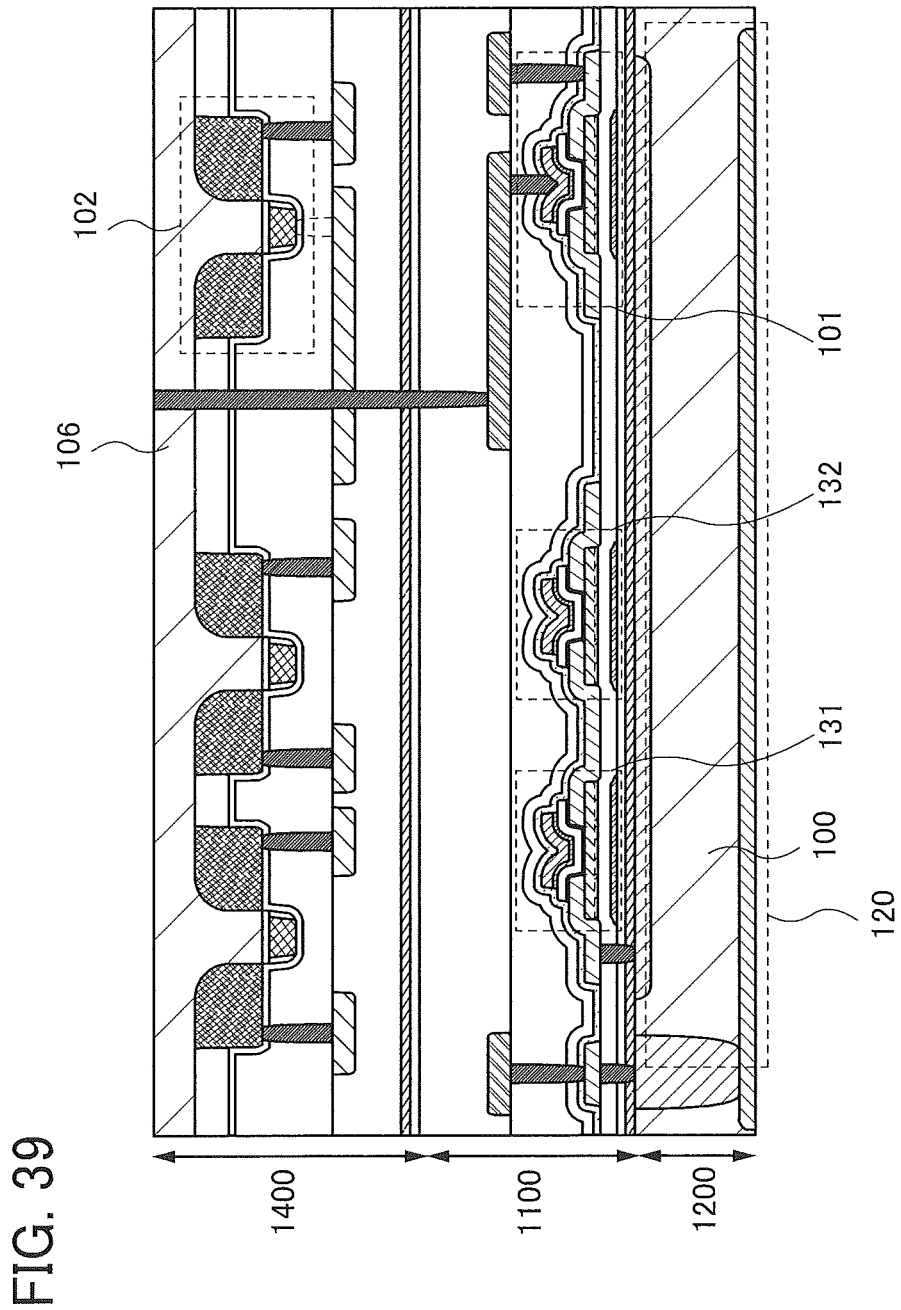
FIG. 39 is a cross-sectional view illustrating a structure of an imaging device.

FIG. 38 and FIG. 39 each show a modification example of FIG. 37, in which a circuit includes an OS transistor and a Si transistor. Such a structure facilitates an increase in the effective area of the photodiode formed in the silicon substrate 100. Furthermore, when the integration degree of the circuit formed in the silicon substrate 106 is improved using miniaturized Si transistors, a high-performance semiconductor device can be provided.

In the case of the structure illustrated in FIG. 38, a CMOS circuit can be formed using the OS transistor and the Si transistor on the silicon substrate 106. Since the off-state current of the OS transistor is extremely low, the static leakage current of the CMOS circuit can be extremely low.

In the case of the structure illustrated in FIG. 39, a CMOS circuit can be formed using the OS transistor over the silicon substrate 100 and the Si transistor formed in the silicon substrate 106.

Figure 40A:
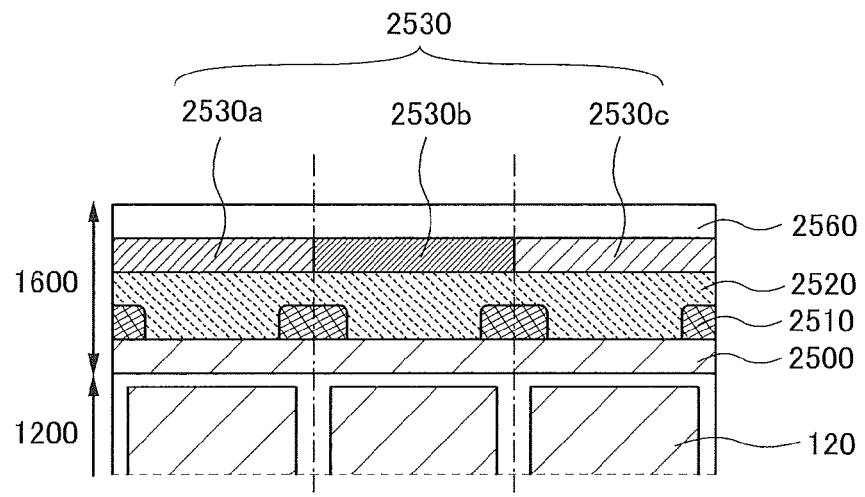
FIGS. 40A to 40C are cross-sectional views each illustrating a structure of an imaging device.

FIG. 40A is a cross-sectional view of an example of a mode in which a color filter and the like are added to the imaging device. The cross-sectional view illustrates part of a region including pixel circuits of three pixels. An insulating layer 2500 is formed over the tier 1200 where the photoelectric conversion element 120 is formed. As the insulating layer 2500, a silicon oxide film or the like with a high visible-light transmitting property can be used. A silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 can have a function of inhibiting color mixing of light passing through the color filter. The light-blocking layer 2510 can be formed using a metal layer of aluminum, tungsten, or the like, or a stack including the metal layer and a dielectric film that can function as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 40B:
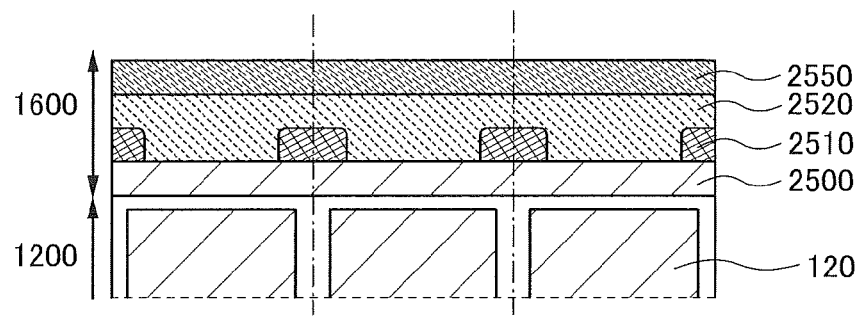

As illustrated in FIG. 40B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

When a scintillator is used for the optical conversion layer 2550, an imaging device that takes an image visualizing the intensity of radiation, which is used for an X-ray imaging device or the like, can be obtained. Radiation such as X-rays that passes through a subject to enter a scintillator is converted into light (fluorescence) such as visible light or ultraviolet light owing to a phenomenon known as photoluminescence. Then, the photoelectric conversion element 120 detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. Materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known, for example.

In the photoelectric conversion element 120 containing a selenium-based material, radiation such as X-rays can be directly converted into charge; thus, the scintillator is unnecessary.

A microlens array 2540 may be provided over the color filters 2530a, 2530b, and 2530c. Light transmitting lenses included in the microlens array 2540 passes through the color filters positioned thereunder and enters the photoelectric conversion element 120. Note that a region other than the tier 1200 in FIGS. 40A to 40C is referred to as a layer 1600.

Figure 40C:
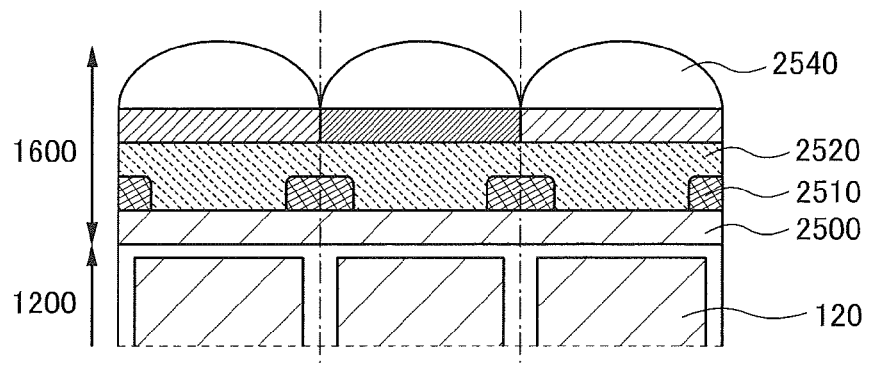
Figure 41:
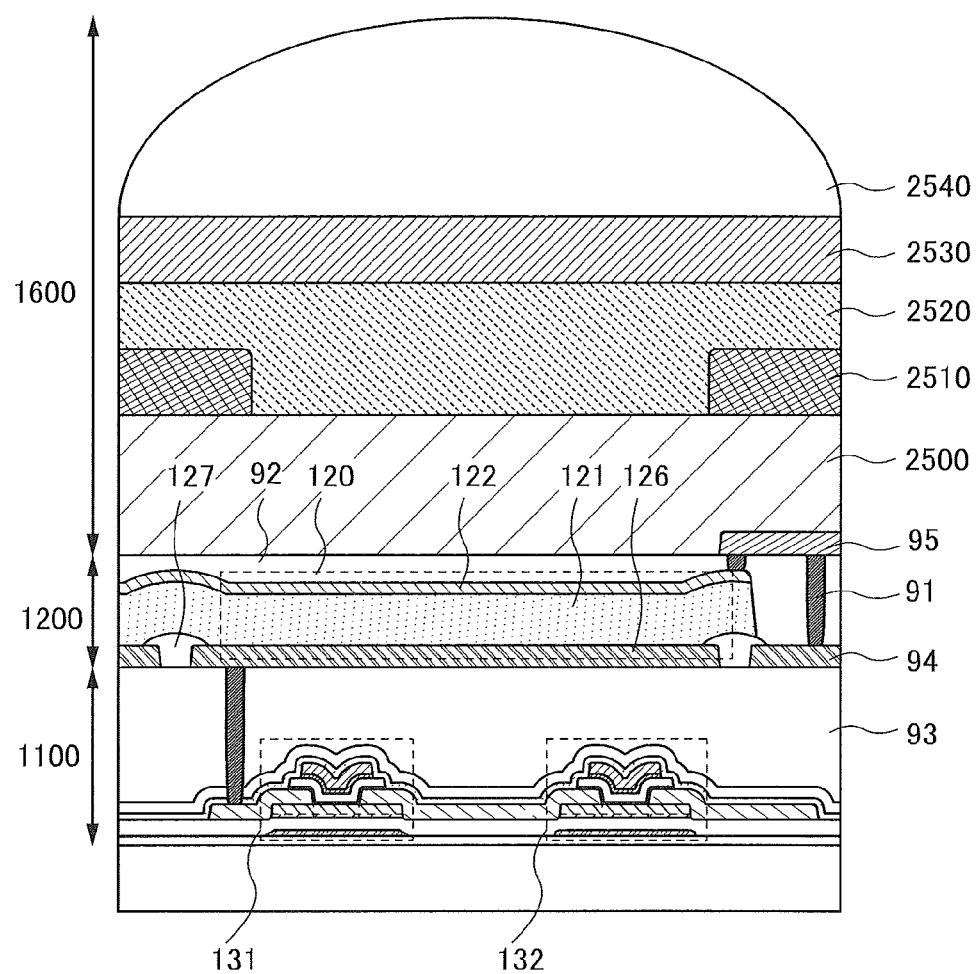
FIG. 41 is a cross-sectional view illustrating a structure of an imaging device.
Figure 42:
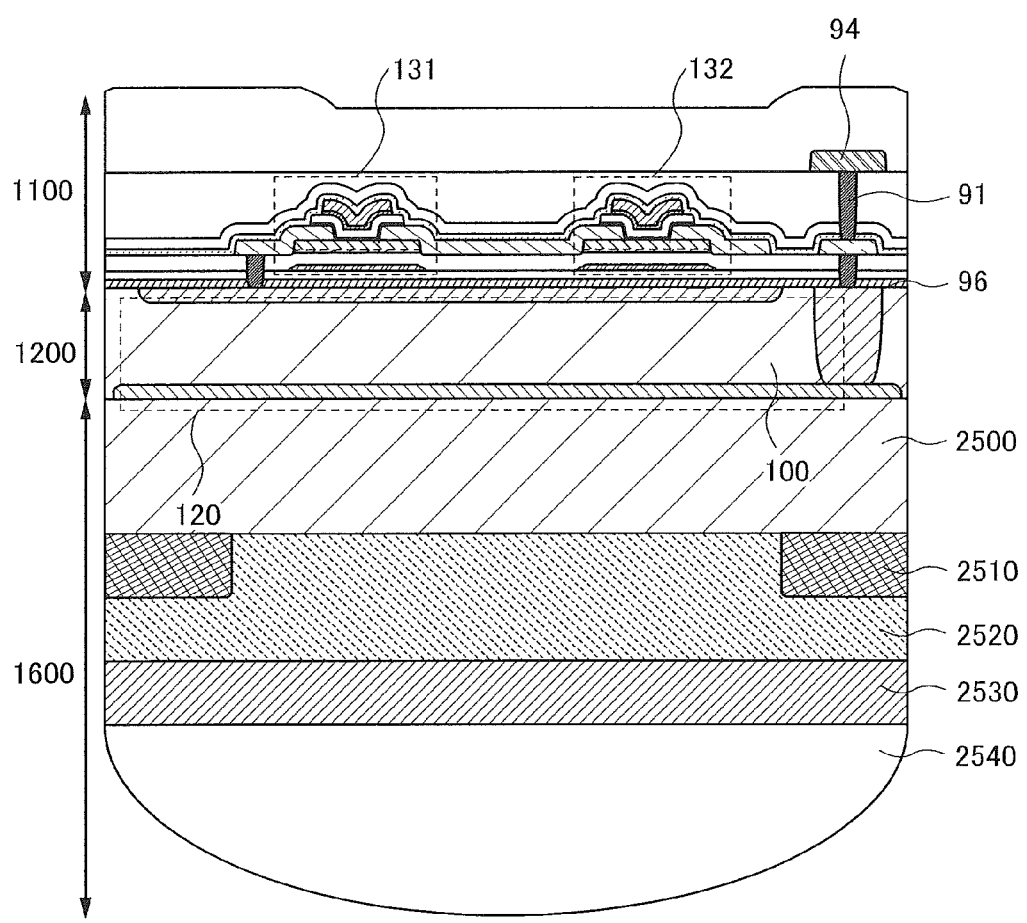
FIG. 42 is a cross-sectional view illustrating a structure of an imaging device.

The specific structure of the imaging device in FIG. 40C is illustrated in FIG. 41 by taking an example of the imaging device in FIG. 28A. In addition, the specific structure of the imaging device in FIG. 40C is illustrated in FIG. 42 by taking an example of the imaging device in FIG. 33.

Figure 43:
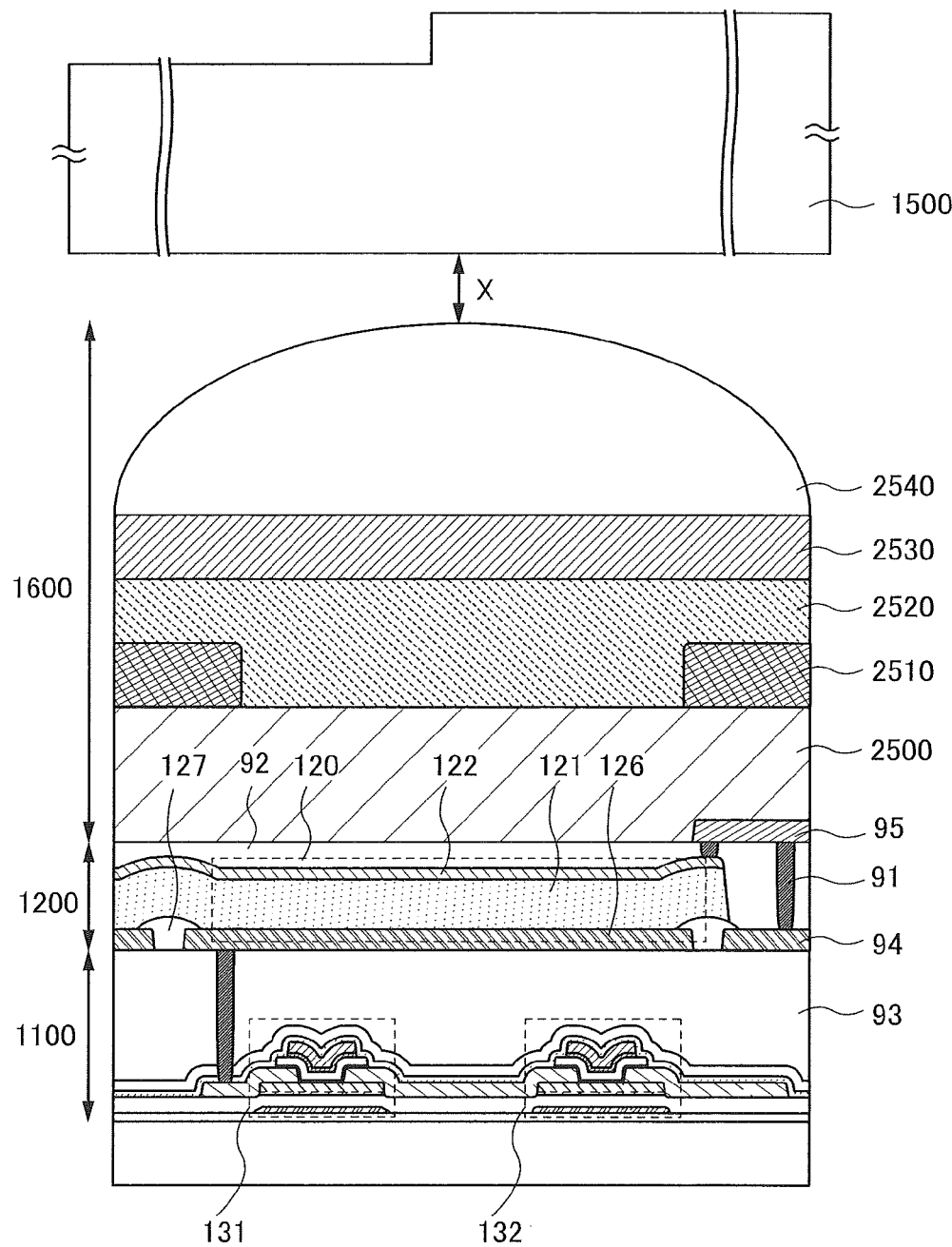
FIG. 43 is a cross-sectional view illustrating a structure of an imaging device.
Figure 44:
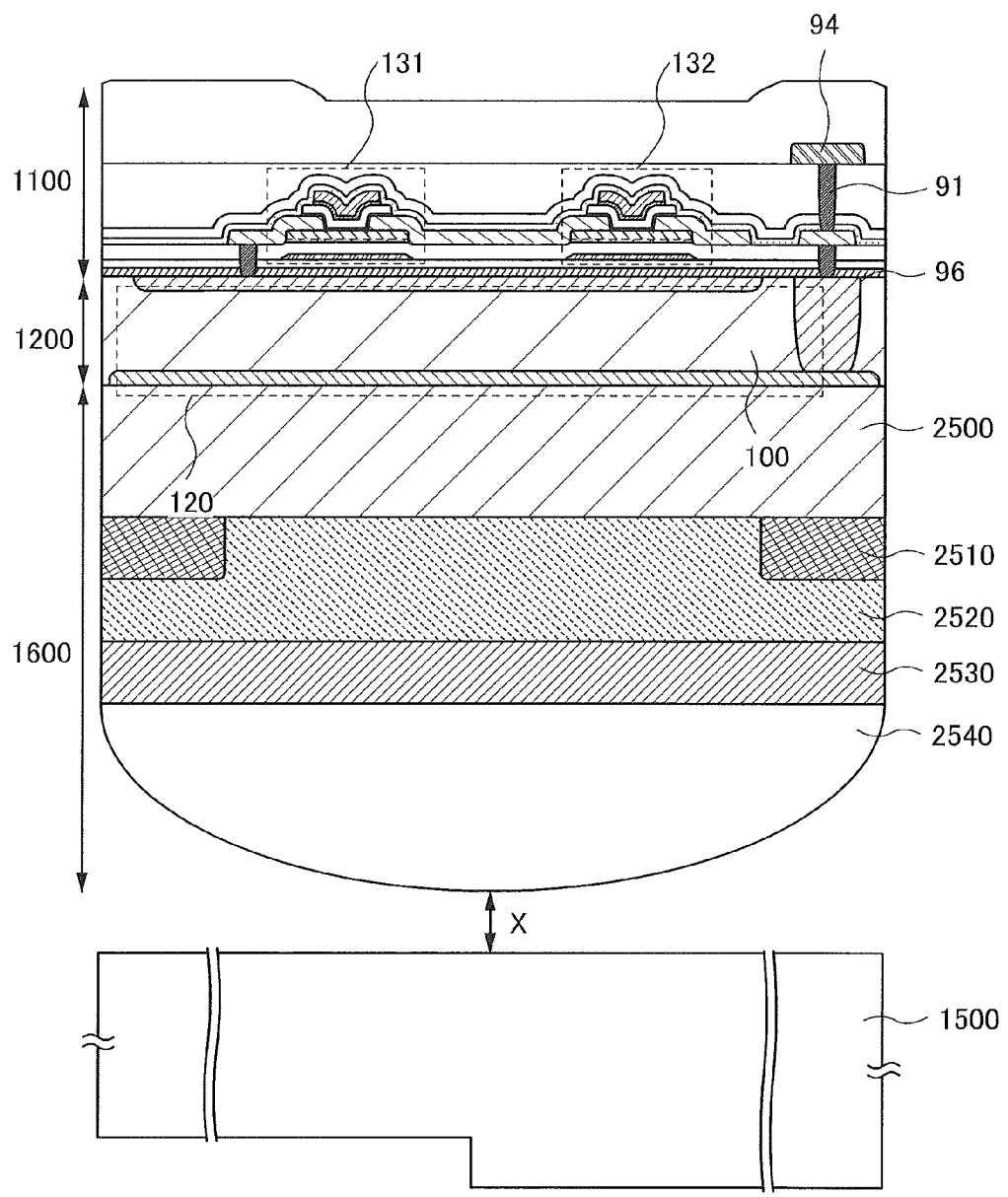
FIG. 44 is a cross-sectional view illustrating a structure of an imaging device.

The imaging device of one embodiment of the present invention may be combined with a diffraction grating 1500 as illustrated in FIG. 43 and FIG. 44. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Further alternatively, a stack including the inorganic insulating film and the organic insulating film may be used.

The diffraction grating 1500 can be formed by a lithography process using a photosensitive resin or the like. Alternatively, the diffraction grating 1500 can be formed by a lithography process and an etching process. Further alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, and preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Further alternatively, a liquid such as silicone oil may be provided. Even in the case where the microlens array 2540 is not provided, the space X may be provided between the color filter 2530 and the diffraction grating 1500.

As illustrated in FIG. 45A1 and FIG. 45B1, the imaging device of one embodiment of the present invention may be bent. FIG. 45A1 illustrates a state in which the imaging device is bent in the direction of dashed-two dotted line X1-X2. FIG. 45A2 is a cross-sectional view illustrating a portion indicated by dashed-two dotted line X1-X2 in FIG. 45A1. FIG. 45A3 is a cross-sectional view illustrating a portion indicated by dashed-two dotted line Y1-Y2 in FIG. 45A1.

FIG. 45B1 illustrates a state where the imaging device is bent in the direction of dashed-two dotted line X3-X4 and the direction of dashed-two dotted line Y3-Y4. FIG. 45B2 is a cross-sectional view illustrating a portion indicated by dashed-two dotted line X3-X4 in FIG. 45B1. FIG. 45B3 is a cross-sectional view illustrating a portion indicated by dashed-two dotted line Y3-Y4 in FIG. 45B1.

Bending the imaging device can reduce field curvature and astigmatism. Thus, the optical design of a lens or the like, which is used in combination of the imaging device, can be facilitated. For example, the number of lenses used for aberration correction can be reduced; accordingly, the size or weight of semiconductor device or the like including the imaging device can be easily reduced. In addition, the quality of a captured image can be improved.

This embodiment can be implemented in appropriate combination with any of the structures described in the other embodiments.

Embodiment 6

In this embodiment, the configuration of the display device 20 described in Embodiment 1 will be described in detail with reference to drawings.

Figure 46A:
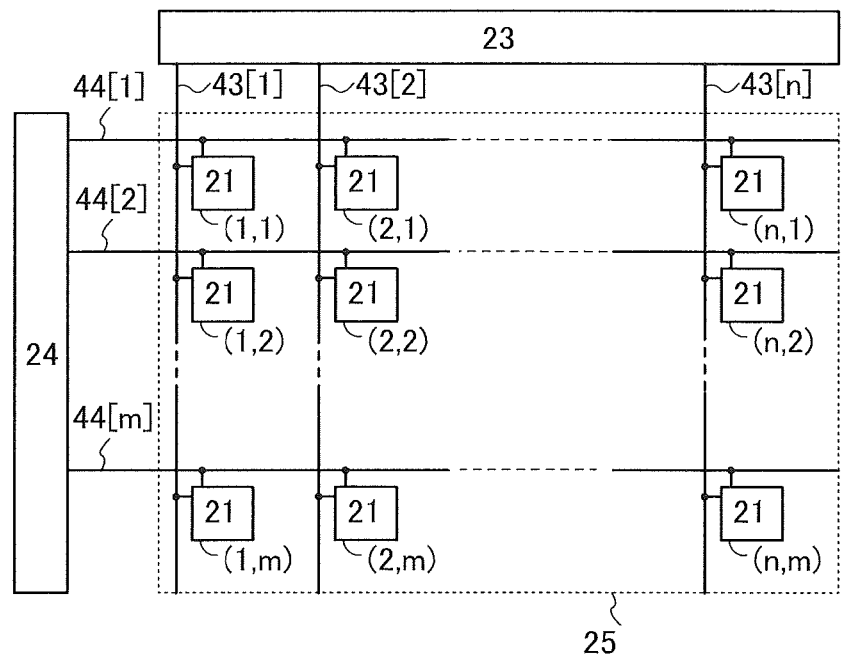
FIGS. 46A and 46B are a block diagram of a display device and a timing chart illustrating the operation thereof.

FIG. 46A is a block diagram illustrating the pixels 21, the circuit 23, and the circuit 24 of the display device 20. In FIG. 46A, wirings 44[1] to 44[m] (m is a natural number) are connected to the circuit 24, wirings 43 [1] to 43[n] (n is a natural number) are connected to the circuit 23, and the pixels 21 are denoted by (1, 1) to (n, m).

The wirings 44 can serve as gate lines. The wirings 43 can serve as source lines.

Figure 46B:
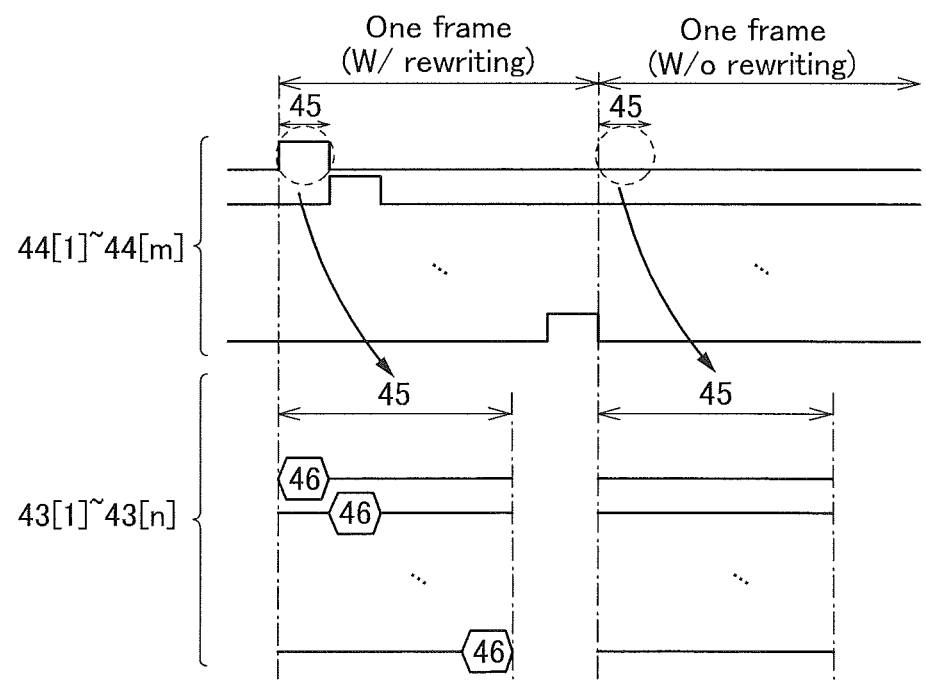

FIG. 46B is a timing chart of signals supplied to the wirings 44 and the wirings 43 illustrated in FIG. 46A. FIG. 46B separately illustrates a frame during which a data signal is rewritten and a frame during which a data signal is not rewritten. Note that periods such as a retrace period are not taken into consideration in FIG. 46B.

In the first display mode described in Embodiment 1, image data is rewritten. Thus, a data signal is rewritten every frame period. In that case, scan signals are sequentially supplied to the wirings 44[1] to 44[m]. During a horizontal scanning period 45 where the scan signals are "H," a video data signal 46 is supplied to each column of the wirings 43[1] to 43[n].

In the second display mode described in Embodiment 1, image data is not rewritten. Thus, the potential of the video data signal 46 is retained in the pixels every frame period without rewriting the video data signal 46. In that case, supply of the scan signals to the wirings 44[1] to 44[m] is stopped. During the horizontal scanning period 45, supply of the video data signal 46 to each column of the wirings 43[1] to 43[n] is stopped.

Figure 47A:
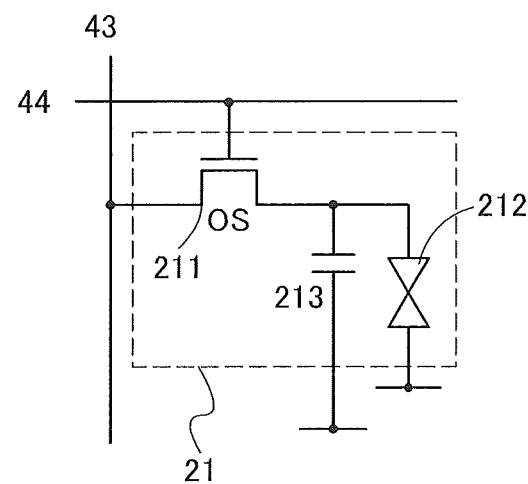
FIGS. 47A and 47B each illustrate a pixel circuit of a display device.
Figure 47B:
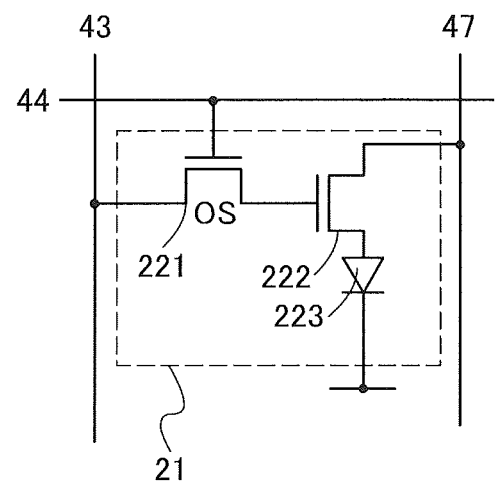

FIGS. 47A and 47B are circuit diagrams each illustrating a configuration example of the pixel 21. FIG. 47A illustrates an example of a pixel in which a liquid crystal element is used as a display element, and FIG. 47B illustrates an example of a pixel in which a light-emitting element is used as a display element.

The pixel 21 illustrated in FIG. 47A includes a transistor 211, a liquid crystal element 212, and a capacitor 213.

A gate of the transistor 211 is electrically connected to the wiring 44. One of a source and a drain of the transistor 211 is electrically connected to the wiring 43. The other of the source and the drain of the transistor 211 is electrically connected to one terminal of the liquid crystal element 212 and one terminal of the capacitor 213.

The transistor 211 can serve as a switching element for controlling an electrical connection between the liquid crystal element 212 and the wiring 43. The transistor 211 is turned on or off by using a scan signal inputted from the wiring 44. Note that an OS transistor whose off-state current is low is suitable for the transistor 211.

The pixel 21 illustrated in FIG. 47B includes a transistor 221, a transistor 222, and a light-emitting element 223.

A gate of the transistor 221 is electrically connected to the wiring 44. One of a source and a drain of the transistor 221 is electrically connected to the wiring 43. The other of the source and the drain of the transistor 221 is electrically connected to a gate of the transistor 222. One of a source and a drain of the transistor 222 is electrically connected to a wiring 47. The other of the source and the drain of the transistor 222 is electrically connected to one terminal of the light-emitting element 223.

The transistor 221 is a switching element for controlling an electrical connection between the gate of the transistor 222 and the wiring 43. The transistor 221 is turned on or off by using a scan signal inputted from the wiring 44. Note that an OS transistor whose off-state current is low is suitable for the transistor 221.

In the circuit diagrams illustrated in FIGS. 47A and 47B, "OS" is written beside a circuit symbol of an OS transistor for clarification.

Note that a transistor with low off-state current is not necessarily used in the pixel 21 as long as the pixel can retain the potential of the video data signal 46 in the second display mode during which image data is not rewritten. The pixel 21 may include a memory that can retain video data.

Figure 48A:
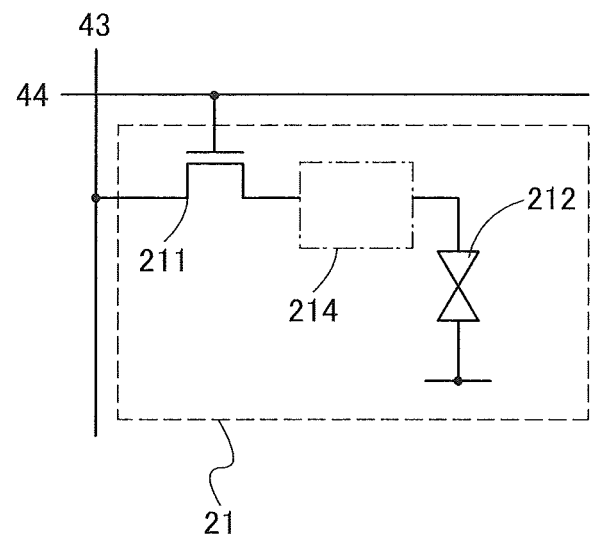
FIGS. 48A and 48B each illustrate a pixel circuit of a display device.
Figure 48B:
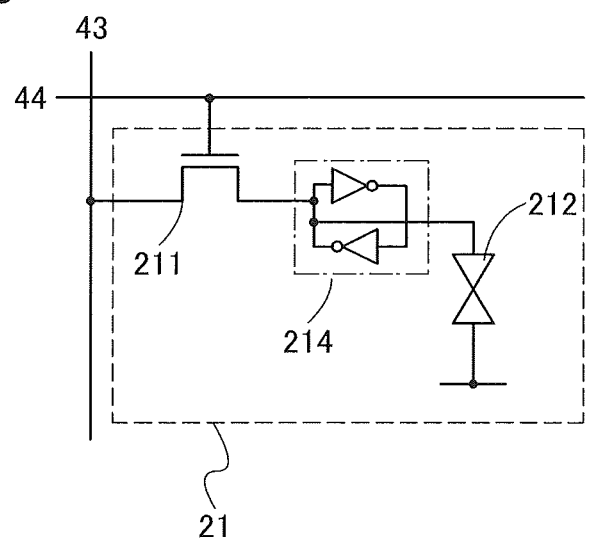

FIG. 48A illustrates the pixel 21 that includes a memory. Owing to a memory 214, the pixel 21 can retain video data. As the memory, a memory circuit such as a static random access memory (SRAM) or a dynamic random access memory (DRAM) may be used. FIG. 48B illustrates an example of a circuit diagram in the case where an SRAM is used as the memory 214.

FIGS. 49A and 49B each illustrate an example of a cross-sectional view of a display device. FIG. 49A is a schematic diagram of cross section along A-B showing a transistor and its vicinity in the pixel 21. FIG. 49B is a schematic diagram of cross section along C-D showing a terminal portion and its vicinity.

FIGS. 49A and 49B illustrate a substrate 300, a transistor 301, a pixel electrode 302, a common electrode 303, an insulating film 304, an alignment film 305, a liquid crystal 306, a substrate 307, an alignment film 308, a wiring 309, a sealing layer 310, flexible printed circuits (FPCs) 311, and a conductive resin 312.

FIGS. 49A and 49B illustrate a liquid crystal display device of what is called a horizontal electric field mode (e.g., an in-plane-switching (IPS) mode or a fringe field switching (FFS) mode) in which a potential difference is made between the pixel electrode 302 and the common electrode. Alternatively, what is called a vertical electric field mode (e.g., a twisted nematic (TN) mode, a vertical alignment (VA) mode, a multi-domain vertical alignment (MVA) mode, a patterned vertical alignment (PVA) mode, a super twisted nematic (STN) mode, or an optically compensated bend (OCB) mode) may be employed.

As the transistor 301 included in the pixel 21, a transistor similar to the transistor 211 illustrated in FIG. 47A can be used.

The pixel electrode 302 and the common electrode 303 may be each formed using a light-transmitting conductive layer. For example, an indium tin oxide (ITO) can be used.

Although FIGS. 49A and 49B illustrate the structure in which a liquid crystal is used for a display element, one embodiment of the present invention is not limited thereto, and a variety of modes or a variety of elements can be used. The display element, a display device, a light-emitting element, or a light-emitting device includes at least one of an electroluminescence (EL) element (e.g., an EL element including organic and inorganic materials, an organic EL element, or an inorganic EL element), a light emitting diode (LED) (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Alternatively, the display device may include a display medium whose contrast, luminance, reflectivity, transmittance, or the like is changed by electrical or magnetic effect. Examples of a display device including an EL element include an EL display. Examples of a display device having an electron emitter include a field emission display (FED), a surface-conduction electron-emitter display (SED), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by metal organic chemical vapor deposition (MOCVD). Note that when the graphene is provided, the GaN semiconductor layer included in the LED can also be formed by a sputtering method.

Note that there is no particular limitation on the type of the substrate 300. As the substrate 300, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Alternatively, a film of polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

As the substrate 300, a silicon substrate provided with a transistor, or the silicon substrate over which an insulating layer, a wiring, a conductor that can function as a contact plug, and the like are provided can be used. Note that when only p-channel transistors are formed using the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-channel transistor with the (110) plane can increase mobility.

A flexible substrate may be used as the substrate 300, and the transistor may be formed directly over the flexible substrate. Alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the separation layer, a stack including inorganic films, which are a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

This embodiment can be implemented in appropriate combination with any of the structures described in the other embodiments.

Embodiment 7

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 50A:
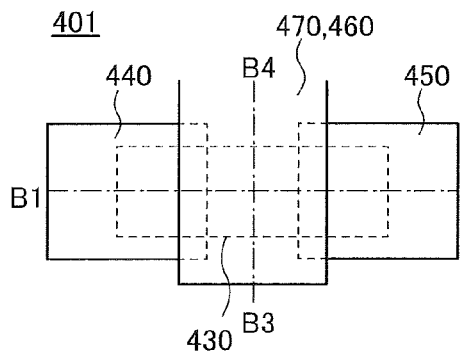
FIGS. 50A to 50F are top views and cross-sectional views illustrating transistors.
Figure 50B:
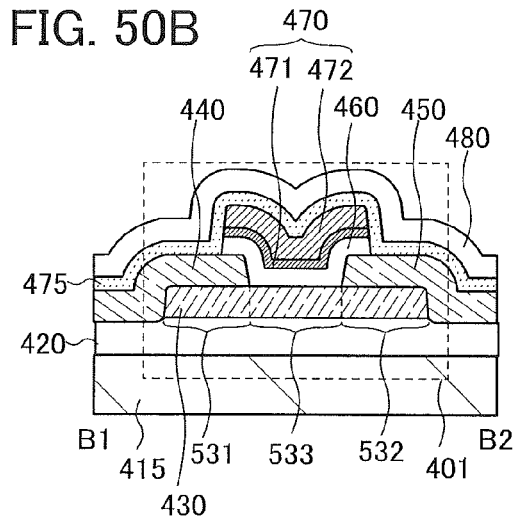
Figure 52A:
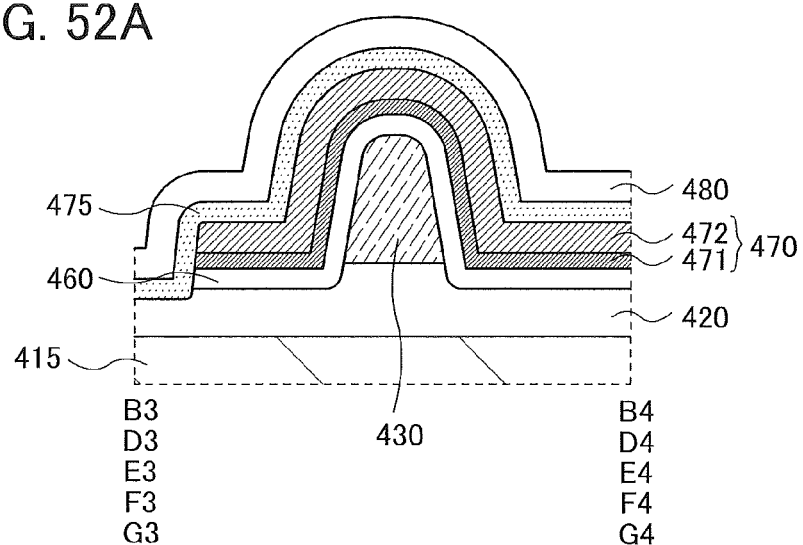
FIGS. 52A to 52D each illustrate a cross section of a transistor in a channel width direction.

FIG. 50A is a top view illustrating a transistor 401 in one embodiment of the present invention. A cross section in the direction of dashed-dotted line B1-B2 in FIG. 50A is illustrated in FIG. 50B. A cross section in the direction of dashed-dotted line B3-B4 in FIG. 50A is illustrated in FIG. 52A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating layer 420, an oxide semiconductor layer 430, a conductive layer 440, a conductive layer 450, an insulating layer 460, a conductive layer 470, an insulating layer 475, and an insulating layer 480.

The insulating layer 420 is in contact with the substrate 415. The oxide semiconductor layer 430 is in contact with the insulating layer 420. The conductive layer 440 and the conductive layer 450 are in contact with the insulating layer 420 and the oxide semiconductor layer 430. The insulating layer 460 is in contact with the insulating layer 420, the oxide semiconductor layer 430, the conductive layer 440, and the conductive layer 450. The conductive layer 470 is in contact with the insulating layer 460. The insulating layer 475 is in contact with the insulating layer 420, the conductive layer 440, the conductive layer 450, and the conductive layer 470. The insulating layer 480 is in contact with the insulating layer 475.

Here, in the oxide semiconductor layer 430, a region overlapping with the conductive layer 440, a region overlapping with the conductive layer 450, and a region in contact with the insulating layer 460 are referred to as a region 531, a region 532, and a region 533, respectively.

Furthermore, the conductive layers 440 and 450 are electrically connected to the oxide semiconductor layer 430.

The conductive layer 440 can function as one of a source and a drain. The conductive layer 450 can function as the other of the source and the drain. The insulating layer 460 can function as a gate insulating layer. The conductive layer 470 can function as a gate.

The region 531, the region 532, and the region 533 which are illustrated in FIG. 50B can function as one of a source region and a drain region, the other of the source region and the drain region, and a channel formation region, respectively.

Each of the conductive layers 440 and 450 is a single layer in the drawing, but also may be a stack of two or more layers. The conductive layer 470 includes two layers, a conductive layer 471 and a conductive layer 472, in the drawing, but also may be a single layer or a stack of three or more layers. The same applies to other transistors described in this embodiment.

The insulating layer 480 may function as a planarization film as necessary.

Figure 50C:
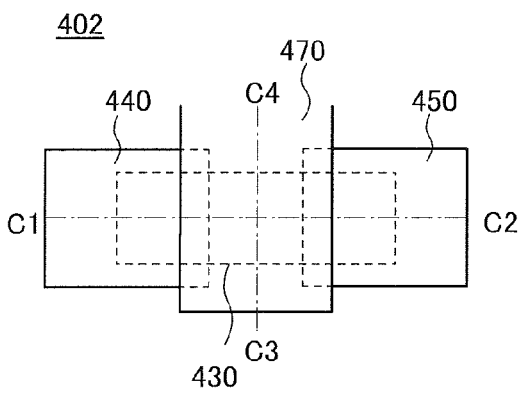
Figure 50D:
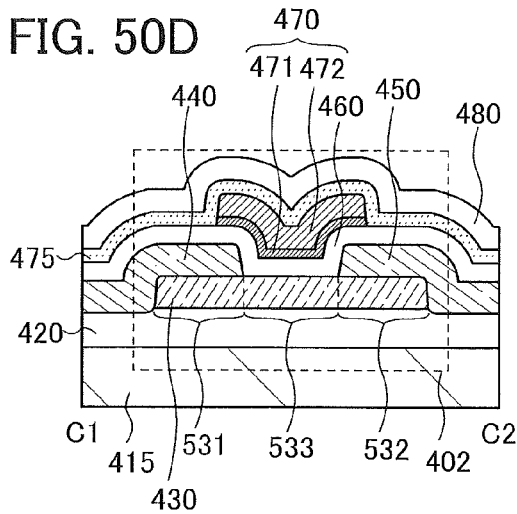
Figure 52B:
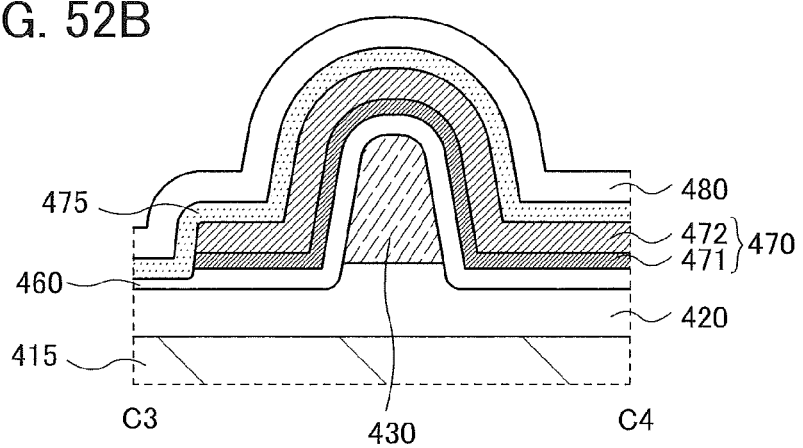

The transistor in one embodiment of the present invention may have a structure illustrated in FIGS. 50C and 50D. FIG. 50C is a top view of a transistor 402. A cross section in the direction of dashed-dotted line C1-C2 in FIG. 50C is illustrated in FIG. 50D. A cross section in the direction of dashed-dotted line C3-C4 in FIG. 50C is illustrated in FIG. 52B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating layer 460 is not aligned with an end portion of the conductive layer 470. In the transistor 402, wide areas of the conductive layers 440 and 450 are covered with the insulating layer 460 and accordingly the electric resistance between the conductive layer 470 and the conductive layers 440 and 450 is high; therefore, the transistor 402 has a feature of low gate leakage current.

The transistors 401 and 402 each have a top-gate structure including regions where the conductive layer 470 overlaps with the conductive layers 440 and 450. To reduce parasitic capacitance, the width of each of the regions in the channel length direction is preferably greater than or equal to 3 nm and less than 300 nm. Since an offset region is not formed in the oxide semiconductor layer 430 in this structure, a transistor with a high on-state current can be easily formed.

Figure 50E:
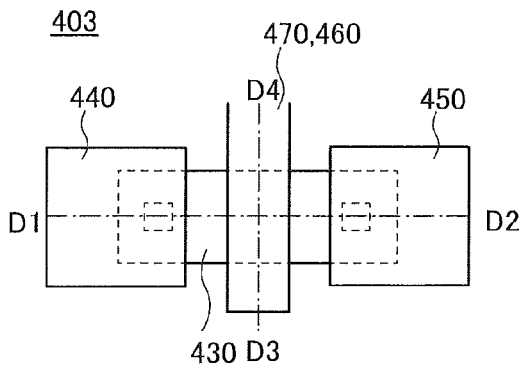
Figure 50F:
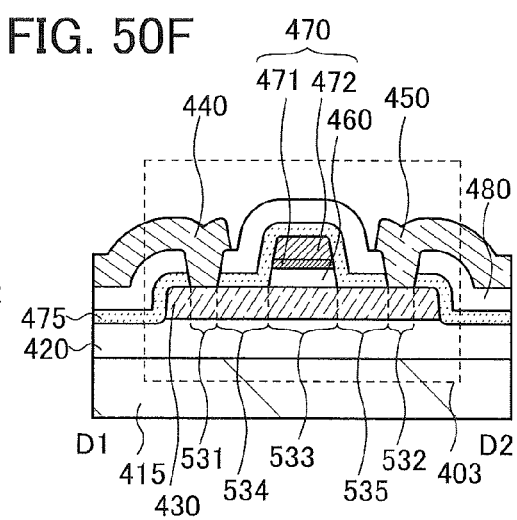

The transistor in one embodiment of the present invention may have a structure illustrated in FIGS. 50E and 50F. FIG.

50E is a top view of a transistor 403. A cross section in the direction of dashed-dotted line D1-D2 in FIG. 50E is illustrated in FIG. 50F. A cross section in the direction of dashed-dotted line D3-D4 in FIG. 50E is illustrated in FIG. 52A. The direction of dashed-dotted line D1-D2 is referred to as a channel length direction, and the direction of dashed-dotted line D3-D4 is referred to as a channel width direction.

In the transistor 403, the insulating layer 420 is in contact with the substrate 415; the oxide semiconductor layer 430 is in contact with the insulating layer 420; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, and the conductive layer 470; the insulating layer 480 is in contact with the insulating layer 475; and the conductive layer 440 and the conductive layer 450 are in contact with the oxide semiconductor layer 430 and the insulating layer 480.

Openings are formed in the insulating layers 475 and 480, and the conductive layers 440 and 450 are electrically connected to the oxide semiconductor layer 430 through the openings.

The transistor 403 may further include, for example, an insulating layer (planarization film) in contact with the conductive layers 440 and 450 and the insulating layer 480 as necessary.

In the oxide semiconductor layer 430, a region that overlaps with the insulating layer 475 and is sandwiched between the region 531 and the region 533 is referred to as a region 534, and a region that overlaps with the insulating layer 475 and is sandwiched between the region 532 and the region 533 is referred to as a region 535.

Figure 51A:
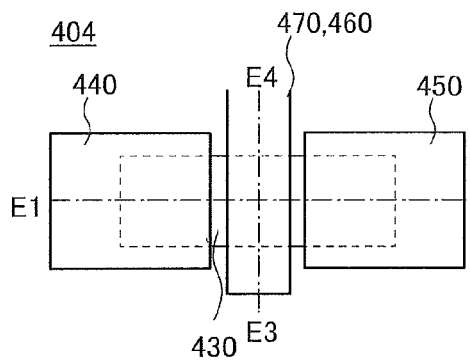
FIGS. 51A to 51F are top views and cross-sectional views illustrating transistors.
Figure 51B:
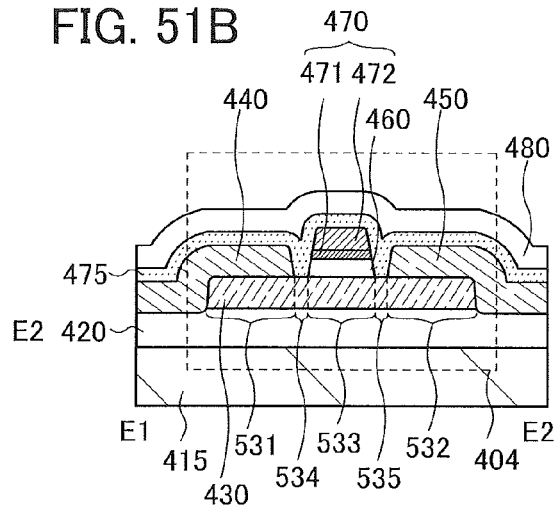

The transistor in one embodiment of the present invention may have a structure illustrated in FIGS. 51A and 51B. FIG. 51A is a top view of a transistor 404. A cross section in the direction of dashed-dotted line E1-E2 in FIG. 51A is illustrated in FIG. 51B. A cross section in the direction of dashed-dotted line E3-E4 in FIG. 51A is illustrated in FIG. 52A. The direction of dashed-dotted line E1-E2 is referred to as a channel length direction, and the direction of dashed-dotted line E3-E4 is referred to as a channel width direction in some cases.

In the transistor 404, the insulating layer 420 is in contact with the substrate 415; the oxide semiconductor layer 430 is in contact with the insulating layer 420; the conductive layers 440 and 450 are in contact with the insulating layer 420 and the oxide semiconductor layer 430; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, the conductive layer 440, the conductive layer 450, and the conductive layer 470; and the insulating layer 480 is in contact with the insulating layer 475.

The transistor 404 is different from the transistor 403 in that the conductive layers 440 and 450 in contact with the oxide semiconductor layer 430 cover end portions of the oxide semiconductor layer 430.

The transistors 403 and 404 each have a self-aligned structure that does not include regions where the conductive layer 470 overlaps with the conductive layers 440 and 450. A transistor with a self-aligned structure, which has extremely low parasitic capacitance between a gate and a source and between the gate and a drain, is suitable for applications that require high-speed operation.

Figure 51C:
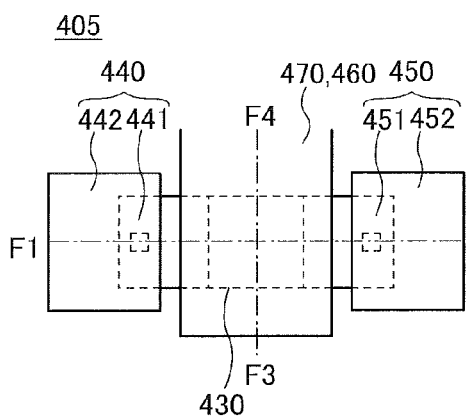
Figure 51D:
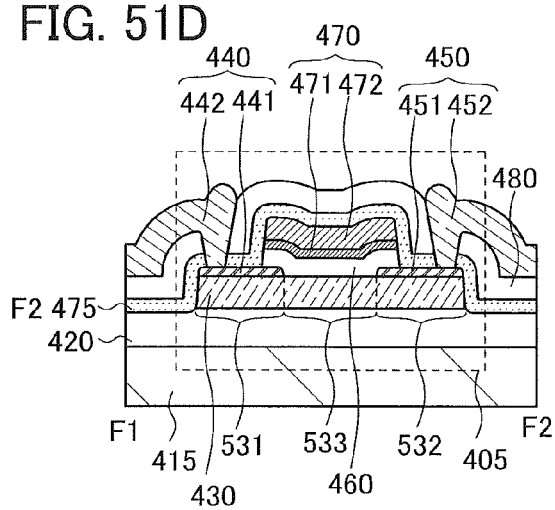

The transistor in one embodiment of the present invention may have a structure illustrated in FIGS. 51C and 51D. FIG. 51C is a top view of a transistor 405. A cross section in the direction of dashed-dotted line F1-F2 in FIG. 51C is illustrated in FIG. 51D. A cross section in the direction of dashed-dotted line F3-F4 in FIG. 51C is illustrated in FIG. 52A. The direction of dashed-dotted line F1-F2 is referred to as a channel length direction, and the direction of dashed-dotted line F3-F4 is referred to as a channel width direction in some cases.

In the transistor 405, the conductive layer 440 includes two layers, a conductive layer 441 and a conductive layer 442, and the conductive layer 450 includes two layers, a conductive layer 451 and a conductive layer 452. The insulating layer 420 is in contact with the substrate 415. The oxide semiconductor layer 430 is in contact with the insulating layer 420. The conductive layer 441 and the conductive layer 451 are in contact with the oxide semiconductor layer 430. The insulating layer 460 is in contact with the insulating layer 420, the oxide semiconductor layer 430, the conductive layer 441, and the conductive layer 451. The conductive layer 470 is in contact with the insulating layer 460. The insulating layer 475 is in contact with the insulating layer 420, the conductive layer 441, the conductive layer 451, and the conductive layer 470. The insulating layer 480 is in contact with the insulating layer 475. The conductive layer 442 is in contact with the conductive layer 441 and the insulating layer 480. The conductive layer 452 is in contact with the conductive layer 451 and the insulating layer 480.

The conductive layers 441 and 451 are in contact with the top surface of the oxide semiconductor layer 430 and are not in contact with a side surface of the oxide semiconductor layer 430.

The transistor 405 may further include, for example, an insulating layer in contact with the conductive layers 442 and 452 and the insulating layer 480 as necessary.

The conductive layer 441 and the conductive layer 451 are electrically connected to the oxide semiconductor layer 430. Furthermore, the conductive layer 442 is electrically connected to the conductive layer 441, and the conductive layer 452 is electrically connected to the conductive layer 451.

In the oxide semiconductor layer 430, a region overlapping with the conductive layer 441 is the region 531 that can function as one of a source region and a drain region, and a region overlapping with the conductive layer 451 is the region 532 that can function as the other of the source region and the drain region.

Figure 51E:
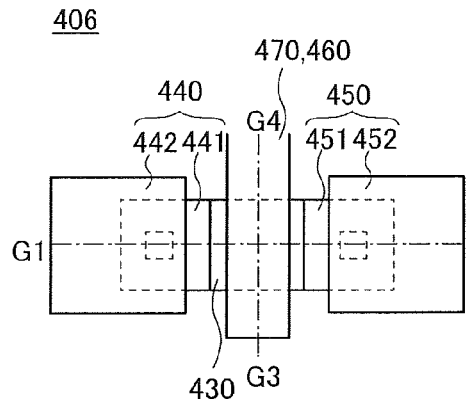
Figure 51F:
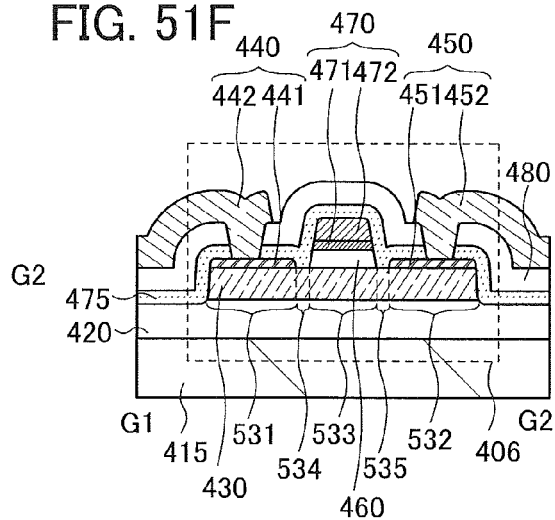

The transistor in one embodiment of the present invention may have a structure illustrated in FIGS. 51E and 51F. FIG. 51E is a top view of a transistor 406. A cross section in the direction of dashed-dotted line G1-G2 in FIG. 51E is illustrated in FIG. 51F. A cross section in the direction of dashed-dotted line G3-G4 in FIG. 51E is illustrated in FIG. 52A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive layer 440 includes two layers, the conductive layers 441 and 442, and the conductive layer 450 includes two layers, the conductive layers 451 and 452.

In the structures of the transistors 405 and 406, the conductive layers 440 and 450 are not in contact with the insulating layer 420. These structures make the insulating layer 420 less likely to be deprived of oxygen by the conductive layers 440 and 450 and facilitate oxygen supply from the insulating layer 420 to the oxide semiconductor layer 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers that can function as a source and a drain; thus, contact resistance between the oxide conductor layer and the conductive layers that can function as a source and a drain can be reduced.

Although the transistors 401 to 406 in FIGS. 50A to 50F, FIGS. 51A to 51F, and FIGS. 52A to 52D are examples in which the oxide semiconductor layer 430 is a single layer, the oxide semiconductor layer 430 may be a stacked layer. FIG. 53A is a top view of the oxide semiconductor layer 430, and FIGS. 53B and 53C are cross-sectional views of the oxide semiconductor layer 430 having a two-layer structure of an oxide semiconductor layer 430a and an oxide semiconductor layer 430b. FIGS. 53D and 53E are cross-sectional views of the oxide semiconductor layer 430 having a three-layer structure of the oxide semiconductor layer 430a, the oxide semiconductor layer 430b, and an oxide semiconductor layer 430c.

The oxide semiconductor layers 430a and 430c can also be referred to as insulating layers because no channel region is formed therein.

Oxide semiconductor layers with different compositions, for example, can be used as the oxide semiconductor layer 430a, the oxide semiconductor layer 430b, and the oxide semiconductor layer 430c.

The oxide semiconductor layer 430 in the transistors 401 to 406 can be replaced by the oxide semiconductor layer 430 in FIGS. 53B and 53C or FIGS. 53D and 53E.

Figure 54A:
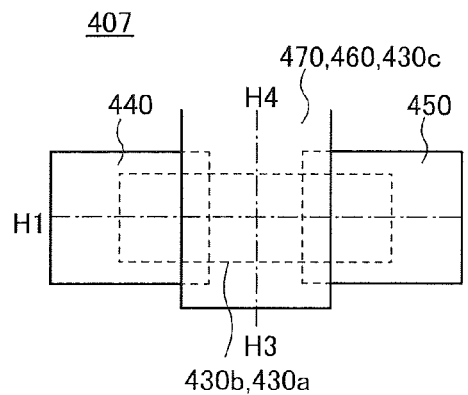
FIGS. 54A to 54F are top views and cross-sectional views illustrating transistors.
Figure 54B:
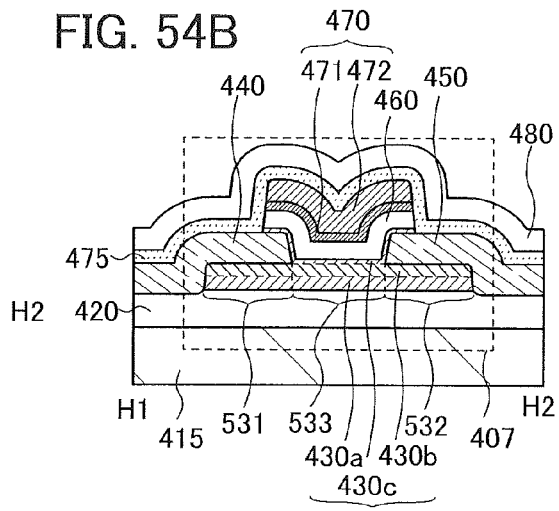
Figure 54C:
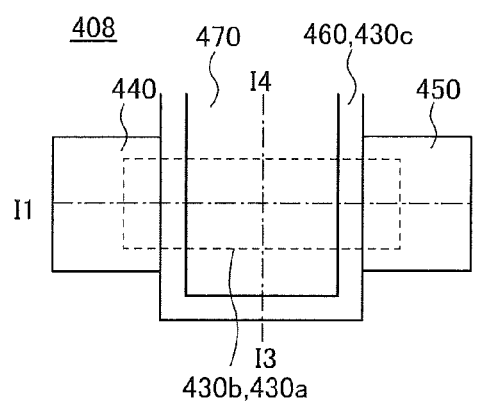
Figure 54D:
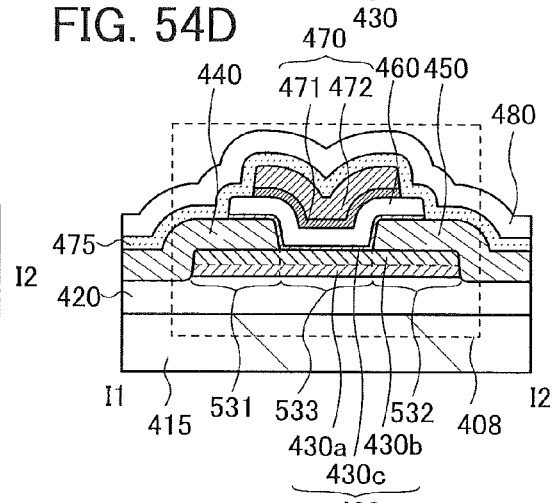
Figure 54E:
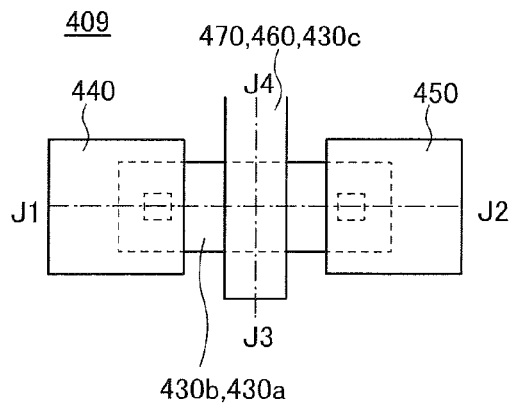
Figure 54F:
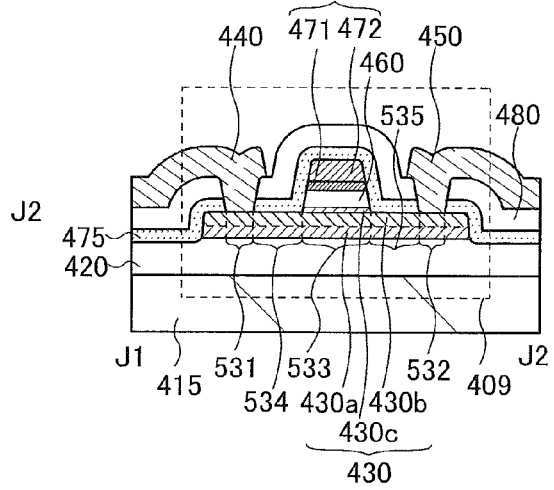
Figure 55A:
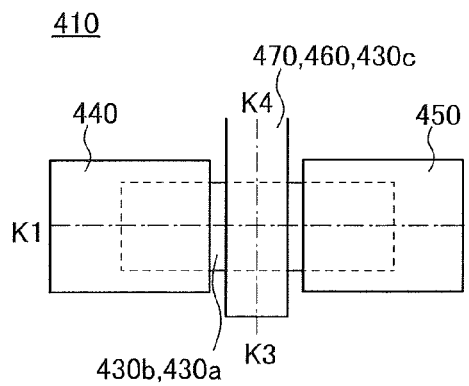
FIGS. 55A to 55F are top views and cross-sectional views illustrating transistors.
Figure 55B:
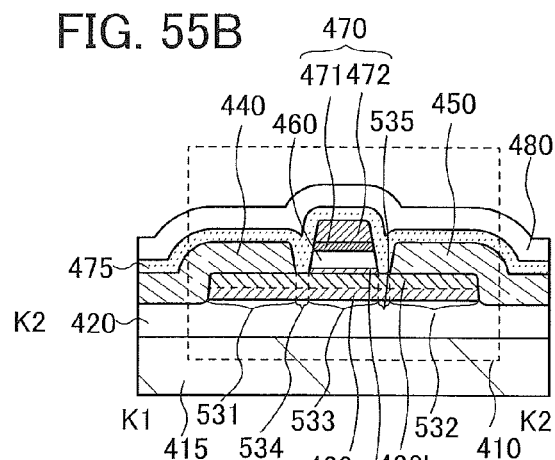
Figure 55C:
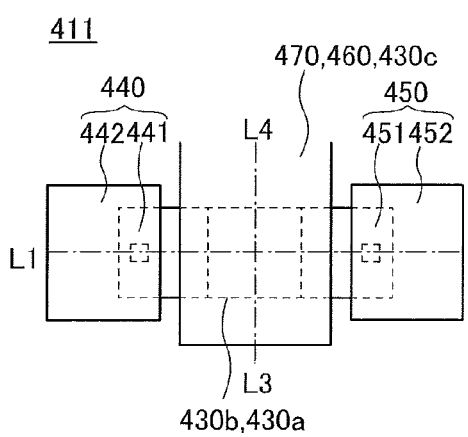
Figure 55D:
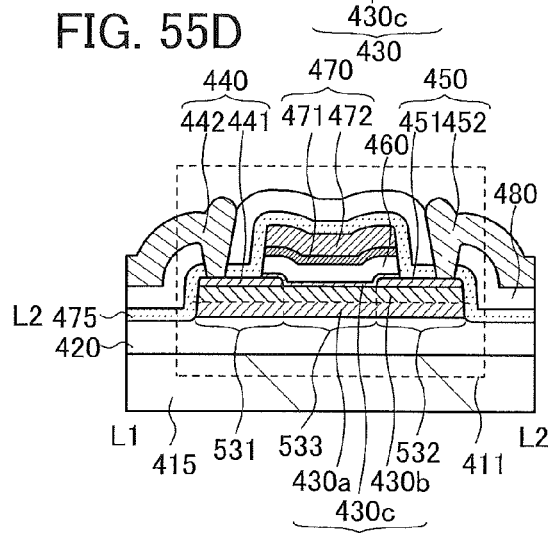
Figure 55E:
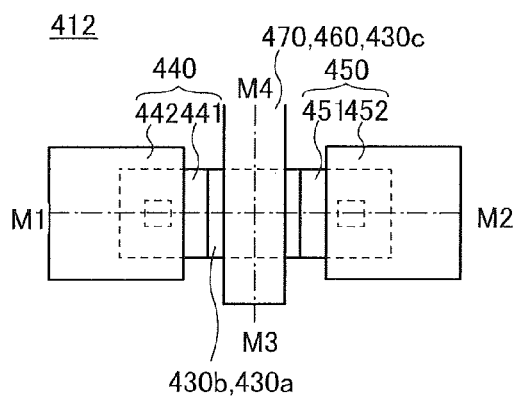
Figure 55F:
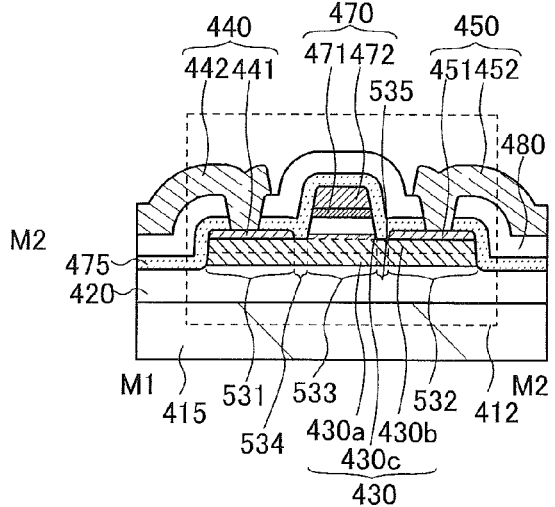
Figure 56A:
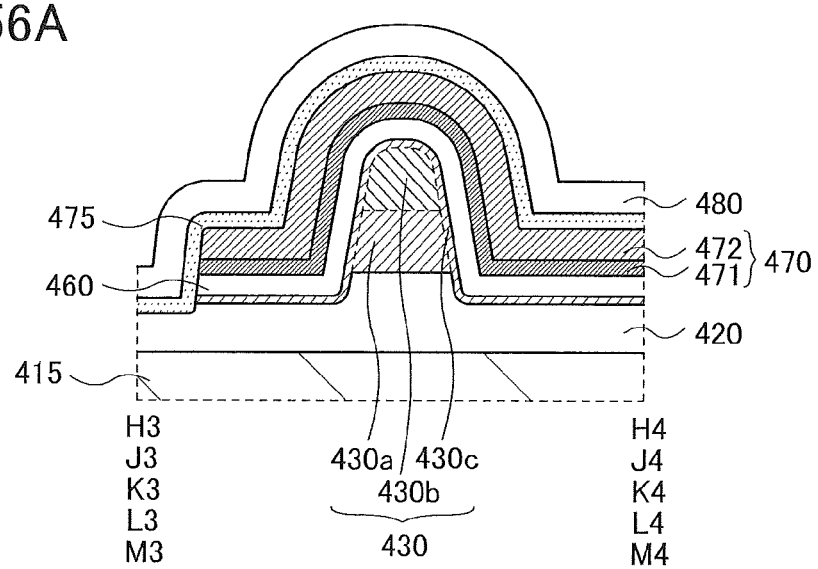
FIGS. 56A to 56D each illustrate a cross section of a transistor in a channel width direction.
Figure 56B:
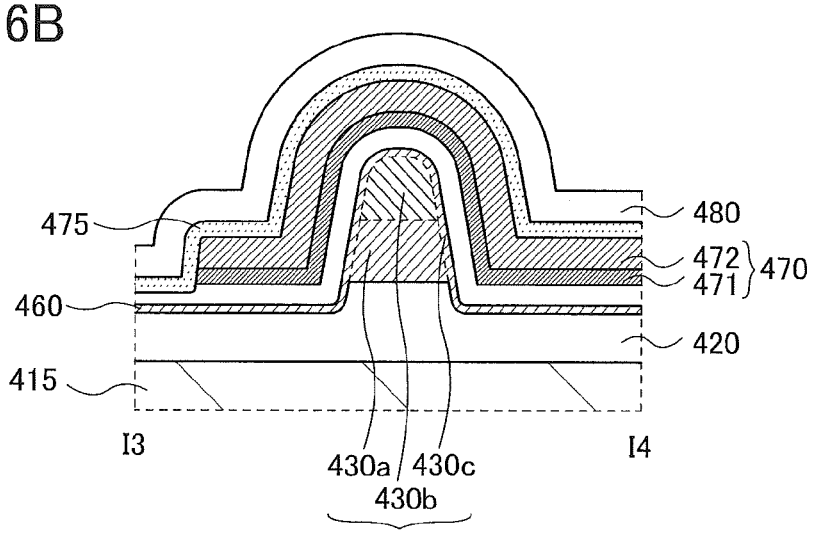

The transistor in one embodiment of the present invention may have a structure illustrated in FIGS. 54A to 54F, FIGS. 55A to 55F, and FIGS. 56A to 56D. FIGS. 54A, 54C, and 54E and FIGS. 55A, 55C, and 55E are top views of transistors 407, 408, 409, 410, 411, and 412, respectively. FIG. 54B is a cross section in the direction of dashed-dotted line H1-H2 in FIG. 54A. FIG. 54D is a cross section in the direction of dashed-dotted line I1-I2 in FIG. 54C. FIG. 54F is a cross section in the direction of dashed-dotted line J1-J2 in FIG. 54E. FIG. 55B is a cross section in the direction of dashed-dotted line K1-K2 in FIG. 55A. FIG. 55D is a cross section in the direction of dashed-dotted line L1-L2 in FIG. 55C. FIG. 55F is a cross section in the direction of dashed-dotted line M1-M2 in FIG. 55E. FIG. 56A illustrates each of cross sections in the directions of dashed-dotted lines H3-H4 in FIG. 54A, J3-J4 in FIG. 54E, K3-K4 in FIG. 55A, L3-L4 in FIG. 55C, and M3-M4 in FIG. 55E. FIG. 56B is a cross section in the direction of dashed-dotted line I3-I4 in FIG. 54C. The directions of dashed-dotted lines H1-H2, I1-I2, J1-J2, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 440 and 450.

The transistors 409, 410, and 412 each have the same structure as the transistors 403, 404, and 406 except that the oxide semiconductor layer 430 includes two layers (the oxide semiconductor layers 430a and 430b) in the regions 531, 532, 534, and 535 and that the oxide semiconductor layer 430 includes three layers (the oxide semiconductor layers 430a to 430c) in the region 533.

The transistor 411 has the same structure as the transistor 405 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 441 and 451.

Figure 52C:
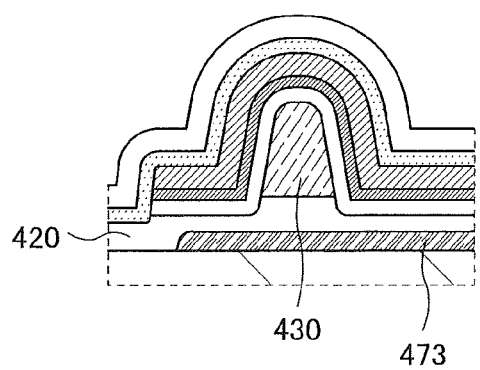
Figure 53A:
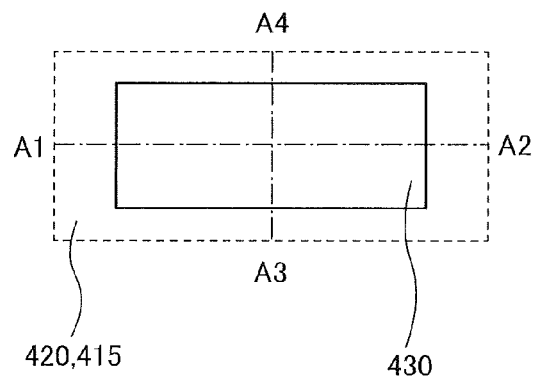
FIGS. 53A to 53E are a top view and cross-sectional views illustrating semiconductor layers.
Figure 53B:
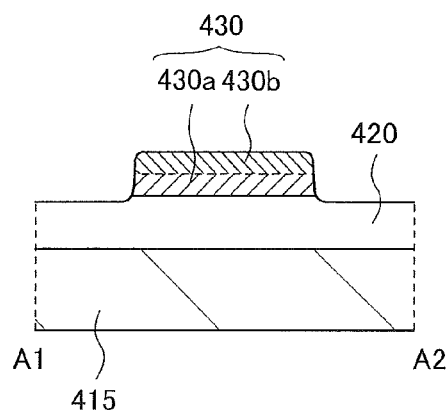
Figure 53D:
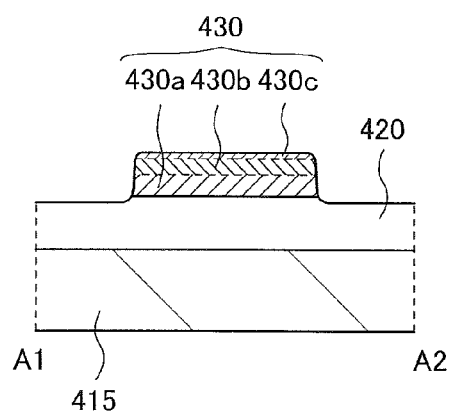
Figure 53C:
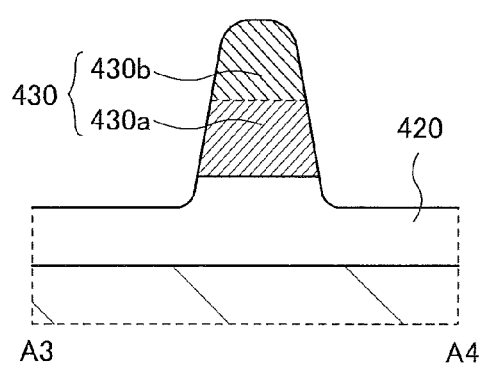
Figure 53E:
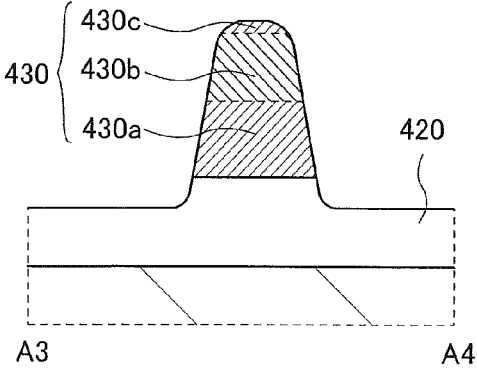
Figure 56C:
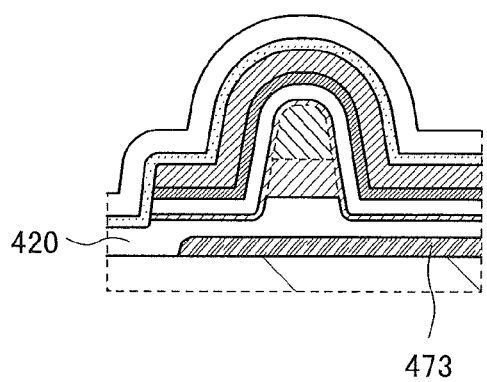

The transistor in one embodiment of the present invention may include a conductive layer 473 between the oxide semiconductor layer 430 and the substrate 415 as illustrated in cross-sectional views in the channel length directions of the transistors 401 to 412 illustrated in FIGS. 57A to 57F and FIGS. 58A to 58F, the cross-sectional view in the channel width direction of each of the transistors 401 to 406 illustrated in FIG. 52C, and the cross-sectional view in the channel width direction of each of the transistors 407 to 412 illustrated in FIG. 56C. The conductive layer 473 is used as a second gate electrode (also referred to as a back gate electrode), whereby the channel formation region in the oxide semiconductor layer 430 is electrically surrounded by the conductive layers 470 and 473. Such a transistor structure is referred to as a surrounded channel (s-channel) structure. Such a structure can increase the on-state current, and can control the threshold voltage. In the cross-sectional views in FIGS. 57A to 57F and FIGS. 58A to 58F, the width of the conductive layer 473 may be smaller than that of the oxide semiconductor layer 430. Moreover, the width of the conductive layer 473 may be shorter than that of the conductive layer 470.

Figure 52D:
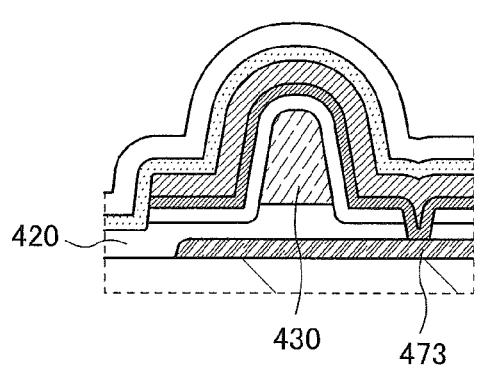
Figure 56D:
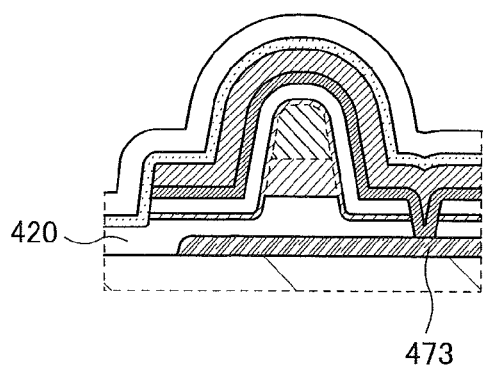
Figure 57A:
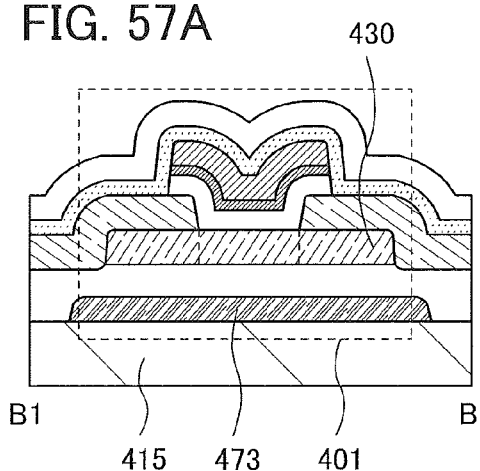
FIGS. 57A to 57F each illustrate a cross section of a transistor in a channel length direction.
Figure 57B:
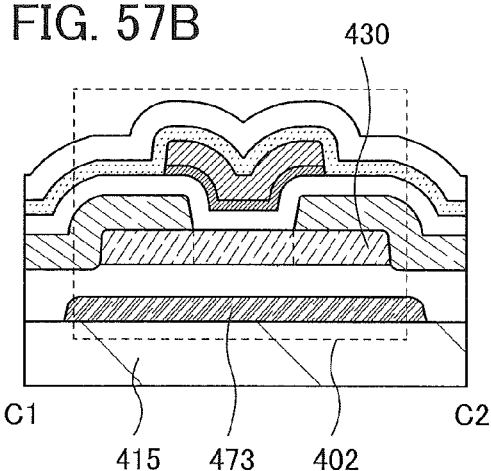
Figure 57C:
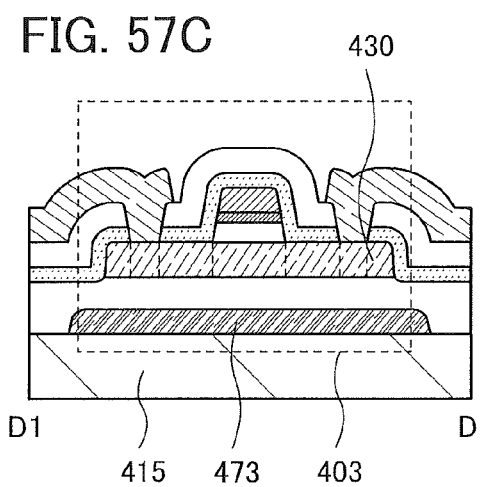
Figure 57D:
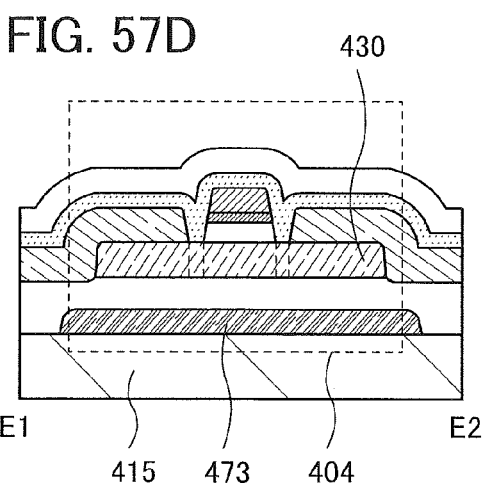
Figure 57E:
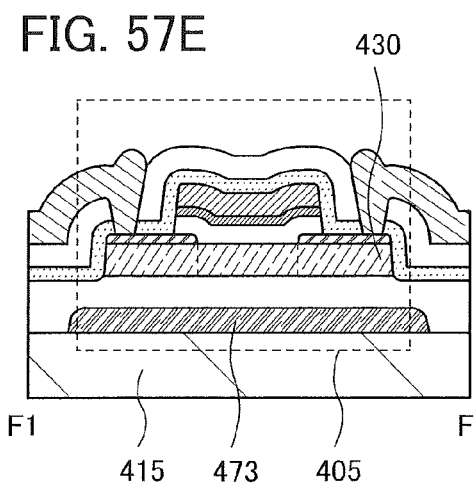
Figure 57F:
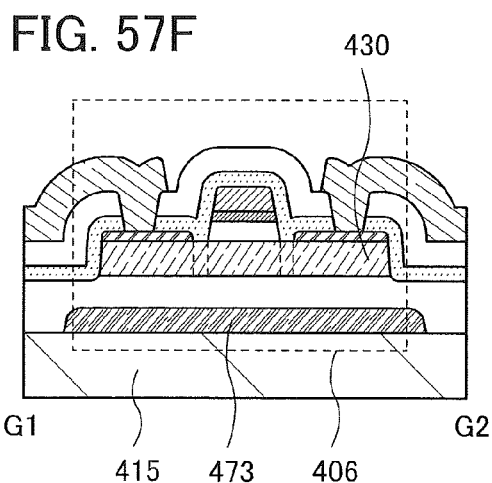
Figure 58A:
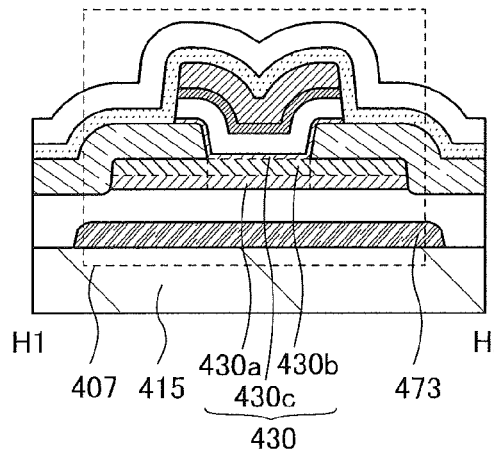
FIGS. 58A to 58F each illustrate a cross section of a transistor in a channel length direction.
Figure 58B:
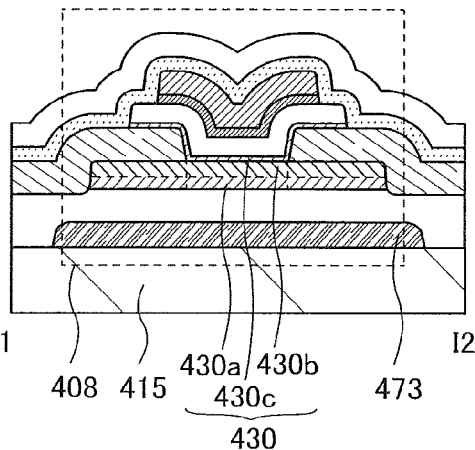
Figure 58C:
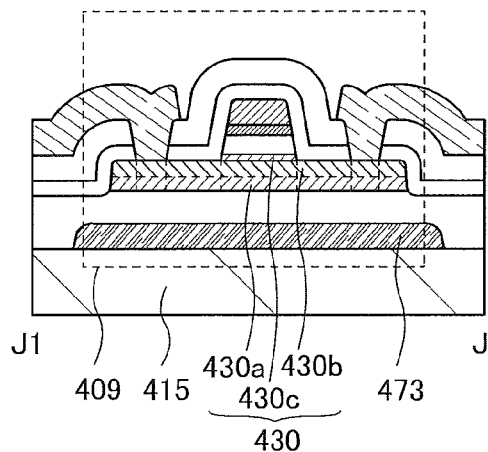
Figure 58D:
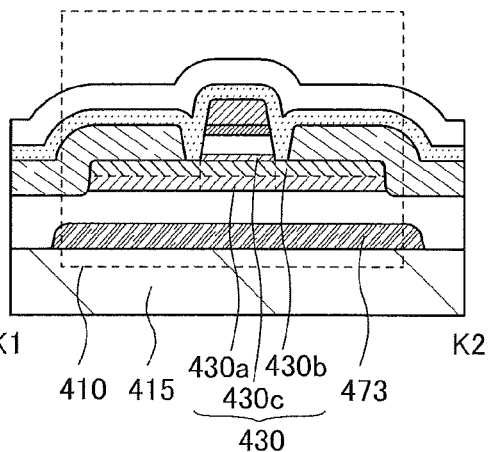
Figure 58E:
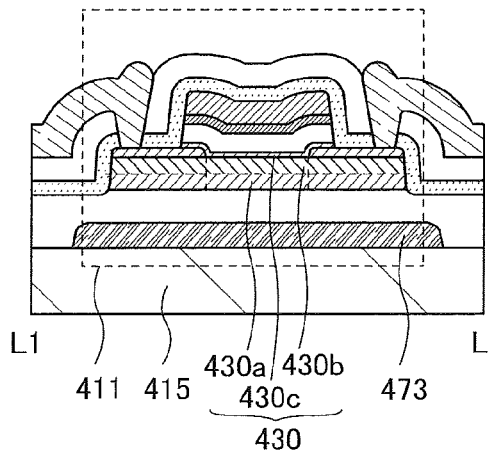
Figure 58F:
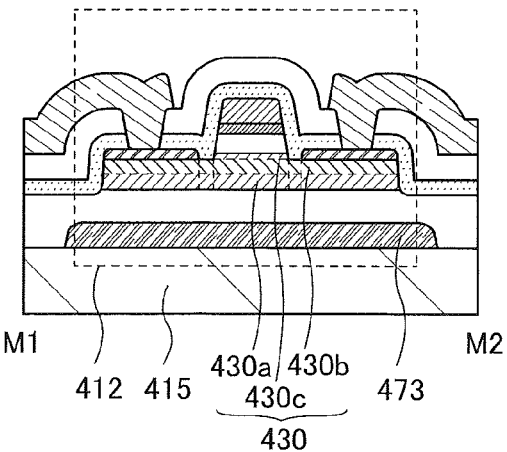

In order to increase the on-state current, for example, the conductive layers 470 and 473 are made to have the same potential, and the transistor is driven as a double-gate transistor. Furthermore, in order to control the threshold voltage, a fixed potential that is different from the potential of the conductive layer 470 is applied to the conductive layer 473. To set the conductive layers 470 and 473 at the same potential, for example, as illustrated in FIG. 52D and FIG. 56D, the conductive layers 470 and 473 may be electrically connected to each other through a contact hole.

Figure 59A:
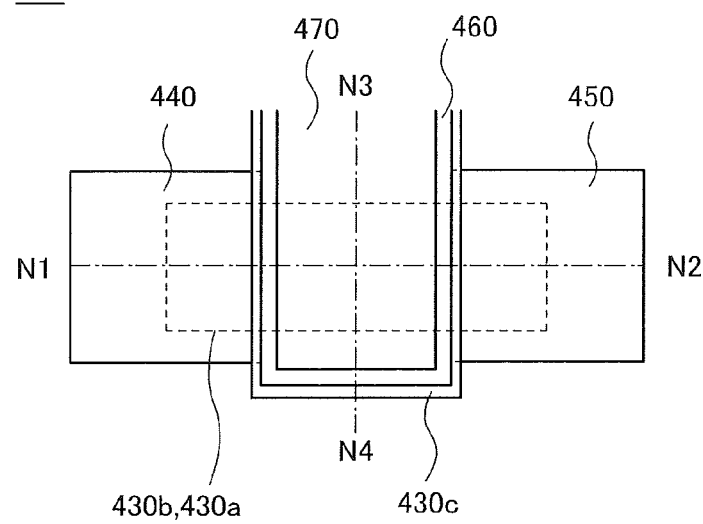
FIGS. 59A to 59C are a top view and cross-sectional views illustrating a transistor.
Figures 59B, 59C:
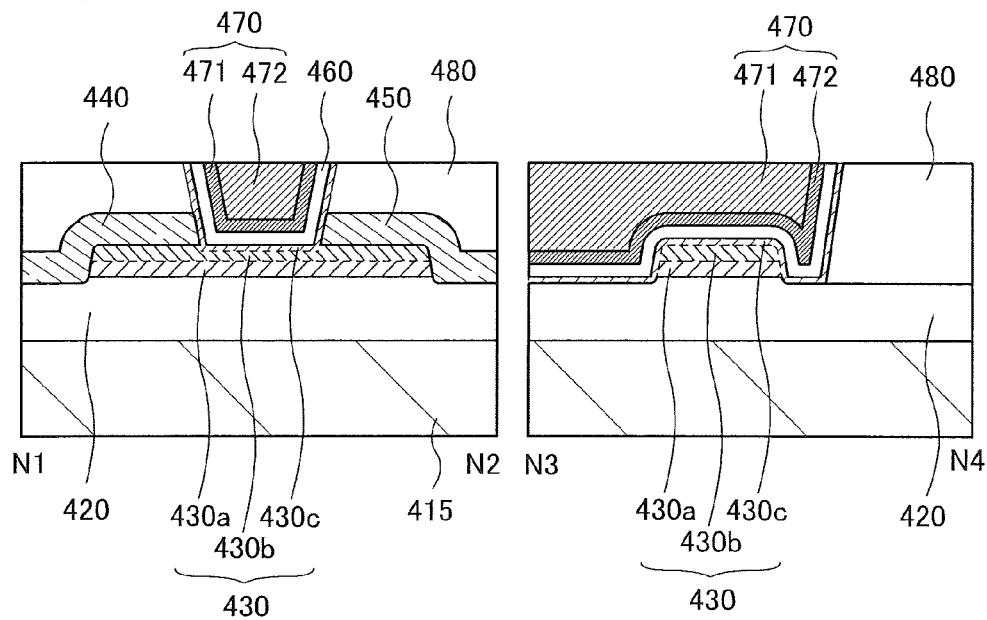

The transistor in one embodiment of the present invention may have a structure illustrated in FIGS. 59A to 59C. FIG. 59A is a top view. FIG. 59B illustrates a cross-sectional view taken along dashed-dotted line N1-N2 in FIG. 59A. FIG. 59C illustrates a cross-sectional view taken along dashed-dotted line N3 N4 in FIG. 59A. Note that for simplification of the drawing, some components are not illustrated in the top view in FIG. 59A.

In the transistor 413, the insulating layer 420 is in contact with the substrate 415; the oxide semiconductor layer 430 (the oxide semiconductor layers 430a to 430c) is in contact with the insulating layer 420; the conductive layer 440 and the conductive layer 450 are in contact with the oxide semiconductor layer 430b; the insulating layer 460 is in contact with the oxide semiconductor layer 430c; the conductive layer 470 is in contact with the insulating layer 460; and the insulating layer 480 is in contact with the insulating layer 420, the conductive layer 440, and the conductive layer 450. Note that the oxide semiconductor layer 430c, the insulating layer 460, and the conductive layer 470 are provided in an opening reaching the oxide semiconductor layer 430b in the insulating layer 480.

In the transistor 413, a region where the conductive layer 470 overlaps with the conductive layer 440 or the conductive layer 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 59B and 59C, the transistor 413 is preferably subjected to a chemical mechanical polishing (CMP) method or the like to have a flat top surface, although not necessarily.

Figure 60A:
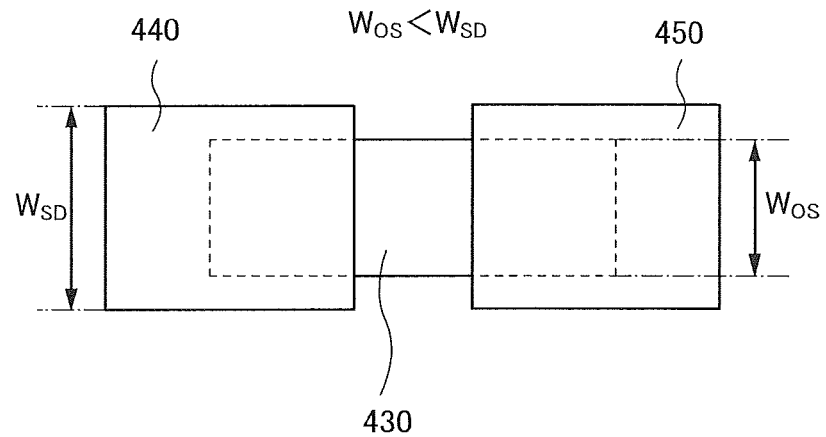
FIGS. 60A to 60C are top views each illustrating a transistor.
Figure 60B:
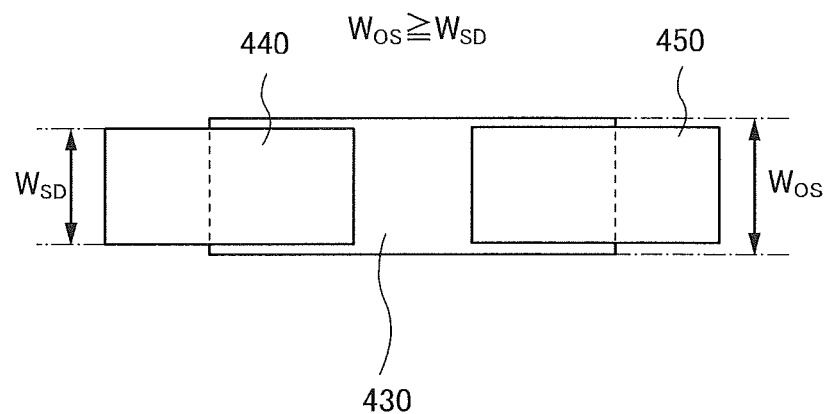
Figure 60C:
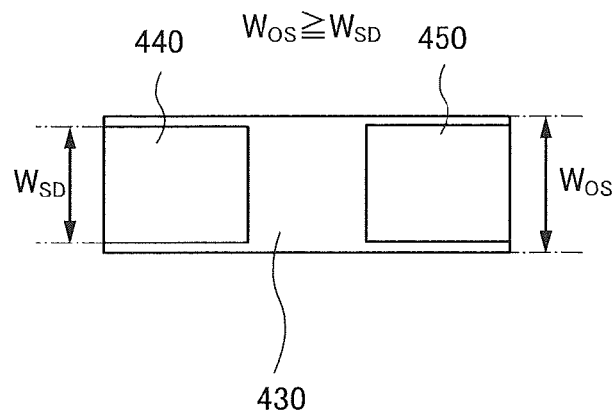

The conductive layer 440 and the conductive layer 450 in the transistor in one embodiment of the present invention may each have a width ($W_{SD}$) longer than the width ($W_{OS}$) of the oxide semiconductor layer as illustrated in the top view in FIG. 60A or shorter as illustrated in the top view in FIG. 60B. When $W_{OS} \geq W_{SD}$ ($W_{SD}$ is less than or equal to $W_{OS}$) is satisfied, a gate electric field is easily applied to the entire oxide semiconductor layer 430, so that electrical characteristics of the transistor can be particularly improved. As illustrated in FIG. 60C, the conductive layers 440 and 450 may be formed only in regions overlapping with the oxide semiconductor layer 430.

Note that FIGS. 60A to 60C only illustrate the oxide semiconductor layer 430, the conductive layer 440, and the conductive layer 450.

In the transistor including the oxide semiconductor layers 430a and 430b and the transistor including the oxide semiconductor layers 430a to 430c, selecting appropriate materials for the two or three layers forming the oxide semiconductor layer 430 makes current flow to the oxide semiconductor layer 430b. Since current flows to the oxide semiconductor layer 430b, the current is hardly influenced by interface scattering, leading to high on-state current. Thus, increasing the thickness of the oxide semiconductor layer 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 8

In this embodiment, components of the transistors described in Embodiment 7 will be described in detail.

As the substrate 415, a substrate similar to the substrate 300 described in Embodiment 6 can be used.

The insulating layer 420 can have a function of supplying oxygen to the oxide semiconductor layer 430 as well as a function of preventing diffusion of impurities from a component included in the substrate 415. For this reason, the insulating layer 420 is preferably an insulating layer containing oxygen and further preferably, the insulating layer 420 is an insulating layer containing oxygen in which the oxygen content is higher than that in the stoichiometric composition. The insulating layer 420 is, for example, a film in which the amount of released oxygen when converted into oxygen atoms is greater than or equal to $1.0 \times 10^{19}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 415 is provided with another device, the insulating layer 420 also functions as an interlayer insulating layer. In that case, the insulating layer 420 is preferably subjected to planarization treatment such as chemical mechanical polishing (CMP) treatment so as to have a flat surface.

For example, the insulating layer 420 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. The insulating layer 420 may be a stack of any of the above materials.

In this embodiment, detailed description is given mainly on the case where the oxide semiconductor layer 430 of the transistor has a three-layer structure in which the oxide semiconductor layers 430a, 430b, and 430c are sequentially stacked from the insulating layer 420 side.

Note that in the case where the oxide semiconductor layer 430 is a single layer, a layer corresponding to the oxide semiconductor layer 430b described in this embodiment is used.

In the case where the oxide semiconductor layer 430 has a two-layer structure, a stack in which layers corresponding to the oxide semiconductor layer 430a and the oxide semiconductor layer 430b described in this embodiment are sequentially stacked from the insulating layer 420 side is used. In such a case, the oxide semiconductor layers 430a and 430b can be replaced with each other.

In the case where the oxide semiconductor layer 430 has a layered structure of four or more layers, for example, a structure in which another oxide semiconductor layer is added to the three-layer stack of the oxide semiconductor layer 430 described in this embodiment can be employed.

For the oxide semiconductor layer 430b, for example, an oxide semiconductor whose electron affinity (an energy difference between a vacuum level and the conduction band minimum) is higher than those of the oxide semiconductor layers 430a and 430c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 430a and 430c each contain one or more kinds of metal elements contained in the oxide semiconductor layer 430b. For example, the oxide semiconductor layers 430a and 430c are preferably formed using an oxide semiconductor whose conduction band minimum is closer to a vacuum level than that of the oxide semiconductor layer 430b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 470, a channel is formed in the oxide semiconductor layer 430b whose conduction band minimum is the lowest in the oxide semiconductor layer 430.

Furthermore, since the oxide semiconductor layer 430a contains one or more kinds of metal elements contained in the oxide semiconductor layer 430b, an interface state is unlikely to be formed at the interface between the oxide semiconductor layers 430a and 430b, compared with the interface between the oxide semiconductor layer 430b and the insulating layer 420 on the assumption that the oxide semiconductor layer 430b is in contact with the insulating layer 420. The interface state sometimes forms a channel; therefore, the threshold voltage of the transistor is changed in some cases. Thus, with the oxide semiconductor layer 430a, variations in electrical characteristics of the transistor, such as a threshold voltage, can be reduced. Moreover, the reliability of the transistor can be improved.

Since the oxide semiconductor layer 430c contains one or more kinds of metal elements contained in the oxide semiconductor layer 430b, scattering of carriers is unlikely to occur at the interface between the oxide semiconductor layers 430b and 430c, compared with the interface between the oxide semiconductor layer 430b and the gate insulating layer (the insulating layer 460) on the assumption that the oxide semiconductor layer 430b is in contact with the gate insulating layer. Thus, with the oxide semiconductor layer 430c, the field-effect mobility of the transistor can be increased.

For the oxide semiconductor layers 430a and 430c, for example, a material containing Al, Ti, Ga, Ge, Y, Zr, Sn, La, Ce, or Hf with a higher atomic ratio than that used for the oxide semiconductor layer 430b can be used. Specifically, the atomic ratio of any of the above metal elements in the oxide semiconductor layers 430a and 430c is 1.5 times or more, preferably 2 times or more, and further preferably 3 times or more as large as that in the oxide semiconductor layer 430b. Any of the above metal elements is strongly bonded to oxygen and thus can have a function of suppressing generation of an oxygen vacancy in the oxide semiconductor layers 430a and 430c. That is, an oxygen vacancy is less likely to be generated in the oxide semiconductor layers 430a and 430c than in the oxide semiconductor layer 430b.

An oxide semiconductor that can be used for each of the oxide semiconductor layers 430a, 430b, and 430c preferably contains at least In or Zn. Both In and Zn are preferably contained. In order to reduce variations in electrical characteristics of the OS transistor, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where in is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 430a, 430b, and 430c is an In-M-Zn oxide containing at least indium, zinc, and M (M is a metal such as Al, Ti, Ga, Ge, Y, Zr, Sn, La, Ce, or Hf), in the case where the oxide semiconductor layer 430a has an atomic ratio of In to M and Zn which is $x_1:y_1:z_1$, the oxide semiconductor layer 430b has an atomic ratio of In to M and Zn which is $x_2:y_2:z_2$, and the oxide semiconductor layer 430c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, and further preferably 3 times or more as large as $y_2/x_2$. At this time, when $y_2$ is greater than or equal to $x_2$ in the oxide semiconductor layer 430b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 430a and 430c are preferably less than 50 atomic % and greater than 50 atomic %, respectively, and further preferably less than 25 atomic % and greater than 75 atomic %, respectively. Furthermore, in the case where Zn and O are not taken into consideration, the proportion of In and the proportion of M in the oxide semiconductor layer 430b are preferably greater than 25 atomic % and less than 75 atomic %, respectively, and further preferably greater than 34 atomic % and less than 66 atomic %, respectively.

The indium content in the oxide semiconductor layer 430b is preferably higher than those in the oxide semiconductor layers 430a and 430c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 430b, a transistor having high field-effect mobility can be obtained.

The thickness of the oxide semiconductor layer 430a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 430b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 430c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 430b is preferably thicker than the oxide semiconductor layer 430c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{15}/cm^3$, lower than $1\times10^{13}/cm^3$, lower than $8\times10^{11}/cm^3$, or lower than $1\times10^{8}/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 430a, 430b, and 430c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, and further preferably lower than $1\times10^{18}$ atoms/cm$^3$. The oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$. The concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, and further preferably lower than $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, and further preferably lower than $1\times10^{18}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating layer of the transistor, an insulating layer containing silicon is used in many cases; thus, it is preferable that, as in the transistor in one embodiment of the present invention, a region of the oxide semiconductor layer that serves as a channel not be in contact with the gate insulating layer for the above reason. In the case where a channel is formed at the interface between the gate insulating layer and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating layer.

Accordingly, with the oxide semiconductor layer 430 having a layered structure including the oxide semiconductor layers 430a, 430b, and 430c, a channel can be formed in the oxide semiconductor layer 430b; thus, the transistor can have high field-effect mobility and stable electrical characteristics.

In a band structure, the conduction band minimums of the oxide semiconductor layers 430a, 430b, and 430c are continuous. This can be understood also from the fact that the compositions of the oxide semiconductor layers 430a, 430b, and 430c are close to one another and oxygen is easily diffused among the oxide semiconductor layers 430a, 430b, and 430c. Thus, the oxide semiconductor layers 430a, 430b, and 430c have a continuous physical property though they have different compositions and form a stack. In the drawings, interfaces between the oxide semiconductor layers of the stack are indicated by dotted lines.

The oxide semiconductor layer 430 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 430a and 430c, and an In—Ga—Zn oxide whose atomic ratio of In to Ga and Zn is 1:1:1, 2:1:3, 5:5:6, or 3:1:2 can be used for the oxide semiconductor layer 430b. In each of the oxide semiconductor layers 430a to 430c, the proportion of each atom in the atomic ratio varies within a range of ±40% as a margin.

The oxide semiconductor layer 430b of the oxide semiconductor layer 430 serves as a well, so that a channel is formed in the oxide semiconductor layer 430b. Since the conduction band minimums are continuous, the oxide semiconductor layer 430 can also be referred to as a U-shaped well. Furthermore, a channel forming to have such a structure can also be referred to as a buried channel.

Note that trap levels due to impurities or defects might be formed in the vicinity of the interface between an insulating layer such as a silicon oxide film and each of the oxide semiconductor layers 430a and 430c. The oxide semiconductor layer 430b can be distanced away from the trap levels owing to the existence of the oxide semiconductor layers 430a and 430c.

However, when the energy differences between the conduction band minimum of the oxide semiconductor layer 430b and the conduction band minimum of each of the oxide semiconductor layers 430a and 430c are small, an electron in the oxide semiconductor layer 430b might reach the trap level by passing over the energy differences. When the electron is trapped in the trap level, negative charge is generated at the interface with the insulating layer, so that the threshold voltage of the transistor is shifted in the positive direction.

The oxide semiconductor layers 430a, 430b, and 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 440 functioning as one of a source and a drain and the conductive layer 450 functioning as the other of the source and the drain, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 405, 406, 411, and 412, for example, it is possible to use W for the conductive layers 441 and 451 and use a stack of Ti and Al for the conductive layers 442 and 452.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 440 and 450, the conductive layers 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 440 and 450 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 460 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 460 may be a stack including any of the above materials. The insulating layer 460 may contain La, N, Zr, or the like as an impurity.

An example of a layered structure of the insulating layer 460 is described. The insulating layer 460 includes, for example, oxygen, nitrogen, silicon, or hafnium. Specifically, the insulating layer 460 preferably includes hafnium oxide and silicon oxide or silicon oxynitride.

Hafnium oxide and aluminum oxide have higher dielectric constants than silicon oxide and silicon oxynitride. Therefore, the insulating layer 460 using hafnium oxide or aluminum oxide can have larger thickness than the insulating layer 460 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 420 and 460 in contact with the oxide semiconductor layer 430, a film that releases less nitrogen oxide is preferably used. In the case where the oxide semiconductor is in contact with an insulating layer that releases a large amount of nitrogen oxide, the density of states due to nitrogen oxide increases in some cases. The density of states due to nitrogen oxide can be formed in the energy gap of the oxide semiconductor. For the insulating layers 420 and 460, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 420 and 460, a shift in the threshold voltage of the transistor can be reduced, which leads to reduced fluctuations in the electrical characteristics of the transistor.

For the conductive layer 470 functioning as a gate, for example, a conductive layer formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 471 and tungsten is used for the conductive layer 472 to form the conductive layer 470.

As the insulating layer 475, a silicon nitride film, an aluminum nitride film, or the like containing hydrogen can be used. In the transistors 403, 404, 406, 409, 410, and 412 described in Embodiment 7, the use of an insulating layer containing hydrogen is used as the insulating layer 475 allows the oxide semiconductor layer 430 to be partly changed to n-type because the oxide semiconductor layer 430 is partly in contact with the insulating layer 475. In addition, a nitride insulating layer functions as a blocking film against moisture and the like and can improve the reliability of the transistor.

An aluminum oxide film can also be used as the insulating layer 475. It is particularly preferable to use an aluminum oxide film as the insulating layer 475 in the transistors 401, 402, 405, 407, 408, and 411 described in Embodiment 7. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 430, preventing release of oxygen from the oxide semiconductor layer, and preventing unnecessary release of oxygen from the insulating layer 420. Furthermore, oxygen contained in the aluminum oxide film can be diffused into the oxide semiconductor layer.

Furthermore, the insulating layer 480 is preferably formed over the insulating layer 475. The insulating layer 480 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 480 may be a stack of any of the above materials.

Here, like the insulating layer 420, the insulating layer 480 preferably contains oxygen more than that in the stoichiometric composition. Oxygen released from the insulating layer 480 can be diffused into the channel formation region in the oxide semiconductor layer 430 through the insulating layer 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor layer 430c is formed to cover the oxide semiconductor layer 430b where a channel is formed; thus, a channel formation layer is not in contact with the gate insulating layer. Accordingly, scattering of carriers at the interface between the channel formation layer and the gate insulating layer can be reduced and the on-state current of the transistor can be increased.

In the transistor in one embodiment of the present invention, as described above, the gate (the conductive layer 470) is formed to electrically surround the oxide semiconductor layer 430 in the channel width direction; accordingly, a gate electric field is applied to the oxide semiconductor layer 430 in the side surface direction in addition to the perpendicular direction. In other words, a gate electric field is applied to the entire channel formation layer and an effective channel width is increased, leading to a further increase in on-state current.

Furthermore, in the transistor in one embodiment of the present invention in which the oxide semiconductor layer 430 has a two-layer structure or a three-layer structure, since the oxide semiconductor layer 430b where a channel is formed is provided over the oxide semiconductor layer 430a, an interface state is less likely to be formed. In the transistor in one embodiment of the present invention in which the oxide semiconductor layer 430 has a three-layer structure, since the oxide semiconductor layer 430b is positioned at the middle of the three-layer structure, the influence of an impurity that enters from upper and lower layers on the oxide semiconductor layer 430b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Further more, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include MOCVD and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed with a deposition apparatus using ALD, an $In(CH_3)_3$ gas and an $O_3$ gas are sequentially introduced plural times to form an In—O layer, a $Ga(CH_3)_3$ gas and an $O_3$ gas are sequentially introduced plural times to form a Ga—O layer, and then a $Zn(CH_3)_2$ gas and an $O_3$ gas are sequentially introduced plural times to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 9

A structure of an oxide semiconductor layer that can be used in one embodiment of the present invention will be described below.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly includes the case where the angle is greater than or equal to $85°$ and less than or equal to $95°$. The term "substantially perpendicular" indicates that the angle formed between two straight lines is greater than or equal to $60°$ and less than or equal to $120°$.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Figure 61A:
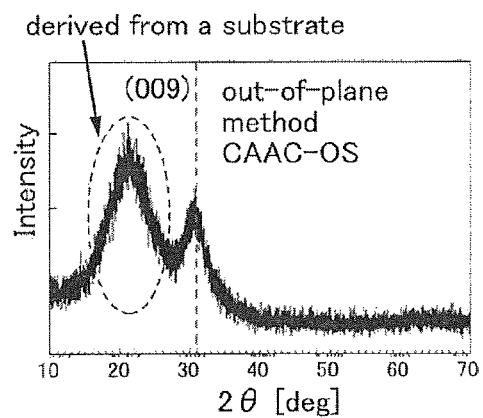
FIGS. 61A to 61E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO₄ crystal that is classified into the space group R-3m is analyzed by an out-of-plane method, a peak appears at a diffraction angle ($2\theta$) of around $31°$ as shown in FIG. 61A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 61B:
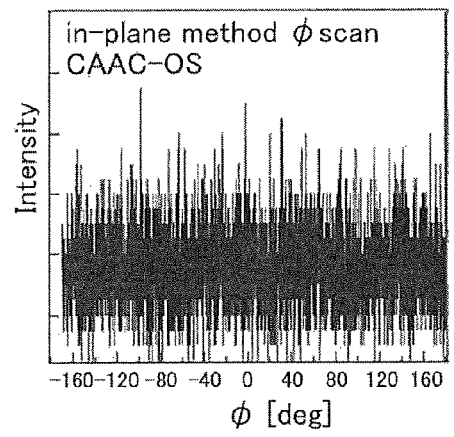
Figure 61C:
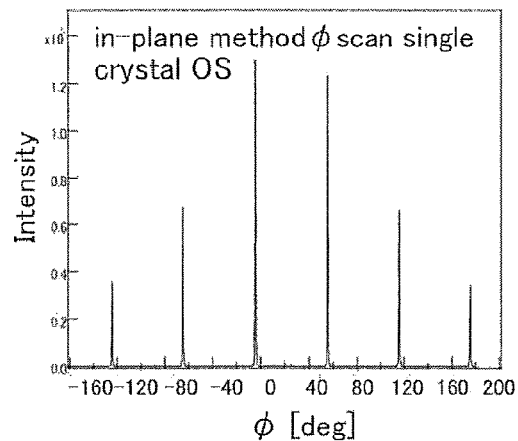

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 61B, a peak is not clearly observed. In contrast, in the case where single crystal InGaZnO$_4$ is subjected to φ scan with 2θ fixed at around 56°, as shown in FIG. 61C, six peaks which are derived from crystal planes equivalent to the (110) plane are observed. Accordingly, the structural analysis using XRD shows that the directions of a-axes and b-axes are irregularly oriented in the CAAC-OS.

Figure 61D:
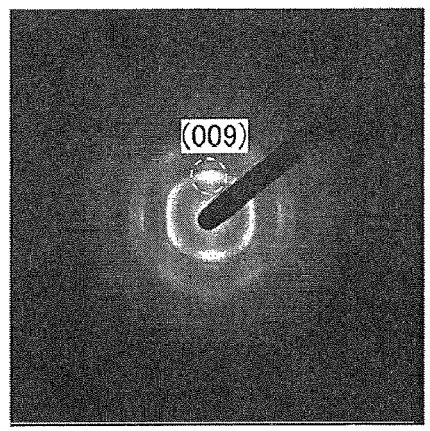
Figure 61E:
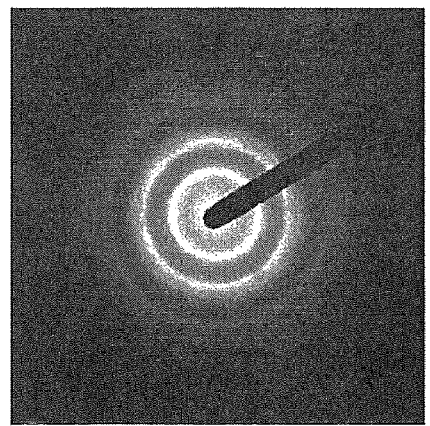

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 61D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 61E shows a diffraction pattern obtained in such a manner that an electron beam with a probe diameter of 300 nm is incident on the same sample in a direction perpendicular to the sample surface. As shown in FIG. 61E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 61E is considered to be derived from the (010) plane, the (100) plane, and the like of the InGaZnO$_4$ crystal. The second ring in FIG. 61E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 62A:
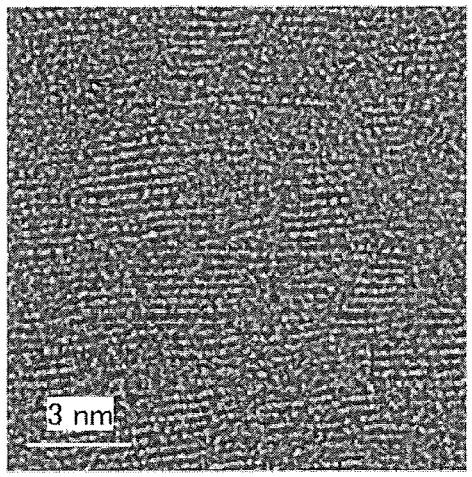
FIGS. 62A to 62E show a cross-sectional TEM image and plan-view TEM images of a CAAC-OS and images obtained through analysis thereof.

FIG. 62A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 62A shows pellets in which metal atoms are arranged in a layered manner. FIG. 62A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 62B:
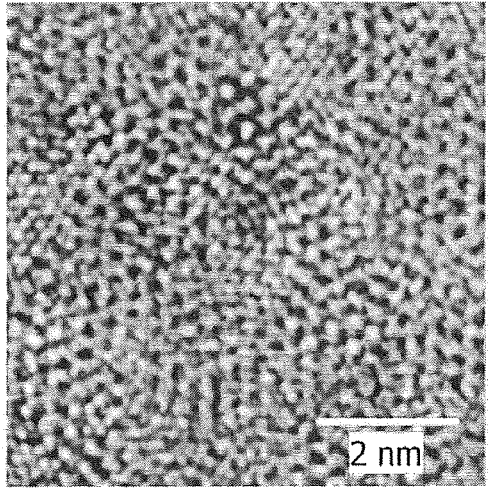
Figure 62C:
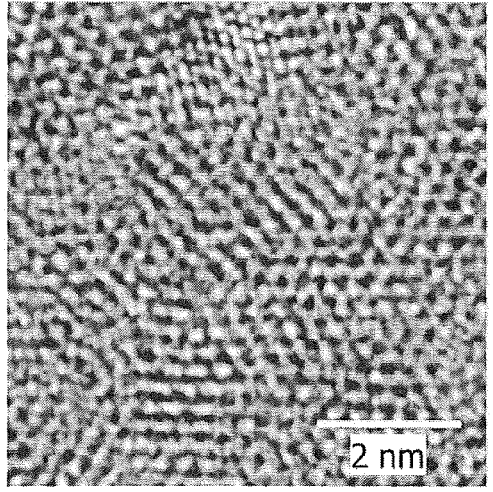
Figure 62D:
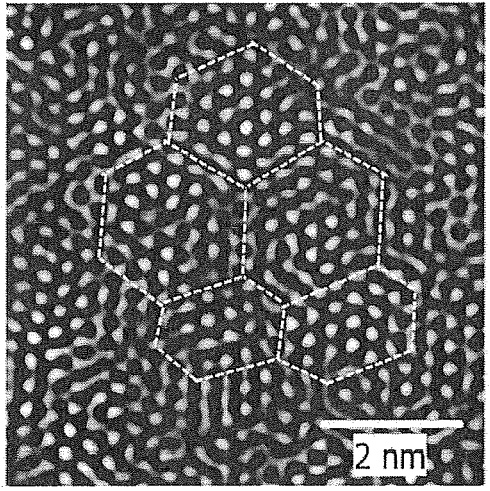
Figure 62E:
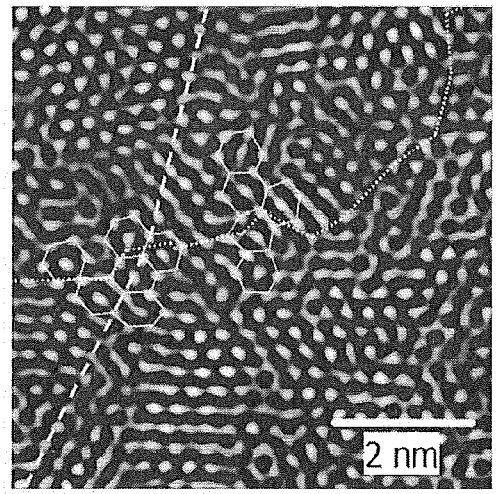

FIGS. 62B and 62C show Cs-corrected high-resolution TEM images of a plane of the CAAC-OS observed from a direction substantially perpendicular to the sample surface. FIGS. 62D and 62E are images obtained through image processing of FIGS. 62B and 62C. The method of image processing is as follows. The image in FIG. 62B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 62D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 62E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 63A:
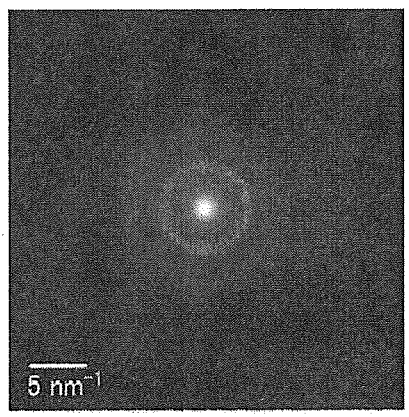
FIGS. 63A to 63D show electron diffraction patterns and a cross-sectional TEM image of an nc-OS.
Figure 63B:
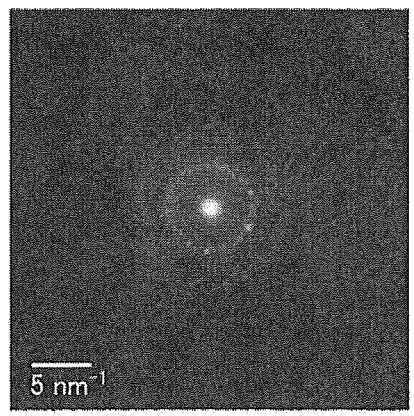

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 63A is observed. FIG. 63B shows a diffraction pattern obtained when an electron beam with a probe diameter of 1 nm is incident on the same sample. As shown in FIG. 63B, a plurality of spots are observed in a ring-like region. In other words, ordering in an nc-OS is not observed with an electron beam with a probe diameter of 50 nm but is observed with an electron beam with a probe diameter of 1 nm.

Figure 63C:
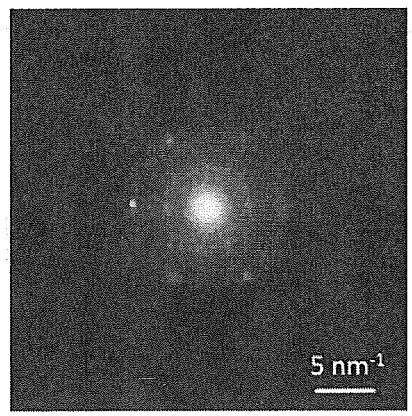

Furthermore, an electron diffraction pattern in which spots are arranged in an approximately hexagonal shape is observed in some cases as shown in FIG. 63C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 63D:
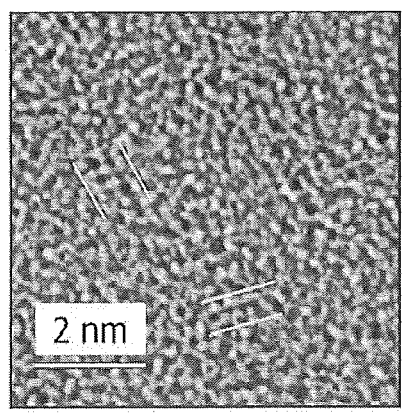

FIG. 63D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 63D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

FIGS. 64A and 64B are high-resolution cross-sectional TEM images of an a-like OS. FIG. 64A is the high-resolution cross-sectional TEM image of the a-like OS at the start of the electron irradiation. FIG. 64B is the high-resolution cross-sectional TEM image of a-like OS after the electron (e) irradiation at $4.3 \times 10^8$ $e^-/nm^2$. FIGS. 64A and 64B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 65:
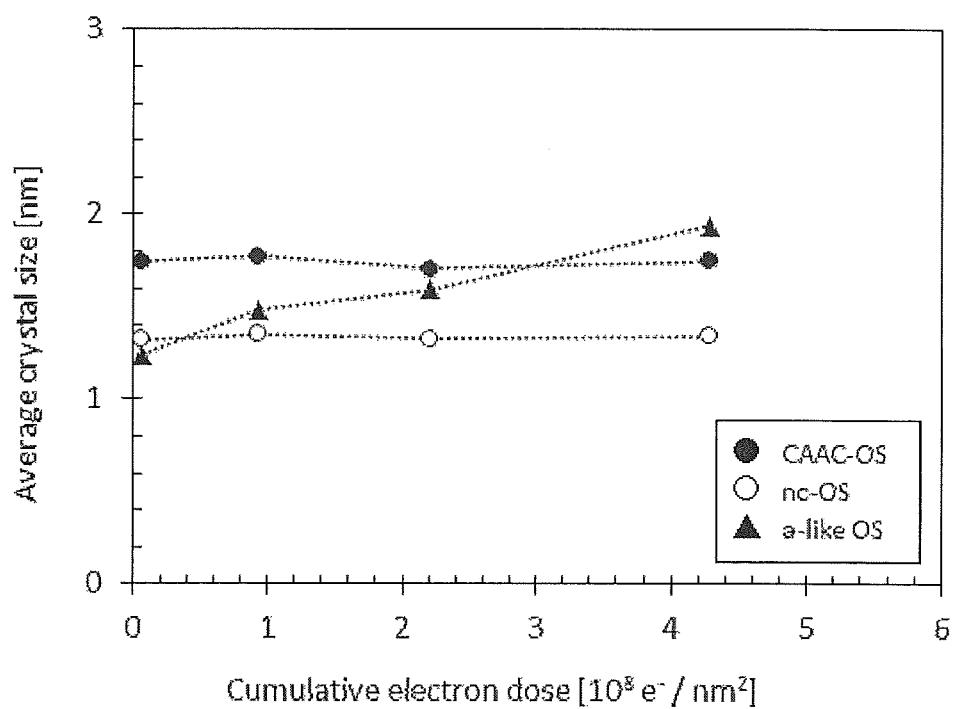
FIG. 65 shows a change of crystal parts of an In—Ga—Zn oxide due to electron irradiation.

FIG. 65 shows change in the average size of crystal parts (at 22 points to 30 points) in each sample. Note that the crystal part size corresponds to the length of a lattice fringe. FIG. 65 indicates that the crystal part size in the a-like OS increases with an increase in the cumulative electron dose in obtaining TEM images, for example. As shown in FIG. 65, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 65, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_OH$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$–$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The structures described in this embodiment can be used in appropriate combination with any of the structures described in the other embodiments.

Embodiment 10

In this embodiment, examples of a package and a module each including an image sensor chip will be described. The image sensor chip can employ the configuration of the imaging device of one embodiment of the present invention.

Figure 66A:
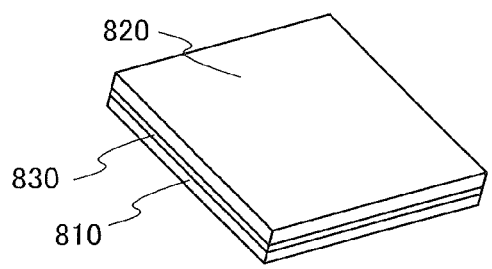
FIGS. 66A to 66D are perspective views and a cross-sectional view illustrating a package including an imaging device.

FIG. 66A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 66B:
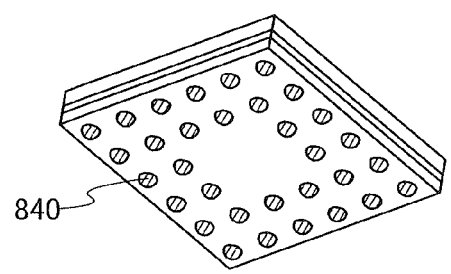

FIG. 66B is an external perspective view showing the bottom surface side of the package. The package has a ball grid array (BGA) structure including solder balls as bumps 840 on the bottom surface. Instead of the BGA, a land grid array (LGA), a pin grid array (PGA), or the like may be employed.

Figure 66C:
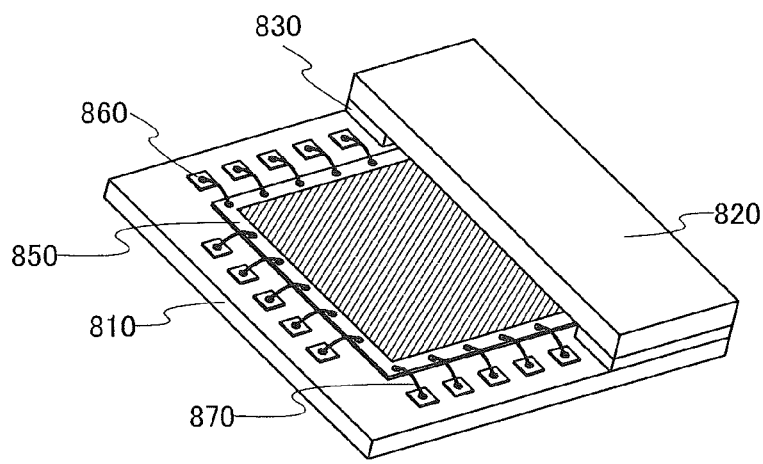
Figure 66D:
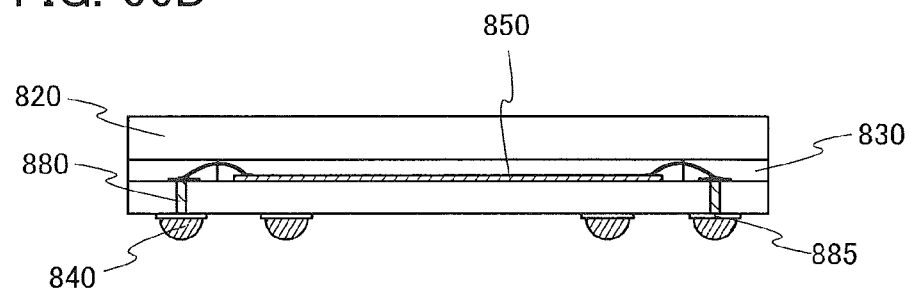

FIG. 66C is a perspective view of the package in which the cover glass 820 and the adhesive 830 are partly illustrated. FIG. 66D is a cross sectional view of the package. Electrode pads 860 are formed over the package substrate 810, and the electrode pads 860 and the bumps 840 are electrically connected via through holes 880 and lands 885. The electrode pads 860 are electrically connected to electrodes of the image sensor chip 850 through wires 870.

Figure 67A:
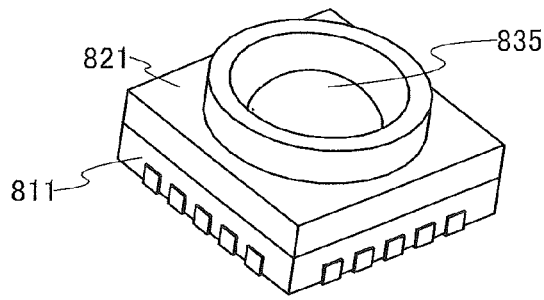
FIGS. 67A to 67D are perspective views and a cross-sectional view illustrating a package including an imaging device.

FIG. 67A is an external perspective view showing the top surface side of a camera module in which an image sensor chip and a lens integrated with each other in a package. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 67B:
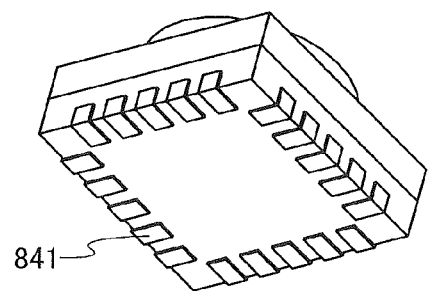

FIG. 67B is an external perspective view showing the bottom surface side of the camera module. Here, a quad flat no-lead package (QFN) is employed in which mounting lands 841 are provided on the bottom surface and four side surfaces of the package substrate 811. This structure is only an example; a quad flat package (QFP), the above-described BGA, or the like may be alternatively employed.

Figure 67C:
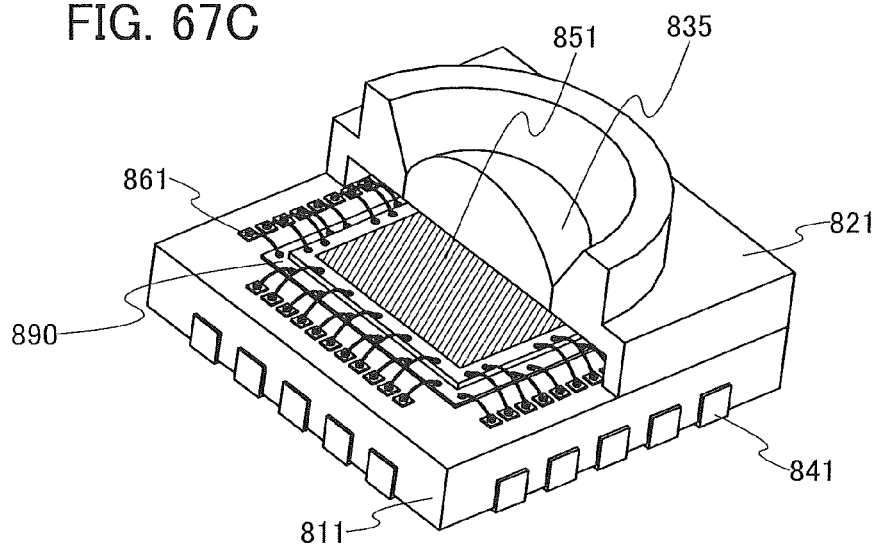
Figure 67D:
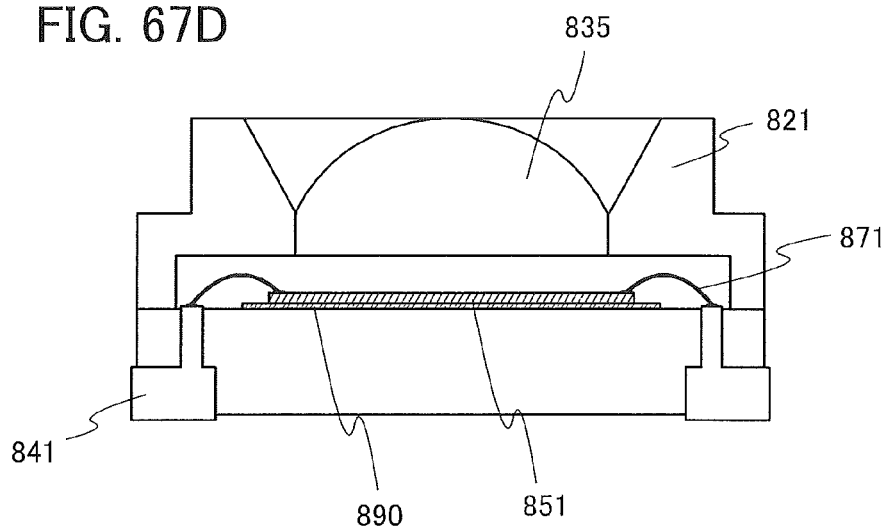

FIG. 67C is a perspective view of the module in which the lens cover 821 and the lens 835 are partly illustrated. FIG. 67D is a cross-sectional view of the camera module. Some of the lands 841 are used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 11

In this embodiment, examples of an electronic device in which a display system using the imaging device and the display device of one embodiment of the present invention can be used will be described.

Examples of an electronic device in which the imaging device of one embodiment of the present invention can be used are as follows: display devices such as televisions and monitors, lighting devices, desktop personal computers and notebook personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by electric motors using power are also included in the category of electronic appliances. Examples of the moving objects are electric vehicles (EV), hybrid electric vehicles (REV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 68A:
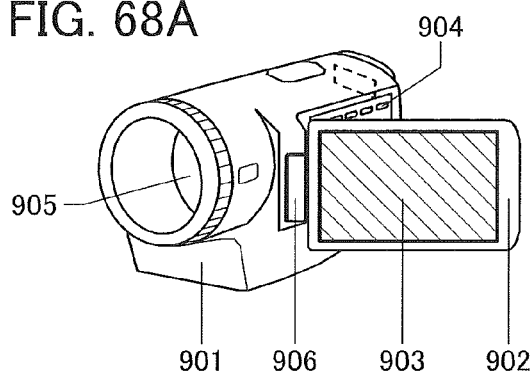
FIGS. 68A to 68F each illustrate an electronic device.

FIG. 68A illustrates a video camera, which includes a housing 901, a housing 902, a display portion 903, operation keys 904, a lens 905, a joint 906, and the like. The operation keys 904 and the lens 905 are provided for the housing 901, and the display portion 903 is provided for the housing 902. The housing 901 and the housing 902 are connected to each other with the joint 906, and the angle between the housing 901 and the housing 902 can be changed with the joint 906. Images displayed on the display portion 903 may be switched in accordance with the angle at the joint 906 between the housing 901 and the housing 902. An imaging device can be provided in a focus position of the lens 905. The imaging device and the display portion 903 can form the display system of one embodiment of the present invention.

Figure 68B:
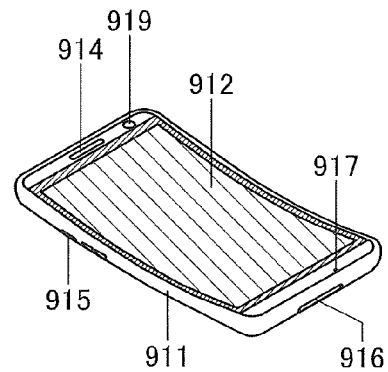

FIG. 68B illustrates a mobile phone, which includes a display portion 912, a microphone 917, a speaker 914, a camera 919, an input/output terminal 916, an operation button 915, and the like in a housing 911. The display system of one embodiment of the present invention can be used for the camera 919 and the display portion.

Figure 68C:
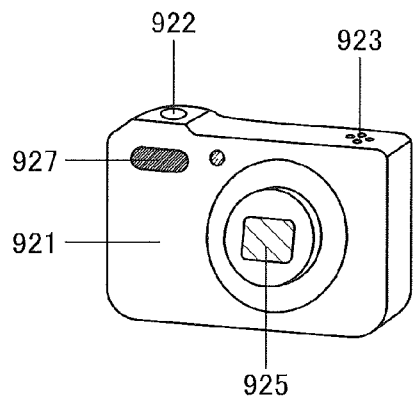

FIG. 68C illustrates a digital camera, which includes a housing 921, a shutter button 922, a microphone 923, a light-emitting portion 927, a lens 925, and the like. An imaging device can be provided in a focus position of the lens 925. The imaging device and a display portion (not illustrated) in the housing 921 can form the display system of one embodiment of the present invention.

Figure 68D:
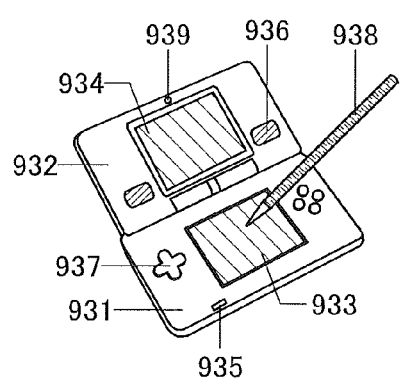

FIG. 68D illustrates a portable game console, which includes a housing 931, a housing 932, a display portion 933, a display portion 934, a microphone 935, a speaker 936, an operation key 937, a stylus 938, a camera 939, and the like. Although the portable game console in FIG. 68D has the two display portions 933 and 934, the number of display portions included in a portable game console is not limited to this. The display system of one embodiment of the present invention can be used for the camera 939 and the display portion 933.

Figure 68E:
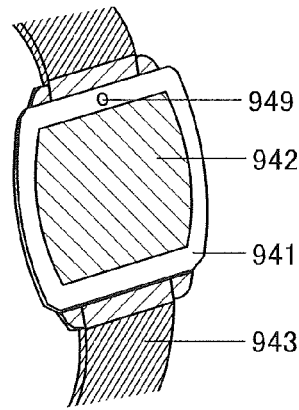

FIG. 68E shows a wrist-watch-type information terminal, which includes a housing 941, a display portion 942, a wristband 943, a camera 949, and the like. The display portion 942 may be a touch panel. The display system of one embodiment of the present invention can be used for the camera 949 and the display portion 942.

Figure 68F:
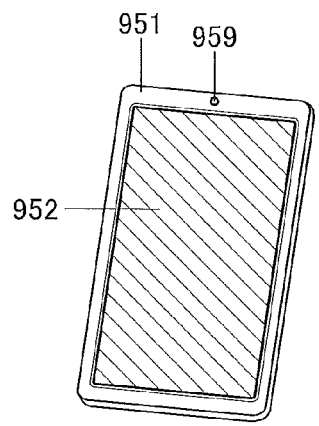

FIG. 68F shows a portable data terminal, which includes a housing 951, a display portion 952, a camera 959, and the like. A touch panel function of the display portion 952 enables input and output of information. The display system of one embodiment of the present invention can be used for the camera 959 and the display portion 952.

Note that the examples are not limited to the above-described electronic devices as long as an imaging device and a display device to which the display system of one embodiment of the present invention can be applied.

This embodiment can be combined with any of the other embodiments in this specification as appropriate.

Example 1

The calculation results of energy consumption of the imaging device 10 with the configuration described in Embodiment 2 will be described in this example. In addition, the calculation results of power consumption of a display system in which the imaging device 10 with the configuration described in Embodiment 2 is combined with the display device 50 will be described.

Figure 69A:
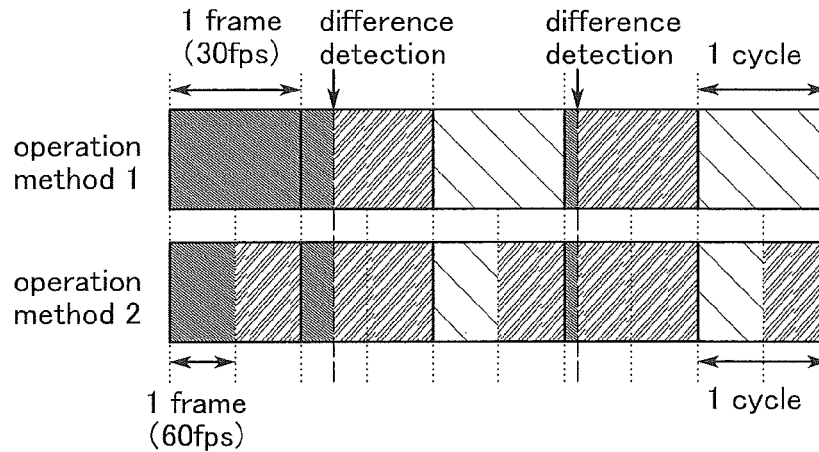
FIGS. 69A to 69C illustrate the operations of an imaging device.
Figure 69B:
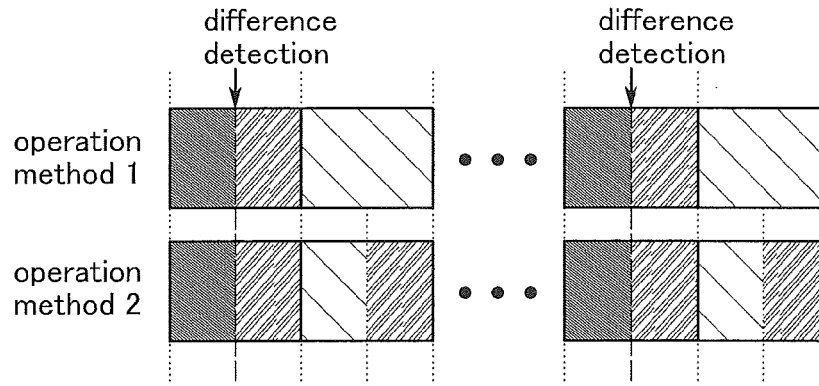
Figure 69C:
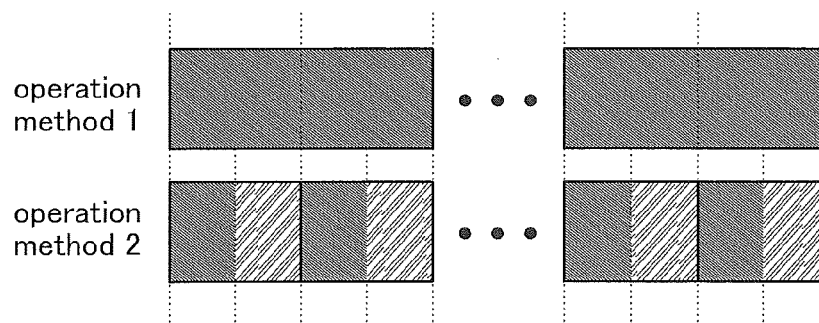

The energy consumption of the imaging device 10 was calculated in both cases where the imaging device 10 operates in an operation method 1 and an operation method 2 illustrated in FIGS. 69A to 69C. FIG. 69A is a schematic diagram illustrating the operation method 1 and the operation method 2. Note that the frame frequency was set to 30 fps in the operation method 1 and 60 fps in the operation method 2. The time it takes to capture one frame imaging data in the first imaging mode at a frame frequency of 30 fps was regarded as one cycle. That is, one cycle was 33.3 ms. In the operation method 1 and the operation method 2, the transition to the first imaging mode or to the second imaging mode can be made when the cycle terminates.

Difference detection in the second imaging mode was performed in each of the operation method 1 and the operation method 2. In the case where a difference was detected during a cycle, the transition from the second imaging mode to the standby mode was made, in which case the transition from the standby mode to the first imaging mode was made when the cycle terminated. Since the frame frequency in the operation method 2 was 60 fps, which was twice as high as that in the case of the operation method 1, each of the first imaging mode and the second imaging mode can be completed in the first half of a cycle. Thus, regardless of the modes, the latter half of each cycle was set to the standby mode. Note that in this example, power gating was performed in the standby mode.

FIG. 69B is a schematic diagram illustrating the operation method 1 and the operation method 2 in the case where a difference is detected in every difference detection in the second imaging mode. A cycle in the second imaging mode and a cycle in the first imaging mode are alternately performed in either the operation method 1 or the operation method 2.

FIG. 69C is a schematic diagram illustrating the operation method 1 and the operation method 2 in the case where a difference is not detected in any difference detection in the second imaging mode. In the operation method 1, only the operation in the second imaging mode is performed. In the operation method 2, the operation in the second imaging mode and the operation in the standby mode are alternately performed every 16.7 ms, which is half of one cycle.

Figure 70A:
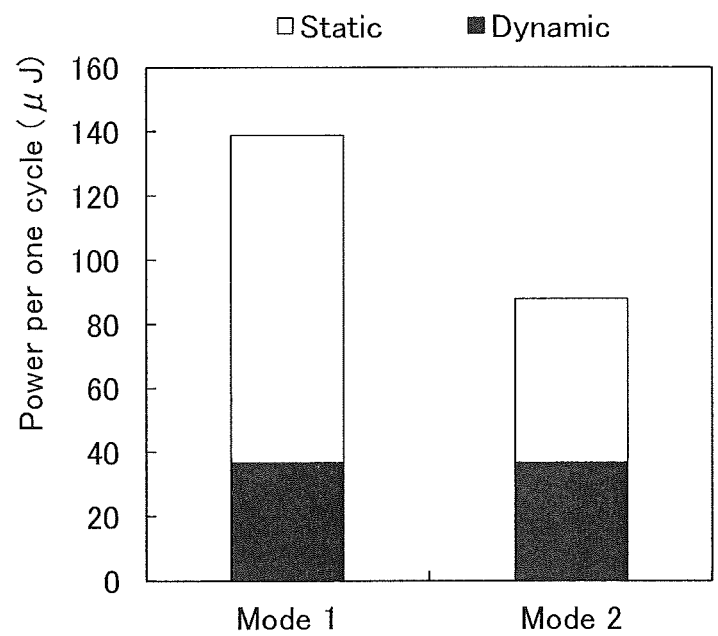
FIGS. 70A and 70B show energy consumption of an imaging device.
Figure 70B:
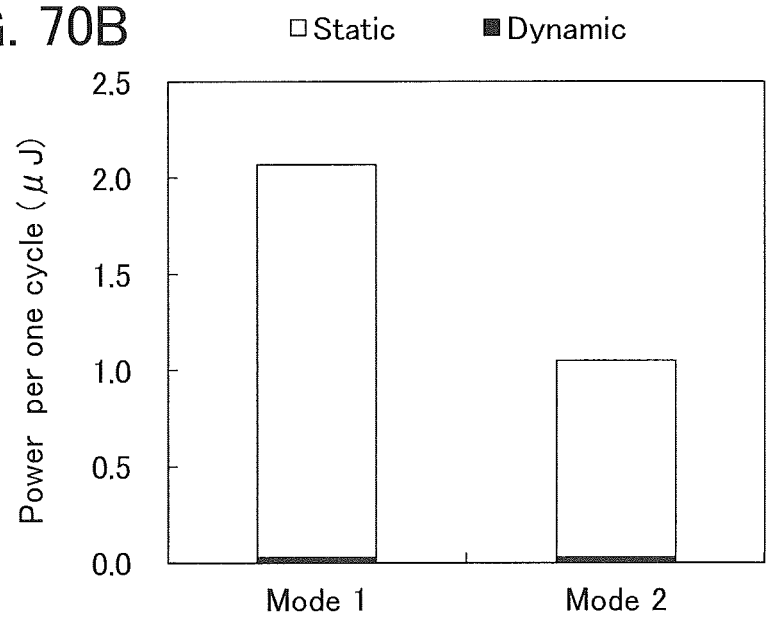

FIG. 70A shows the calculation results of static energy consumption and dynamic energy consumption per cycle in the case where a difference is detected in every difference detection as in FIG. 69B. FIG. 70B shows the calculation results of static energy consumption and dynamic energy consumption per cycle in the case where a difference is not detected in any difference detection as in FIG. 69C. Note that static energy consumption is energy consumption independent of the frame frequency, and dynamic energy consumption is energy consumption dependent on the frame frequency.

FIG. 70A shows that, in the case where a difference is detected in every detection, energy consumption is 36.7% lower in the operation method 2 than in the operation method 1. FIG. 70B shows that, in the case where a difference is detected in every detection, energy consumption is 49.3% lower in the operation method 2 than in the operation method 1.

Power consumption was calculated for a system 0, a system 1, and a system 2 listed in Table 1. The system 0 is a display system, which is a combination of a conventional imaging device that does not have a function of imaging in the second imaging mode and a conventional display device that does not have a function of displaying in the second display mode. The system 1 is a display system, which is a combination of a conventional imaging device that does not have a function of imaging in the second imaging mode and the display device 50 that has a function of displaying in the second display mode. The system 2 is a display system, which is a combination of the imaging device 10 that has a function of imaging in the second imaging mode and the display device 50 that has a function of displaying in the second display mode.

TABLE 1

| | | System 0 | System 1 (difference detection every time) | System 1 (no difference detection every time) | System 2 (difference detection every time) | System 2 (no difference detection every time) |
|---|---|---|---|---|---|---|
| Imaging device | Frame rate (fps) | 15 | 15 | 15 | 60 | 60 |
| | Outputs of first imaging data (times/s) | 15 | 15 | 15 | 15 | 0 |
| | Function of imaging in second imaging mode | x | x | x | ○ | ○ |
| Display device | Frame rate (fps) | 60 | 15 | 0 | 15 | 0 |
| | Function of displaying in second display mode | x | ○ | ○ | ○ | ○ |

In the system 0, the frame rate of the imaging device is 15 fps and the frame rate of the display device is 60 fps. This means that the display device performs refresh operation three times (once per 16.7 ins) after imaging data captured by the imaging device is supplied as image data to the display device. In the system 1, imaging data captured in the first imaging mode is digitally compared in two consecutive frames; only when a difference is detected, image data retained in the display device 50 is rewritten. In the system 2, the imaging device 10 operates in the operation method 2, and image data retained in the display device 50 is rewritten only when a difference is detected.

Figure 71A:
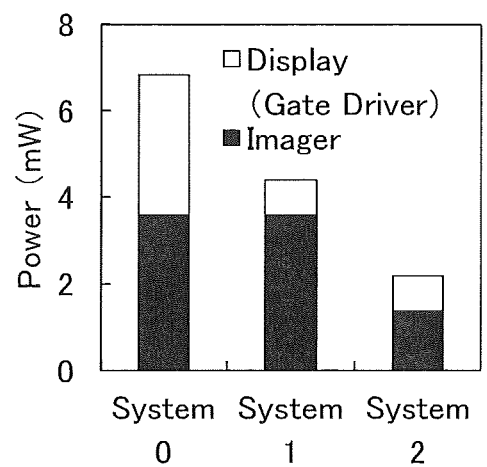
FIGS. 71A and 71B show power consumption of imaging devices and display devices.
Figure 71B:
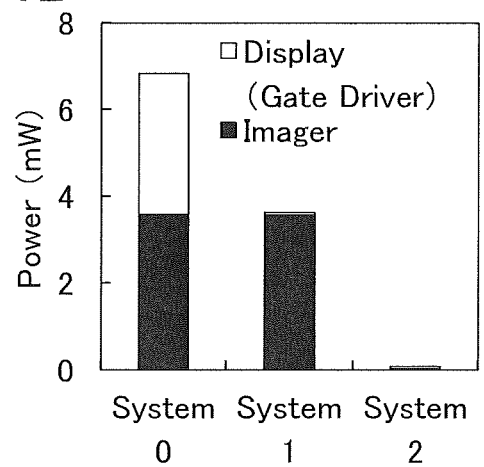

Table 2 and FIGS. 71A and 71B show the power consumption of the systems 0 to 2 in the case where a difference is detected in every difference detection and in the case where a difference is not detected in any difference detection. Note that the power consumption of only a gate driver included in the display device is shown as the power consumption of the display device. FIG. 71A shows the power consumption of the systems 0 to 2 in the case where a difference is detected in every difference detection. FIG. 71B shows the power consumption of the systems 0 to 2 in the case where a difference is not detected in any difference detection.

TABLE 2

| | Power consumption (mW) | | | | | |
|---|---|---|---|---|---|---|
| | Difference detection every time | | | No difference detection every time | | |
| | System 0 | System 1 | System 2 | System 0 | System 1 | System 2 |
| Imaging device | 3.59 | 3.59 | 1.38 | 3.59 | 3.58 | 0.04 |
| Display device (gate driver) | 3.24 | 0.81 | 0.81 | 3.24 | 0.05 | 0.05 |
| Total | 6.83 | 4.40 | 2.19 | 6.83 | 3.63 | 0.09 |

Table 2 and FIG. 71A show that, in the case where a difference is detected in every detection, the power consumption of the system 1 is 35.6% lower than that of the system 0. Table 2 and FIG. 71A also show that the power consumption of the system 2 is 50.2% lower than that of the system 1, and 67.9% lower than that of the system 0.

Table 2 and FIG. 71B show that, in the case where a difference is not detected in any detection, the power consumption of the system 1 is 46.8% lower than that of the system 0. Table 2 and FIG. 71B also show that the power consumption of the system 2 is 97.5% lower than that of the system 1, and 98.7% lower than that of the system 0.

Example 2

In this example, the investigation results of power consumed when the operation of the imaging device of one embodiment of the present invention follows FIG. 7 in Embodiment 2 will be described.

Current measurements were performed on a column driver, an A/D converter circuit, an analog processor, a pixel array, and a row driver included in the imaging device 10 with the configuration illustrated in FIG. 6, and the power consumption was calculated from the current.

In this example, the power consumption in the standby mode was calculated both in the case of clock gating and in the case of power gating. Furthermore, the power consumption in the case where a difference is detected in every difference detection and that in the case where a difference is not detected in any difference detection were calculated. In addition, the power consumption under a condition 1 and that under a condition 2 were calculated.

For the condition 1, the frame frequency was 30 fps, and the column driver and the A/D converter circuit were made inactive at the time of the transition to the second imaging mode.

For the condition 2, the frame frequency was 60 fps, and the column driver and the A/D converter circuit were made inactive at the time of the transition to the standby mode. Furthermore, a counter circuit was added for counting the number of captured frame. It was determined that whether the number of captured frames was even or odd, after S1 or S3. If the number was even, S7 was executed for the transition to the standby mode, and if the number was odd, determination whether "MT" was "True" or not was made. Note that the added counter circuit was reset every second.

The power consumption under the initial condition was also calculated in this example. For the initial condition, neither clock gating nor power gating was performed. The power consumption under the initial condition was used for the comparison with the power consumption under the conditions 1 and 2.

Figure 72A:
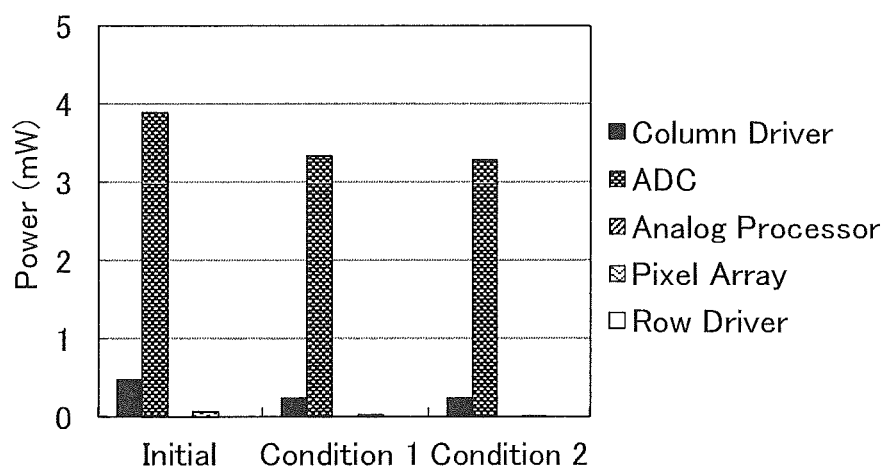
FIGS. 72A and 72B show power consumption of circuits included in an imaging device.
Figure 72B:
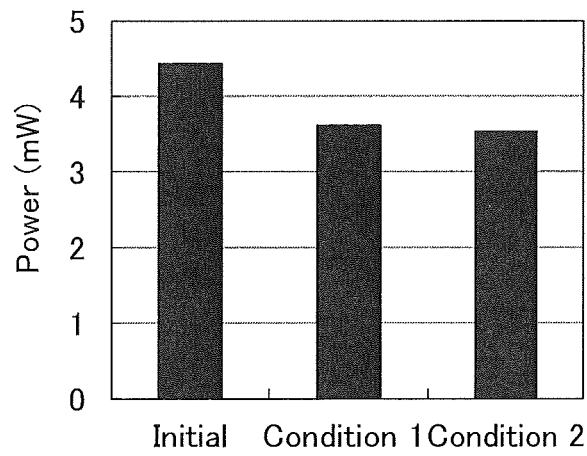
Figure 73A:
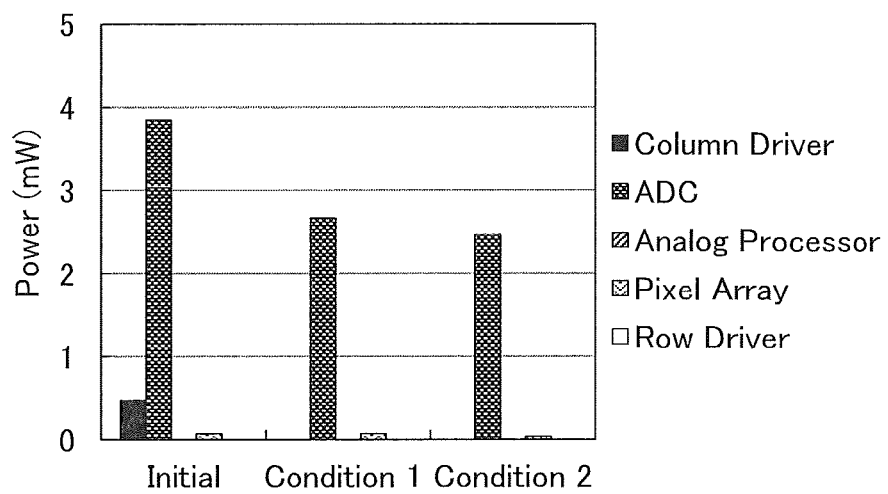
FIGS. 73A and 73B show power consumption of circuits included in an imaging device.
Figure 73B:
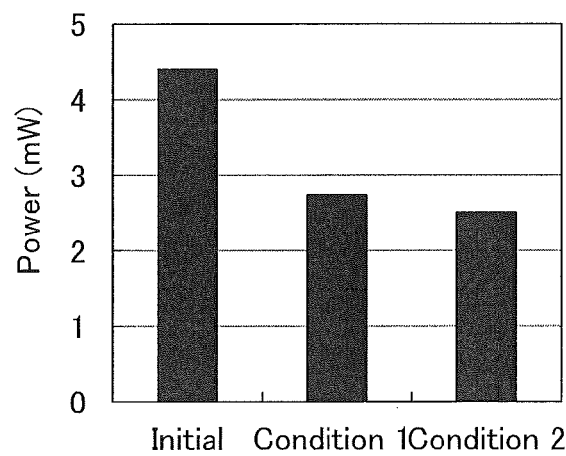
Figure 74A:
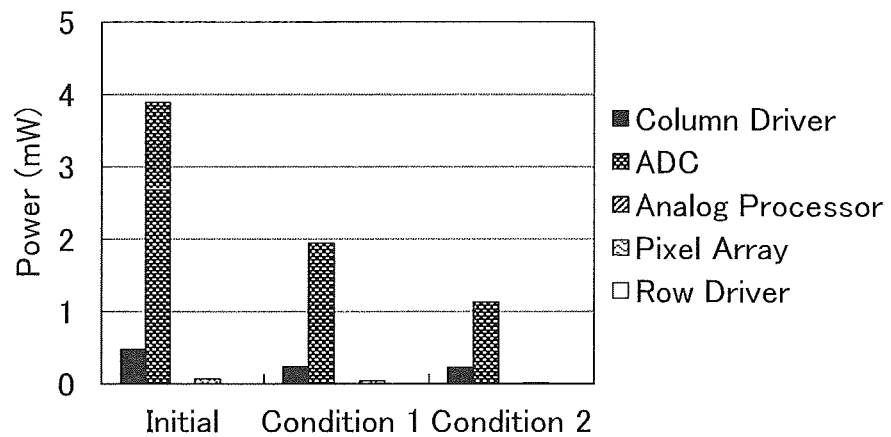
FIGS. 74A and 74B show power consumption of circuits included in an imaging device.
Figure 74B:
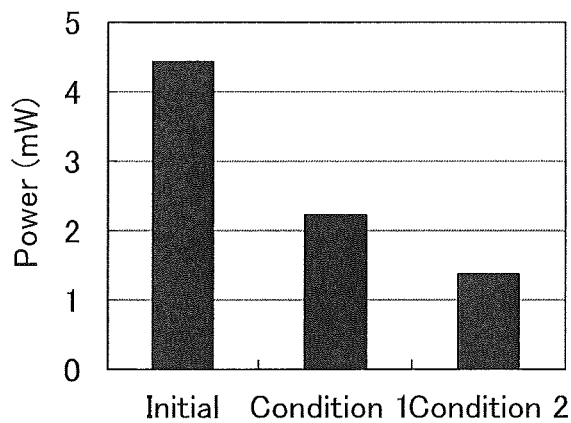
Figure 75A:
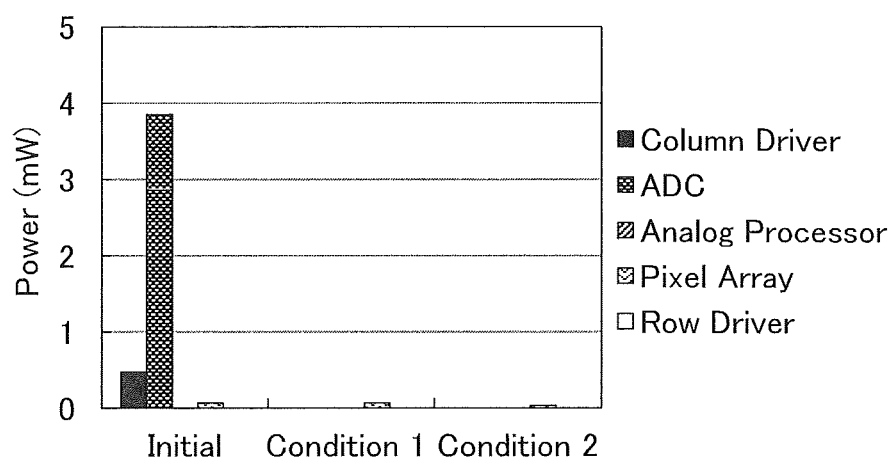
FIGS. 75A and 75B show power consumption of circuits included in an imaging device.
Figure 75B:
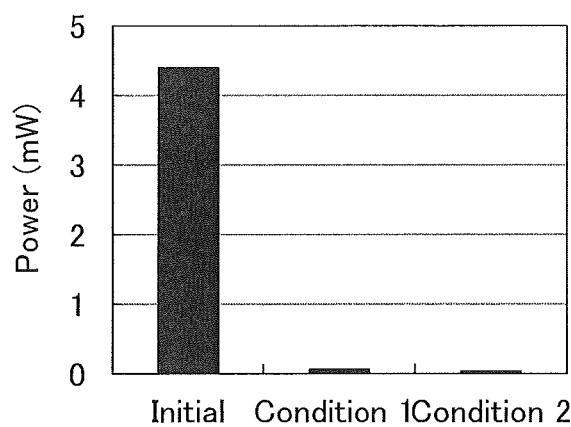

FIGS. 72A and 72B show the power consumption in the case where clock gating was performed in the standby mode and a difference was detected in every difference detection. FIGS. 73A and 73B show the power consumption in the case where clock gating was performed in the standby mode and a difference was not detected in any difference detection. FIGS. 74A and 74B show the power consumption in the case where power gating was performed in the standby mode and difference was detected in every difference detection. FIGS. 75A and 75B show the power consumption in the case where power gating was performed in the standby mode and a difference was not detected in any difference detection. FIG. 72A, FIG. 73A, FIG. 74A, and FIG. 75A show the individual power consumption of the column driver, the A/D converter circuit, the analog processor, the pixel array, and the row driver. FIG. 72B, FIG. 73B, FIG. 74B, and FIG. 75B show the total power consumption of the circuits whose power consumptions are separately shown in FIG. 72A, FIG. 73A, FIG. 74A, and FIG. 75A.

The results in FIGS. 72A and 72B, FIGS. 73A and 73B, FIGS. 74A and 74B, and FIGS. 75A and 75B indicate that clock gating or power gating in the standby mode reduced the power consumption.

Example 3

Described in this example are the investigation results of power consumed when clock gating or power gating is performed on the circuit 34 and the circuit 35 in the imaging device with the configuration illustrated in FIG. 10 in Embodiment 2 in a period during which no processing is performed by the circuit 34 and the circuit 35.

Figure 76:
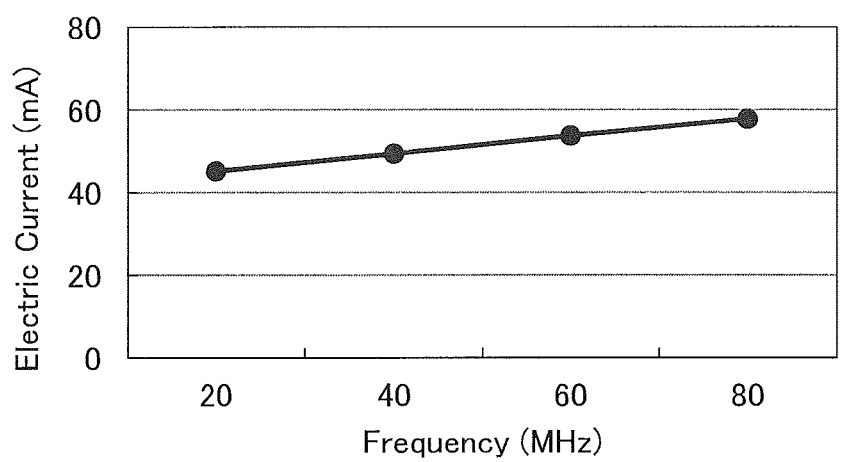
FIG. 76 shows a relationship between current and operating frequency of a transmission circuit.

FIG. 76 shows the relationship between current and the operating frequency of the circuit 35 in the case where neither clock gating nor power gating was performed. The current is increased as the operating frequency of the circuit 35 is increased. This means that the power consumption is increased as the operating frequency of the circuit 35 is increased.

Figure 77:
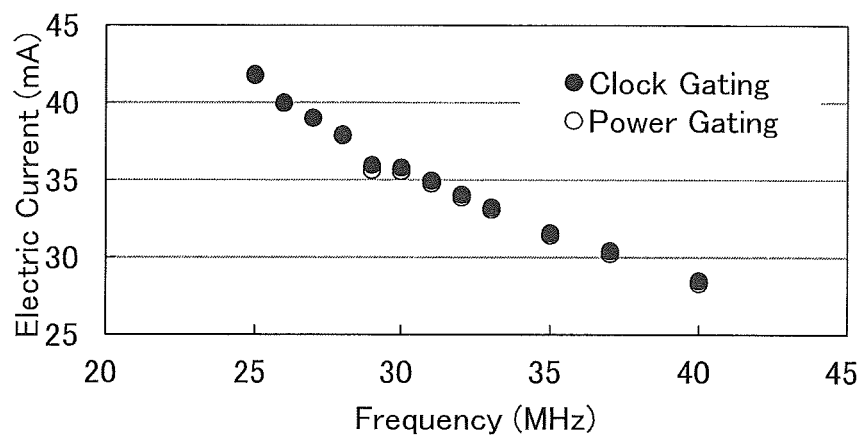
FIG. 77 shows a relationship between current and operating frequency of a transmission circuit.

FIG. 77 shows the relationship between current and the operating frequency of the circuit 35 in the case of clock gating and that in the case of power gating. In either case of clock gating or power gating, the current is decreased as the operating frequency of the circuit 35 is increased. This means that the power consumption is reduced as the operating frequency of the circuit 35 is increased.

Figure 78:
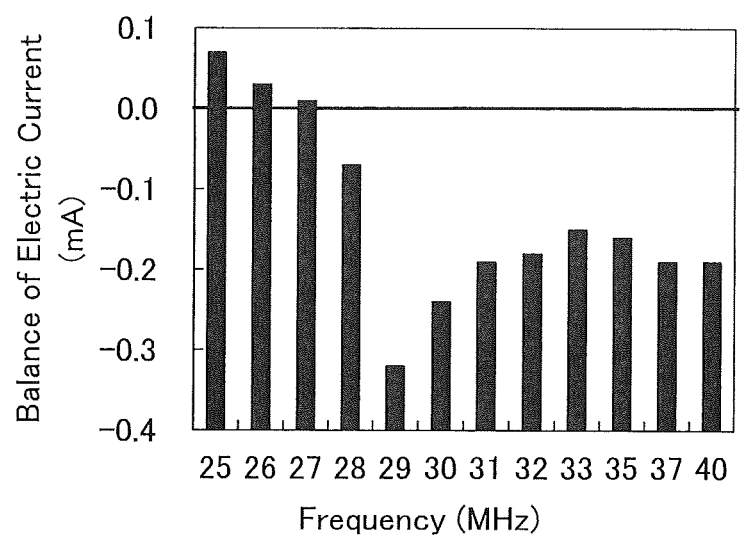
FIG. 78 shows a relationship between current and operating frequency of a transmission circuit.

FIG. 78 shows the difference between current of the case of power gating and the case of clock gating at each operating frequency. In the case of an operating frequency of 28 MHz or higher, current is reduced more in the case of power gating than in the case of clock gating. This means that when the operating frequency is 28 MHz or higher, the power consumption is reduced more in the case of power gating than in the case of clock gating.

This application is based on Japanese Patent Application serial no. 2015-094607 filed with Japan Patent Office on May 7, 2015, Japanese Patent Application serial no. 2015-129542 filed with Japan Patent Office on Jun. 29, 2015, Japanese Patent Application serial no. 2015-137437 filed with Japan Patent Office on Jul. 9, 2015, Japanese Patent Application serial no. 2015-182729 filed with Japan Patent Office on Sep. 16, 2015, Japanese Patent Application serial no. 2015-196417 filed with Japan Patent Office on Oct. 2, 2015, and Japanese Patent Application serial no. 2015-

239872 filed with Japan Patent Office on Dec. 9, 2015, the entire contents of which are hereby incorporated by reference.

What is claimed is:

1. A display system comprising:
an imaging device; and
a display device,
wherein the imaging device comprises first pixels, a first circuit, and a second circuit,
wherein the first pixels are arranged in a matrix,
wherein the first circuit is configured to detect a difference between imaging data of a first frame and imaging data of a second frame,
wherein the second circuit is configured to detect a row of the first pixels where the difference is detected,
wherein the imaging device is configured to operate in a first imaging mode or a second imaging mode,
wherein the imaging device in the first imaging mode is configured to capture imaging data of a third frame,
wherein the imaging device in the second imaging mode is configured to capture the imaging data of the first frame and the imaging data of the second frame and configured to detect the difference,
wherein the display device comprises second pixels and a third circuit,
wherein the second pixels are arranged in a matrix,
wherein the second pixels are configured to display an image that corresponds to the imaging data of the third frame outputted from the imaging device,
wherein the third circuit is configured to select a row of the second pixels that corresponds to the row of the first pixels detected by the second circuit,
wherein the display device is configured to operate in a first display mode, a second display mode, or a third display mode,
wherein the display device in the first display mode is configured to display the image that corresponds to the imaging data of the third frame by rewriting image data retained in the second pixels in all rows,
wherein the display device in the second display mode is configured to display the image that corresponds to the imaging data of the third frame without rewriting image data retained in the second pixels, and
wherein the display device in the third display mode is configured to display the image that corresponds to the imaging data of the third frame by rewriting image data retained in the second pixels only in the row selected by the third circuit.

2. The display system according to claim 1,
wherein the display system is configured to operate in a first mode or a second mode,
wherein the imaging device in the first imaging mode captures the imaging data of the third frame in a first step in the first mode,
wherein the display device in the first display mode displays the image that corresponds to the imaging data of the third frame in a second step in the first mode,
wherein determination whether or not to switch to the second mode is made in a third step in the first mode,
wherein if it is determined not to switch to the second mode, the operation returns to the first step,
wherein if it is determined to switch to the second mode, the display device in the second display mode displays the image that corresponds to the imaging data of the third frame in a fourth step, and the imaging device in the second imaging mode outputs differential data between the first frame and the second frame in a fifth step,
wherein if no difference is detected, the fifth step is repeated,
wherein if the difference is detected, the imaging device in the first imaging mode captures the imaging data of the third frame in a sixth step, and the display device in the third display mode displays the image that corresponds to the imaging data of the third frame in a seventh step, and
wherein the fourth step to the seventh step are repeated.

3. The display system according to claim 1,
wherein the second circuit is configured to encode an address signal indicating the row of the first pixels where the difference is detected, and
wherein the third circuit is configured to decode the address signal encoded.

4. The display system according to claim 1,
wherein the first pixels each include a first transistor and a photoelectric conversion element,
wherein the second pixels each include a second transistor and a display element, and
wherein the first transistor and the second transistor each include an active layer containing an oxide semiconductor.

5. The display system according to claim 4, wherein the photoelectric conversion element comprises selenium or a compound semiconductor containing selenium.

6. The display system according to claim 4, wherein the display element is one of a liquid crystal element and a light-emitting element.

7. An electronic device comprising the display system according to claim 1, wherein the electronic device comprises an operation key.

8. The display system according to claim 2,
wherein the second circuit is configured to encode an address signal indicating the row of the first pixels where the difference is detected, and
wherein the third circuit is configured to decode the address signal encoded.

9. The display system according to claim 8,
wherein the first pixels each include a first transistor and a photoelectric conversion element,
wherein the second pixels each include a second transistor and a display element, and
wherein the first transistor and the second transistor each include an active layer containing an oxide semiconductor.

10. A display system comprising:
an imaging device; and
a display device,
wherein the imaging device comprises first pixels, a first circuit, and a second circuit,
wherein the first pixels are arranged in a matrix,
wherein the first circuit is configured to detect a difference between imaging data of a first frame and imaging data of a second frame,
wherein the second circuit is configured to detect a row of the first pixels where the difference is detected,
wherein the imaging device in a imaging mode is configured to capture the imaging data of the first frame and the imaging data of the second frame and configured to detect the difference,
wherein the display device comprises second pixels and a third circuit,
wherein the second pixels are arranged in a matrix, wherein the second pixels are configured to display an image that corresponds to the imaging data of a third frame outputted from the imaging device, wherein the third circuit is configured to select a row of the second pixels that corresponds to the row of the first pixels detected by the second circuit, wherein the display device in a display mode is configured to display the image that corresponds to the imaging data of the third frame by rewriting image data retained in the second pixels only in the row selected by the third circuit.

11. The display system according to claim 10, wherein the second circuit is configured to encode an address signal indicating the row of the first pixels where the difference is detected, and wherein the third circuit is configured to decode the address signal encoded.

12. The display system according to claim 10, wherein the first pixels each include a first transistor and a photoelectric conversion element, wherein the second pixels each include a second transistor and a display element, and wherein the first transistor and the second transistor each include an active layer containing an oxide semiconductor.

13. The display system according to claim 12, wherein the photoelectric conversion element comprises selenium or a compound semiconductor containing selenium.

14. The display system according to claim 12, wherein the display element is one of a liquid crystal element and a light-emitting element.

15. An electronic device comprising the display system according to claim 10, wherein the electronic device comprises an operation key.

* * * * *